US012777845B2

(12) United States Patent
Numata et al.

(10) Patent No.: US 12,777,845 B2
(45) Date of Patent: Oct. 27, 2026

(54) LIGHT-EMITTING DEVICE WITH FIRST COMPOUND HAVING ELECTRON-TRANSPORT PROPERTY

(71) Applicant: SEMICONDUCTOR ENERGY LABORATORY CO., LTD., Atsugi (JP)

(72) Inventors: Satoko Numata, Atsugi (JP); Harue Osaka, Atsugi (JP); Sachiko Kawakami, Atsugi (JP); Takashi Shingu, Atsugi (JP); Anna Tada, Isehara (JP); Yui Yoshiyasu, Atsugi (JP); Yasuhiro Niikura, Komae (JP); Eriko Aoyama, Atsugi (JP); Naoaki Hashimoto, Sagamihara (JP); Satoshi Seo, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 536 days.

(21) Appl. No.: 18/130,684

(22) Filed: Apr. 4, 2023

(65) Prior Publication Data

US 2023/0329105 A1 Oct. 12, 2023

(30) Foreign Application Priority Data

Apr. 8, 2022 (JP) ................................ 2022-064756
Nov. 30, 2022 (JP) ................................ 2022-191594
Feb. 22, 2023 (JP) ................................ 2023-026380

(51) Int. Cl.
*H10K 85/60* (2023.01)
*H10K 50/16* (2023.01)
*H10K 85/30* (2023.01)

(52) U.S. Cl.
CPC ....... *H10K 85/6572* (2023.02); *H10K 85/342* (2023.02); *H10K 85/633* (2023.02);
(Continued)

(58) Field of Classification Search
CPC ............ H10K 85/6572; H10K 85/636; H10K 85/633; H10K 85/342; H10K 50/16; H10K 85/6574
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Norman D Richards
*Assistant Examiner* — Sean Ayers Winters
(74) *Attorney, Agent, or Firm* — NIXON PEABODY LLP; Jeffrey L. Costellia

(57) ABSTRACT

An organic semiconductor device that can achieve high resolution and favorable reliability is provided. The organic semiconductor device is one of a plurality of light-emitting devices formed over an insulating layer, which includes a first electrode, a second electrode, and an organic compound layer. The organic compound layer is positioned between the first electrode and the second electrode. The organic com-
(Continued)

pound layer includes a layer containing a first compound. When differential scanning calorimetry is performed on the first compound in such a manner that a cooling step is performed from the state in which the first compound is melted in a first heating step and a second heating step is successively performed, an exothermic peak is not observed in the cooling step and an exothermic peak and a melting point peak are not observed in the second heating step.

9 Claims, 38 Drawing Sheets

(52) U.S. Cl.
CPC .......... *H10K 85/636* (2023.02); *H10K 50/16* (2023.02); *H10K 85/6574* (2023.02)

(56) References Cited

U.S. PATENT DOCUMENTS

| | | | | |
|---|---|---|---|---|
| 8,076,838 | B2 * | 12/2011 | Kobayashi | H10K 59/8791 313/506 |
| 8,853,716 | B2 * | 10/2014 | Kurata | H10K 59/876 257/89 |
| 10,862,036 | B2 | 12/2020 | Ke et al. | |
| 2002/0072139 | A1 | 6/2002 | Kashiwabara | |
| 2011/0148290 | A1 | 6/2011 | Oota | |
| 2012/0223633 | A1 * | 9/2012 | Yoshinaga | H10K 50/171 445/24 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0276602 | A1 * | 9/2016 | Yoshinaga | H10K 85/626 |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2017/0352708 | A1 * | 12/2017 | Yamaguchi | H10K 59/38 |
| 2018/0190908 | A1 | 7/2018 | Ke et al. | |
| 2020/0203662 | A1 | 6/2020 | Mollard et al. | |
| 2023/0025460 | A1 | 1/2023 | Yoshiyasu. et al. | |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |
| WO | WO-2021/045178 | A1 | 3/2021 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

Sample 11

Sample 12

Sample 13

LIGHT-EMITTING DEVICE WITH FIRST COMPOUND HAVING ELECTRON-TRANSPORT PROPERTY

BACKGROUND OF THE INVENTION

1. Field of the Invention

One embodiment of the present invention relates to an organic semiconductor device.

Note that one embodiment of the present invention is not limited to the above technical field. Examples of the technical field of one embodiment of the present invention include a semiconductor apparatus, a display apparatus, a light-emitting apparatus, a power storage device, a memory device, an electronic apparatus, a lighting device, an input device (e.g., a touch sensor), an input/output device (e.g., a touch panel), a method for driving any of them, and a method for manufacturing any of them.

2. Description of the Related Art

Recent display apparatuses have been expected to be applied to a variety of uses. Usage examples of large-sized display apparatuses include a television device for home use (also referred to as a TV or a television receiver), digital signage, and a public information display (PID). In addition, a smartphone, a tablet terminal, and the like each including a touch panel are being developed as portable information terminals.

Higher-resolution display apparatuses have also been required. For example, devices for virtual reality (VR), augmented reality (AR), substitutional reality (SR), or mixed reality (MR) are given as devices requiring high-resolution display apparatuses and have been actively developed.

Light-emitting apparatuses including light-emitting devices (also referred to as light-emitting elements) have been developed as display apparatuses, for example. Light-emitting devices utilizing electroluminescence (also referred to as EL devices or EL elements) have features such as ease of reduction in thickness and weight, high-speed response to input signals, and capability of DC constant voltage driving, and have been used in display apparatuses.

In order to obtain a higher-resolution light-emitting apparatus using an organic EL device, patterning an organic layer by a photolithography method using a photoresist or the like, instead of an evaporation method using a metal mask, has been studied. By using the photolithography method, a high-resolution display apparatus in which a distance between EL layers is several micrometers can be obtained (see Patent Document 1, for example).

REFERENCE

[Patent Document 1] Japanese Translation of PCT International Application No. 2018-521459

SUMMARY OF THE INVENTION

A step of applying a certain heat is required in the above process for processing by a photolithography method. However, sufficient heat has not been able to be applied due to poor heat resistance of an organic compound layer, which has made it difficult to manufacture an organic semiconductor device with high performance (especially display performance, efficiency, and reliability).

Thus, an object of one embodiment of the present invention is to provide an organic semiconductor device using an organic compound, which has tolerance for heat in a manufacturing process. Another object of one embodiment of the present invention is to provide a light-emitting device which has tolerance for heat in a manufacturing process. Another object of one embodiment of the present invention is to provide a photodiode sensor which has tolerance for heat in a manufacturing process.

Another object of one embodiment of the present invention is to provide an organic semiconductor device with high heat resistance. Another object of one embodiment of the present invention is to provide a light-emitting device with high heat resistance. Another object of one embodiment of the present invention is to provide a photodiode sensor with high heat resistance. Another object of one embodiment of the present invention is to provide an organic semiconductor device that can achieve favorable display performance. Another object of one embodiment of the present invention is to provide a light-emitting device that can achieve favorable display performance.

Another object of one embodiment of the present invention is to provide light-emitting devices having high heat resistance or achieving favorable display performance, which can be arranged at a high density. Another object of one embodiment of the present invention is to provide a light-emitting device having high heat resistance or achieving favorable display performance, which can provide a high-resolution display apparatus.

Another object of one embodiment of the present invention is to provide a display apparatus with high display performance. Another object of one embodiment of the present invention is to provide a high-definition display apparatus with favorable display performance. Another object of one embodiment of the present invention is to provide a display apparatus with favorable display quality and favorable display performance.

Another object of one embodiment of the present invention is to provide a novel display apparatus, a novel display module, or a novel electronic apparatus.

Note that the description of these objects does not preclude the existence of other objects. One embodiment of the present invention does not need to achieve all of these objects. Other objects can be derived from the description of the specification, the drawings, and the claims.

In view of the above, one embodiment of the present invention provides an organic semiconductor device using a compound which has no exothermic peak in a cooling step and neither an exothermic peak nor a melting point peak in a second heating step in differential scanning calorimetry performed by a certain measurement method. Such an organic semiconductor device has tolerance for heat in a manufacturing process and thus can have favorable characteristics.

That is, one embodiment of the present invention is an organic semiconductor device which is one of a plurality of organic semiconductor devices formed over an insulating layer and includes a first electrode, a second electrode, and an organic compound layer. The organic compound layer is positioned between the first electrode and the second electrode. The organic compound layer includes a first layer independently included in each of the plurality of organic semiconductor devices. The first layer contains a first compound. The second electrode is a continuous layer shared by the plurality of organic semiconductor devices. The first electrode is an independent layer in each of the plurality of organic semiconductor devices. When the first compound is subjected to differential scanning calorimetry in such a manner that a first heating step is performed from 25° C. or lower, the temperature is kept for three minutes at a lower one of 450° C. and a temperature lower than a 3% weight loss temperature (° C.) measured with a thermogravimeter by 50° C., a cooling step is performed to 25° C. or lower at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, an exothermic peak is not observed in the cooling step and an exothermic peak and a melting point peak are not observed in the second heating step.

Another embodiment of the present invention is an organic semiconductor device which is one of a plurality of organic semiconductor devices formed over an insulating layer and includes a first electrode, a second electrode, and an organic compound layer. The organic compound layer is positioned between the first electrode and the second electrode. The organic compound layer includes a first layer independently included in each of the plurality of organic semiconductor devices. The first layer contains a first compound. The second electrode is a continuous layer shared by the plurality of organic semiconductor devices. The first electrode is an independent layer in each of the plurality of organic semiconductor devices. When the first compound is subjected to differential scanning calorimetry in such a manner that a first heating step is performed from 25° C. or lower, the temperature is kept in the first heating step for three minutes at a lower one of 450° C. and a temperature lower than a 3% weight loss temperature (° C.) measured with a thermogravimeter by 50° C., a cooling step is performed at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, an exothermic peak is not observed in the cooling step and the energy of a melting point peak observed in the second heating step is higher than or equal to 0 J/g and lower than or equal to 20 J/g.

Another embodiment of the present invention is an organic semiconductor device which is one of a plurality of organic semiconductor devices formed over an insulating layer and includes a first electrode, a second electrode, and an organic compound layer. The organic compound layer is positioned between the first electrode and the second electrode. The organic compound layer includes a first layer independently included in each of the plurality of organic semiconductor devices. The first layer contains a first compound. The second electrode is a continuous layer shared by the plurality of organic semiconductor devices. The first electrode is an independent layer in each of the plurality of organic semiconductor devices. When the first compound is subjected to differential scanning calorimetry in such a manner that a first heating step is performed from 25° C. or lower, the temperature is kept for three minutes at a lower one of 450° C. and a temperature lower than a 3% weight loss temperature (° C.) measured with a thermogravimeter by 50° C., a cooling step is performed at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, the energy of an exothermic peak observed in the cooling step is higher than or equal to 0 J/g and lower than or equal to 20 J/g and the energy of an endothermic peak without a baseline shift observed in the second heating step is lower than or equal to 0 J/g and higher than or equal to −20 J/g.

Another embodiment of the present invention is an organic semiconductor device which is one of a plurality of organic semiconductor devices provided in a display apparatus and includes a first electrode, a second electrode, and an organic compound layer. The organic compound layer is positioned between the first electrode and the second electrode. The organic compound layer contains a first compound. The second electrode is a continuous layer shared by the plurality of organic semiconductor devices. The first electrode is an independent layer in each of the plurality of organic semiconductor devices. When the first compound is subjected to differential scanning calorimetry in such a manner that a first heating step is performed from 25° C. or lower, the temperature is kept in the first heating step for three minutes at a lower one of 450° C. or lower and a temperature lower than a 3% weight loss temperature (° C.) measured with a thermogravimeter by 50° C., a cooling step is performed at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, an exothermic peak is not observed in the cooling step and an exothermic peak and a melting point peak are not observed in the second heating step.

Another embodiment of the present invention is the organic semiconductor device with the above structure, in which a distance between the first electrodes of adjacent organic semiconductor devices of the plurality of organic semiconductor devices is 2 μm to 5 μm inclusive.

Another embodiment of the present invention is the organic semiconductor device with the above structure, in which the organic compound layer has a stacked-layer structure including the first layer and a second layer, and the second layer is a continuous layer shared by the plurality of organic semiconductor devices.

Another embodiment of the present invention is the organic semiconductor device with the above structure, in which a distance between the first electrodes of adjacent organic semiconductor devices of the plurality of organic semiconductor devices is 2 μm to 5 μm inclusive and the aperture ratio is 30% or higher.

Another embodiment of the present invention is a display apparatus provided with the plurality of the organic semiconductor devices with the above structure, as display devices. The display apparatus has a definition of 500 ppi or more and an aperture ratio of 30% or higher.

Another embodiment of the present invention is the organic semiconductor device with the above structure, in which the first compound is a substance which has an exothermic peak with an energy of 0 J/g or higher and 20 J/g or lower in the second heating step in the differential scanning calorimetry.

Another embodiment of the present invention is the organic semiconductor device with the above structure, in which a baseline shift of the first compound to the endothermic side is observed in the second heating step in the differential scanning calorimetry.

Another embodiment of the present invention is the organic semiconductor device with the above structure, in which in the second heating step in the differential scanning calorimetry, a baseline shift of the first compound to the endothermic side is observed and an endothermic peak due to the baseline shift is detected.

Another embodiment of the present invention is the organic semiconductor device with the above structure, in which in the second heating step in the differential scanning calorimetry, a baseline shift of the first compound to the endothermic side is observed and an endothermic peak with an energy of 1 J/g or higher due to the baseline shift is detected.

Another embodiment of the present invention is the organic semiconductor device with the above structure, in which in the second heating step in the differential scanning calorimetry, a baseline shift of the first compound to the endothermic side is observed, an endothermic peak due to the baseline shift is detected, and, given that a difference in the amount of heat between the baselines at a temperature of the peak is 1, a difference in the amount of heat between a position where the baseline on the low-temperature side is extend to the temperature of the peak and a local maximum value of the peak is 2 or more.

Another embodiment of the present invention is the organic semiconductor device with the above structure, in which the thickness of the layer containing the first compound is greater than or equal to 10 nm and less than or equal to 2000 nm.

Another embodiment of the present invention is the organic semiconductor device with the above structure, in which the layer containing the first compound is included in an electron-transport region in the first layer.

Another embodiment of the present invention is the organic semiconductor device with the above structure, in which the first compound is an organic compound that includes at least one of a pyrimidine ring, a pyridine ring, a pyrazine ring, a benzofuropyrimidine ring, a benzoxazole ring, a quinoline ring, a quinoxaline ring, a dibenzoquinoxaline ring, a carbazole ring, a dibenzocarbazole ring, a dibenzofuran ring, a dibenzothiophene ring, a naphthobisbenzofuran ring, a naphthalene ring, a fluorene ring, a spirofluorene ring, a triphenylene ring, an anthracene ring, an amine, an aluminum element, a lithium element, and fluorine.

Another embodiment of the present invention is the organic semiconductor device with the above structure, in which the layer containing the first compound is included in a hole-transport region in the organic compound layer.

Another embodiment of the present invention is the organic semiconductor device with the above structure, in which the first compound is an organic compound that includes at least one of a phenanthrene ring, a naphthalene ring, a dibenzothiophene ring, a dibenzofuran ring, a fluorene ring, a triphenylene ring, a carbazole ring, a 9,9'-spirobi[9H-fluorene] ring, a spiro[9H-fluorene-9,9'-[9H]xanthene] ring, a spiro[9H-fluorene-9,9'-[9H]thioxanthene] ring, and a spiro[acridine-9(2H),9'-[9H]fluorene] ring.

Another embodiment of the present invention is the organic semiconductor device with the above structure, in which the layer containing the first compound is in contact with the second layer.

Another embodiment of the present invention is the organic semiconductor device with the above structure, in which the first layer further contains a second compound and the second compound has a property similar to the property of the first compound.

Another embodiment of the present invention is the organic semiconductor device with the above structure, in which the first layer further contains a third compound and the third compound has a property similar to the property of the first compound.

Another embodiment of the present invention is the organic semiconductor device with the above structure, in which three or more of compounds contained in the first layer each have a property similar to the property of the first compound.

Another embodiment of the present invention is the organic semiconductor device with the above structure, in which the total thickness of layers containing compounds each of which has a property similar to the property of the first compound in the first layer is a half or more of a thickness of the first layer.

Another embodiment of the present invention is the organic semiconductor device described in any of the above, which is subjected to heat treatment after formation of the layer containing the first compound.

Another embodiment of the present invention is the organic semiconductor device with the above structure, in which the glass transition temperature (Tg) of the first compound is 120° C. or higher.

Another embodiment of the present invention is the organic semiconductor device with the above structure, in which the value of a heating temperature (° C.) in the heat treatment is the value that is 80% or more of the value of Tg (° C.).

Another embodiment of the present invention is the organic semiconductor device with the above structure, in which a heating temperature in the heat treatment is higher than or equal to (Tg−20) ° C.

Another embodiment of the present invention is the organic semiconductor device with the above structure, which is a photodiode sensor including a photoelectric conversion layer in the organic compound layer.

Another embodiment of the present invention is the organic semiconductor device with the above structure, which is a light-emitting device including a light-emitting layer in the organic compound layer.

Another embodiment of the present invention is a display module including the display apparatus and at least one of a connector and an integrated circuit.

Another embodiment of the present invention is an electronic apparatus including the display module and at least one of a housing, a battery, a camera, a speaker, and a microphone.

With one embodiment of the present invention, an organic semiconductor device using an organic compound, which has tolerance for heat in a manufacturing process, can be provided. Furthermore, a light-emitting device which has tolerance for heat in a manufacturing process can be provided. Moreover, a photodiode sensor which has tolerance for heat in a manufacturing process can be provided.

With one embodiment of the present invention, an organic semiconductor device with high heat resistance can be provided. A light-emitting device with high heat resistance can be provided. A photodiode sensor with high heat resistance can be provided. An organic semiconductor device that can achieve favorable display performance can be provided. A light-emitting device that can achieve favorable display performance can be provided.

With one embodiment of the present invention, light-emitting devices with high heat resistance or favorable display performance, which can be arranged at a high density, can be provided. A light-emitting device with high heat resistance or favorable display performance, which can provide a high-resolution display apparatus, can be provided.

With one embodiment of the present invention, a highly reliable display apparatus can be provided. A high-definition display apparatus with favorable display performance can be provided. A display apparatus with favorable display quality and favorable display performance can be provided.

With one embodiment of the present invention, a novel display apparatus, a novel display module, or a novel electronic apparatus can be provided.

Note that the description of these effects does not preclude the existence of other effects. One embodiment of the present invention does not necessarily have all of these effects. Other effects can be derived from the description of the specification, the drawings, and the claims.

DETAILED DESCRIPTION OF THE INVENTION

Figure 1A:
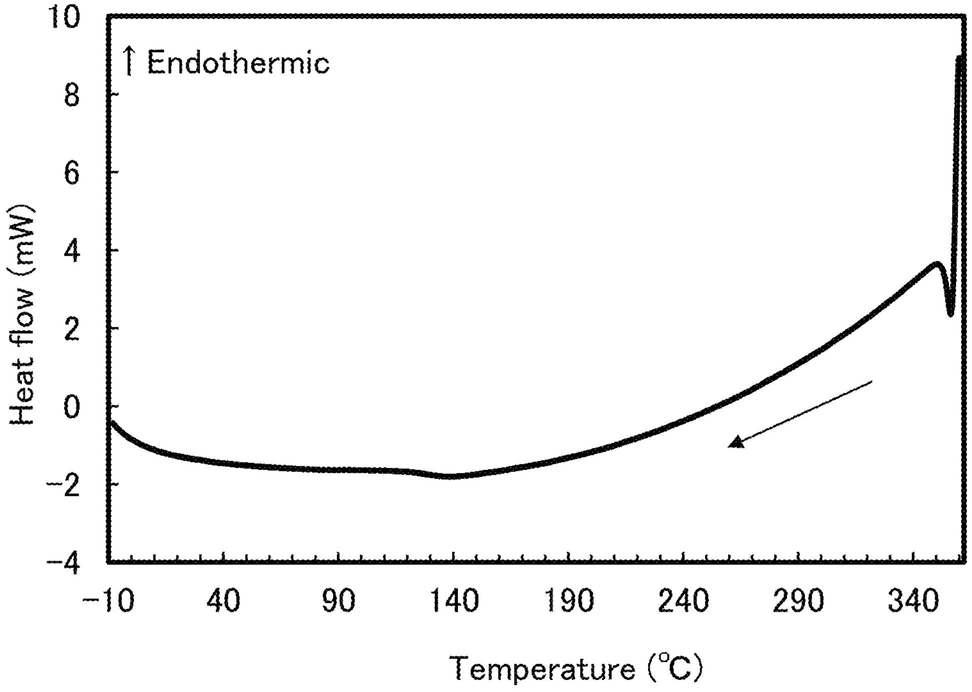
FIG. 1A shows a measurement result of mPPhen2P in a temperature falling step in DSC.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

Embodiment 1

As a method for forming an organic semiconductor film in a predetermined shape, a vacuum evaporation method with a metal mask (mask vapor deposition) has been widely used. However, in these days of higher density and higher resolution, mask vapor deposition has come close to the limit of increasing the resolution for various reasons such as the alignment accuracy and the distance between the mask and the substrate. By contrast, an organic semiconductor device having a finer pattern can be obtained by processing the shape of an organic semiconductor film by a photolithography method. Moreover, because an increase in area can be easier by a photolithography method than by mask vapor deposition, processing of an organic semiconductor film by a photolithography method is being researched.

However, it is necessary to go over many problems to process the shape of the organic semiconductor film by the photolithography method. Examples of these problems include an effect of exposure to the air of the organic semiconductor film, an effect of light irradiation when a photosensitive resin is exposed to light, and an effect of developer and water when the exposed photosensitive resin is developed.

A method for forming a protective film over the organic semiconductor film can be employed for reducing these effects. In this case, when heating at a certain temperature (approximately 80° C. to 120° C.) is performed in formation of the protective film, the protective film can be a dense film with a high barrier property or a film with high in-plane uniformity. In other words, a protective film formed at low temperatures hardly has sufficient properties.

In the case of using a certain organic semiconductor material, particularly a compound that can be deposited by evaporation, a device with favorable characteristics may be obtained when not undergoing a heating step after the deposition of the compound by evaporation. However, in the case where an organic semiconductor device is subjected to a heating step after the deposition of the compound by evaporation in the manufacturing process as described above, film quality has changed and the device has had poor characteristics in some cases.

In general, the heat resistance of an organic semiconductor device such as an organic EL device or an organic photodiode sensor is evaluated by the glass transition temperature (Tg) of an organic compound used in many cases. However, even when an organic compound has high Tg, the characteristics of a device including the organic compound might deteriorate when a heating step is performed on the device with an organic layer not sandwiched between electrodes even at a temperature sufficiently lower than Tg of the organic compound. In contrast, characteristics of some compounds having comparatively low Tg are unlikely to be changed by heating at a temperature of Tg or lower, which makes it difficult to find, only on the basis of Tg, a compound with which an organic semiconductor device with high heat resistance can be obtained. That is, in an organic semiconductor device which needs to be subjected to a heating step in a state where a free interface exists in an organic layer, there is a huge gap between Tg of an organic compound used and the heat resistance of the device.

In view of the above, the present inventors have found that an organic semiconductor device can have tolerance for heat in a manufacturing process and favorable characteristics with the use of a compound (first compound) exhibiting a specific measurement result obtained by a differential scanning calorimetry (DSC) method performed in a specific procedure.

Note that "having tolerance for heat" here means "having heat resistance" and small changes mainly in a shape, film quality, and electrical characteristics.

Specifically, DSC measurement is performed on a compound in a solid (powder) state in such a manner that cooling is performed at least the state where the compound is sufficiently melted by heating (first heating) and heating is performed again (second heating). When a compound (first compound) which has no exothermic peak in the cooling step as in FIG. 1A and neither an exothermic peak nor a melting point peak in the second heating step as in FIG. 1B is used, an organic semiconductor device which has tolerance for heat in a manufacturing process and favorable characteristics can be obtained. Note that a measurement result of the first heating step might reflect various thermal budgets until the first heating step, which makes evaluation difficult; therefore, the result is not used for judgment in the present invention.

In the above DSC result, the exothermic peak in the cooling step indicates crystallization from a melted state, and the exothermic peak and the melting point peak in the second heating step indicate cold crystallization and melting of a crystal, respectively. With the use of a compound without such peaks, an organic semiconductor film is unlikely to undergo a great structure change due to heating and cooling, and thus an organic semiconductor device that can endure a heating step and has high heat resistance can be manufactured.

Note that in observation of an exothermic peak in the cooling step, a peak appearing immediately after the start of the cooling step is excluded because it is due to a measurement apparatus, and the case where an exothermic peak is not observed when cooling is performed to 25° C. or lower is judged as the case where a peak is not observed. Note that the case where an exothermic peak is not observed includes the case where an exothermic peak with an energy higher than 0 J/g and lower than or equal to 20 J/g exists as well as the case where the energy of an exothermic peak is 0 J/g.

Note that in the case where an exothermic peak exists, the energy thereof is preferably higher than 0 J/g and lower than or equal to 5 J/g, and it is most preferable that no exothermic peak exist. In particular, in the case of a high cooling rate, a peak to the endothermic side is sometimes observed at 60° C. or lower. This peak is an insignificant peak that appears when, due to a cooling capacity of the apparatus, an actual temperature of the compound cannot decrease at a programmed cooling rate. Therefore, such a peak is not taken into consideration in one embodiment of the present invention. In this case, it should be confirmed that there appears no peak at a lower cooling rate.

The energy of a peak can be calculated from an area of a portion surrounded by the peak and a supposed baseline obtained by connecting a start and an end of the peak.

The case where a melting point peak is not observed in the second heating step includes the case where a melting point peak with an energy higher than or equal to −20 J/g and lower than 0 J/g exists as well as the case where the energy of the melting point peak is 0 J/g. In the case where a melting point peak exists, the energy thereof is preferably higher than ~5 J/g and lower than or equal to 0 J/g, and it is most preferable that no melting point peak exist. The case where an exothermic peak is not observed in the second heating step includes the case where an exothermic peak with an energy higher than 0 J/g and lower than or equal to 20 J/g exists as well as the case where the energy of an exothermic peak is 0 J/g. The energy of an exothermic peak is further preferably lower than or equal to 5 J/g, most preferably 0 J/g.

In the DSC, the temperature falling rate in the cooling step and the temperature rising rate in the second heating step are each higher than or equal to 40° C./min and lower than or equal to 200° C./min. Note that the temperature falling rate in the cooling step is preferably higher than or equal to 40° C./min and lower than or equal to 200° C./min.

When the maximum temperature in each of the first heating step and the second heating step in the DSC is too high, a peak due to vaporization, sublimation, decomposition, or the like might appear and thus accurate judgment might be difficult in the following heating step. To avoid this situation, the maximum temperature in the DSC is preferably a temperature lower than the 3% weight loss temperature of a target compound obtained by thermogravimetry (TG) measurement by 50° C. or more, further preferably a temperature lower than the 3% weight loss temperature by 100° C. or more. Typically, the measurement is preferably performed at a temperature lower than the 3% weight loss temperature by 50° C. A temperature in the above range can be seen as a temperature at which sublimation hardly occurs under an atmospheric pressure. Note that the measurement is preferably performed to a temperature higher than a temperature lower than the 3% weight loss temperature by 150° C.

In the case where the TG measurement is not performed, a target of the maximum temperature in the DSC is preferably lower than or equal to a temperature (° C.) of a value three times as high as a value of the glass transition temperature (° C.) of a compound to be subjected to the DSC. In consideration of the upper limit of the vacuum vapor deposition temperature of an organic compound, it is sufficient to perform the measurement up to 450° C. In the case of a metal complex, it is sufficient to perform the measurement up to 350° C. In the case where sublimation, vaporization, decomposition, or the like occurs in an organic compound at a temperature lower than 450° C. or in an organometallic complex at a temperature lower than 350° C., the maximum measurement temperature is set to a temperature lower than the temperature at which sublimation, vaporization, decomposition, or the like occurs preferably by 30° C. or more, further preferably by 50° C. or more. Typically, the measurement is performed at a temperature lower than the temperature at which sublimation, vaporization, decomposition, or the like occurs by 30° C. Whether sublimation, vaporization, decomposition, or the like occurs in measurement in a certain temperature range is determined in the following manner: measurement is performed again on the same sample under the same measurement conditions (the temperature rising condition and the measurement temperature range) and whether the cycle performance is the same as that in the previous measurement, that is, whether the baselines overlap with each other, is checked. In the case where the baselines do not overlap with each other, sublimation, vaporization, decomposition, or the like has probably occurred in the previous measurement; thus, it is considered that measurement should be performed again with the maximum temperature in the measurement temperature range lowered.

The maximum temperature in the measurement temperature range of the DSC is preferably determined by performing the TG measurement in advance as described above.

In the DSC, the minimum temperature in the cooling step is preferably lower than or equal to Tg, for example, lower than or equal to 25° C., preferably −10° C.

In the DSC, since the cooling step is performed on the compound in a sufficiently melted state, it is preferable that the maximum temperature be kept for a certain time between the first heating step and the cooling step. The maximum temperature is kept preferably for longer than or equal to one minute and shorter than or equal to ten minutes, further preferably for three minutes.

Similarly, since the second heating step is performed on the target compound with a uniform temperature, it is preferable that the minimum temperature be kept for a certain time between the cooling step and the second heating step. The minimum temperature is kept preferably for longer than or equal to one minute and shorter than or equal to ten minutes, further preferably for three minutes.

In the DSC measurement, the mass of a target compound is preferably set as appropriate in order that uniform thermal conduction at a constant temperature rising rate can be obtained. A smaller amount of a target compound is preferable for reduction in the temperature unevenness inside the target compound, while a larger amount of the compound is preferable for high sensitivity. For these reasons, it is specifically preferable that the amount of the compound put on a sample container with a diameter of 5 mm to 10 mm be greater than or equal to 0.1 mg and less than or equal to 10 mg, further preferable greater than or equal to 1 mg and less than or equal to 5 mg for obtaining a clear peak. It is considered that by performing DSC with an appropriate amount of a compound, peaks of a melting point, a glass transition temperature, and a crystallization temperature can be observed clearly with favorable reproducibility.

In this specification, the DSC measurement is performed in a temperature range and an environment where the weight of a target compound does not change. Accordingly, it is preferable that for inhibiting a reaction with atmospheric components such as oxygen, the DSC measurement be performed in an inert atmosphere of nitrogen or the like at a temperature sufficiently lower than the decomposition temperature, for example, at a temperature lower than the decomposition temperature by 50° C. or more.

In a result of the DSC of the first compound, a baseline shift to the endothermic side in the second heating step is preferably observed. A temperature at which the shift occurs is preferably Tg. In other words, the first compound preferably has Tg. Note that higher Tg is preferable because heat resistance tends to be favorable. Specifically, Tg of the first compound is preferably higher than or equal to 100° C., further preferably higher than or equal to 120° C.

The first compound preferably has the endothermic peak with an energy of 1 J/g or higher, further preferably 3 J/g or higher, still further preferably 5 J/g or higher due to the baseline shift. This peak indicates enthalpy relaxation. A material exhibiting such enthalpy relaxation can be formed into glass that is more stable in terms of energy than glass formed of a material not exhibiting enthalpy relaxation, and thus is a preferable material because a film of the material exhibiting enthalpy relaxation can have stable quality and have tolerance for a heating step and pattern processing required in a photolithography process.

Figure 2:
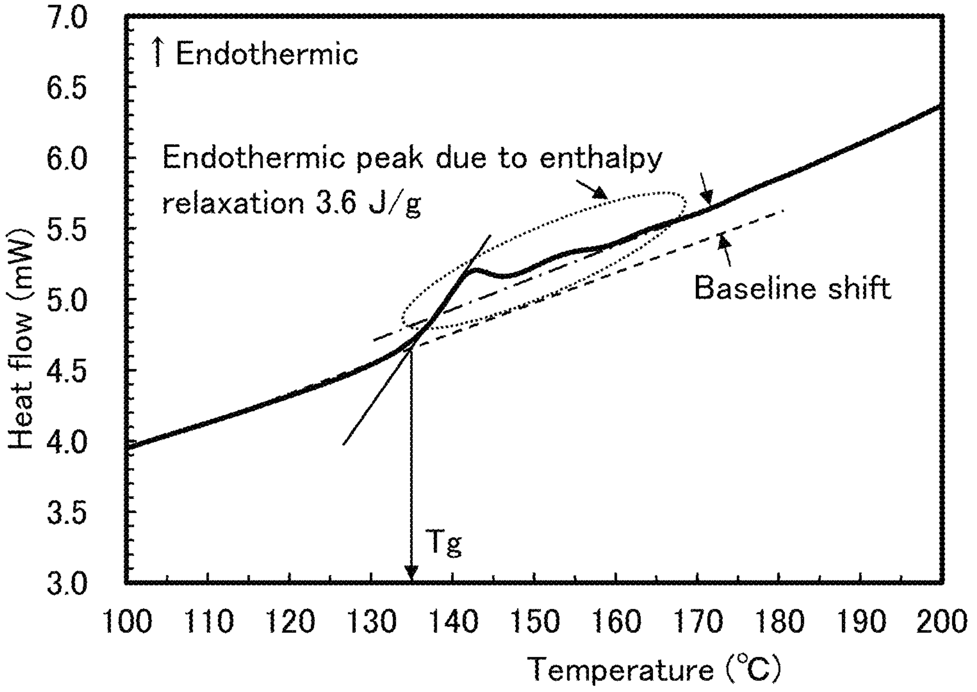
FIG. 2 is an enlarged graph of the result in FIG. 1B in a temperature range of 110° C. to 200° C.

The energy of enthalpy relaxation can be calculated from an area of a region surrounded by a line obtained by extending the shifted baseline and the DSC chart curve as illustrated in FIG. 2. When there are a plurality of peaks, the energy of enthalpy relaxation corresponds to the sum of the energies of the respective peaks.

An organic semiconductor device using the above first compound can have tolerance for heat in a manufacturing process. A thin film transistor (TFT), a light-emitting device, a photodiode sensor, and the like can be given as examples of the organic semiconductor device.

Note that the organic semiconductor device includes at least a pair of electrodes (first electrode and second electrode) and an organic compound layer between the pair of electrodes. The first compound is contained in the organic compound layer.

Here, in a semiconductor apparatus (e.g., a display apparatus or an image sensor) in which a plurality of organic semiconductor devices each including a pixel electrode and a common electrode are arranged on a plane, the first electrode is the pixel electrode independently included in each of the plurality of organic semiconductor devices, and the second electrode is the common electrode which is provided as a continuous layer and shared by the plurality of organic semiconductor devices. In the case where the organic compound layer has a stacked-layer structure including a first layer independently provided for each organic semiconductor device and a second layer shared by the plurality of organic semiconductor devices, the first compound is preferably contained in the first layer.

Note that in the case where the organic compound layers or the first layers of adjacent semiconductor devices do not overlap with each other, that is, a space is provided between the organic compound layers or the first layers of adjacent semiconductor devices, this structure is particularly effective and preferable because crosstalk between the adjacent semiconductor devices can be inhibited. This is particularly effective when a distance between adjacent semiconductor devices is an extremely small distance of 2 μm or less.

The first layer is provided on the first electrode side and the second layer is provided on the second electrode side. The first layer is preferably in contact with the first electrode, the second layer is preferably in contact with the second electrode, and the first layer and the second layer are preferably in contact with each other.

Note that it is preferable that in the organic compound layer and the first layer, the first compound be distributed in a layered manner and a layer containing the first compound be formed.

In the case where the organic compound layer is processed by a photolithography method, the organic semiconductor devices can be arranged at an extremely high density (a distance between the first electrodes can be approximately 2 μm to 5 μm). In the case where the organic semiconductor devices are display devices (light-emitting devices), an extremely high-resolution display apparatus with 500 ppi or more and an aperture ratio of 30% or more can be provided. Furthermore, an extremely high-resolution display apparatus with 100 ppi or more and an aperture ratio of 40% or more can be provided. Moreover, an extremely high-resolution display apparatus with 3000 ppi or more and an aperture ratio of 30% or more, or even 50% or more can be provided.

When the organic compound layer is processed by a photolithography method, heat is applied in steps of forming a protective film, baking a resist, dehydration baking, and the like. Applied heat needs to be as high as possible in order that a high-performance protective film can be formed or dehydration can be surely performed; thus, the first compound is preferably contained in the organic compound layer or the first layer to be processed by a photolithography method.

A film including a surface to be a free surface in heating, which has a high energy of an atom on the surface, tends to be affected by heat more than a bulk film. Thus, the first compound is preferably contained in the film including a surface to be a free surface in heating, i.e., a layer of the organic compound layer which is the closest to the second electrode. Alternatively, in the case where the organic compound layer includes the first layer and the second layer, the first compound is preferably contained in a layer of the first layer in contact with the second layer. The layer which is in contact with the second layer and contains the first compound is preferably neither a light-emitting layer nor an active layer because damage in a patterning step can be reduced and favorable efficiency or reliability can be obtained.

Note that it is preferable that attachment of dust to a free surface of an organic compound layer be prevented as much as possible for preventing poor film quality and poor characteristics. For example, it is preferable to form and store a substrate provided with an organic compound layer having a free surface in, for example, a clean room, which preferably has a cleanliness level of Class 1000 or a higher cleanliness level, further preferably Class 100 or a higher cleanliness level. It is preferable that an organic compound layer having a free surface be exposed to the air (oxygen or moisture) for as short time as possible for preventing poor film quality (change in film quality or film shape) and poor characteristics of a final organic semiconductor device. It is most preferable that the organic compound layer not be exposed to the air. It is preferable that a protective layer or an upper electrode be formed over an organic compound layer having a free surface immediately after the formation of the organic compound layer. In the case where a protective layer or an upper electrode is formed after a long time after formation of an organic compound layer having a free surface, it is preferable that a substrate provided with the organic compound layer having a free surface be stored in an inert atmosphere of nitrogen or the like. In addition, it is preferable that the storage period be shorter than or equal to seven days. In other words, with the structure of one embodiment of the present invention, favorable film quality can be kept for several days even in the state where an organic compound layer has a free surface.

It is preferable that the number of layers containing the first compound or the amount of the first compound contained in the layer be larger because high heat tolerance can be obtained in heating in the case where the first layer has a free surface.

An organic semiconductor device using the above first compound can have tolerance for heat in the manufacturing process and have favorable characteristics (especially display performance, efficiency, and reliability).

Specifically, problems are unlikely to be caused in the organic semiconductor device even when the heating temperature in a heating step is set to a temperature lower than Tg of the first compound by approximately 20° C. or a temperature that is 80% or more of Tg of the first compound.

Furthermore, the first compound is preferably contained in a region closer to the second electrode side than a light-emitting layer in the organic compound layer or the first layer, and is preferably an organic compound having an electron-transport property. An organic compound having a π-electron deficient heteroaromatic ring skeleton can be given as an example of the organic compound having an electron-transport property. As examples of the organic compound having a π-electron deficient heteroaromatic ring skeleton, compounds having a nitrogen-containing heteroaromatic skeleton such as an organic compound that includes a heteroaromatic ring having a polyazole skeleton, an organic compound that includes a heteroaromatic ring having a pyridine skeleton, an organic compound that includes a heteroaromatic ring having a diazine skeleton, and an organic compound that includes a heteroaromatic ring having a triazine skeleton are preferable.

Among the above compounds, a compound having a nitrogen-containing six-membered heterocyclic skeleton is preferable because of its high electron-transport property and stability, and an organic compound that includes a heteroaromatic ring having a diazine skeleton (a pyrimidine skeleton, a pyrazine skeleton, or a pyridazine skeleton), an organic compound that includes a heteroaromatic ring having a pyridine skeleton, and an organic compound that includes a heteroaromatic ring having a triazine skeleton are particularly preferable because of their high reliability. Furthermore, an organic compound that includes a heteroaromatic ring having a pyrimidine skeleton, an organic compound that includes a heteroaromatic ring having a pyrazine skeleton, and an organic compound that includes a heteroaromatic ring having a triazine skeleton have a high electron-transport property to contribute to reduction in driving voltage.

It is preferable that the organic compound have at least one of a benzofuropyrimidine skeleton, a benzoxazole skeleton, a quinoline skeleton, a quinoxaline skeleton, a dibenzoquinoxaline skeleton, a carbazole skeleton, a dibenzocarbazole skeleton, a dibenzofuran skeleton, a dibenzothiophene skeleton, a naphthobisbenzofuran skeleton, a naphthalene skeleton, a fluorene skeleton, a spirofluorene skeleton, a triphenylene skeleton, an anthracene skeleton, an amine, an aluminum element, a lithium element, and fluorine.

Embodiment 2

In this embodiment, an organic semiconductor device of one embodiment of the present invention, in particular, a light-emitting device, will be described in detail.

Figure 3A:
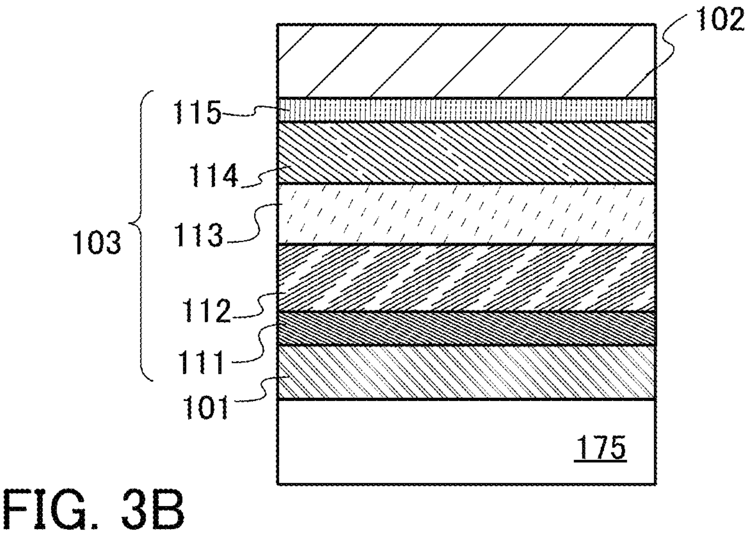
FIGS. 3A to 3C each illustrate a light-emitting device.

FIG. 3A is a schematic view of a light-emitting device of one embodiment of the present invention. In the light-emitting device, a first electrode 101 is provided over an insulating layer 175 and an organic compound layer 103 is provided between the first electrode 101 and a second electrode 102. The organic compound layer 103 contains the first compound described in Embodiment 1 and includes at least a light-emitting layer 113. The light-emitting layer 113 contains a light-emitting substance, and emits light when voltage is applied between the first electrode 101 and the second electrode 102.

The first compound may be contained in any layer in the organic compound layer 103, and is preferably contained in a layer to be a free surface when heat treatment is performed in a manufacturing process of the light-emitting device. Specifically, the first compound is preferably contained in an electron-transport layer 114 or a hole-blocking layer.

Note that the organic compound layer 103 may further contain a second compound and a third compound that have properties similar to the property of the first compound described in Embodiment 1. In other words, the first compound consists of a plurality of compounds. Furthermore, all substances contained in the organic compound layer 103 may be compounds that have properties similar to the property of the first compound described in Embodiment 1.

The total thickness of layers containing compounds that have the property of the first compound is preferably 30% or more, further preferably 50% or more, still further preferably 80% or more, the most preferably 100% of the thickness of the organic compound layer 103. In this case, the thicknesses of layers containing respective compounds can be estimated by analysis in the depth direction with respect to a substrate by time-of-flight secondary ion mass spectrometry (ToF-SIMS), for example. In addition, the content of the compounds that have the property of the first compound in the respective layers is preferably 50% or more, further preferably 80% or more. Similarly, the content of the compounds that have the property of the first compound with respect to the organic compound layer is preferably 30% or more, further preferably 50% or more, still further preferably 80% or more. In this case, the content can be estimated from the absorption intensity ratio, refractive index intensity ratio, or the like obtained from solutions of the compounds by high performance liquid chromatography (HPLC).

As illustrated in FIG. 3A, the organic compound layer 103 preferably includes functional layers such as a hole-injection layer 111, a hole-transport layer 112, the electron-transport layer 114, and an electron-injection layer 115 in addition to the light-emitting layer 113. Note that the organic compound layer 103 may include a functional layer other than the above-mentioned functional layers, such as a hole-blocking layer, an electron-blocking layer, an exciton-blocking layer, or a charge generation layer. In contrast, any of the above-mentioned layers is not necessarily provided.

Although the first electrode 101 includes an anode and the second electrode 102 includes a cathode in this embodiment, the first electrode 101 may include a cathode and the second electrode 102 may include an anode. The first electrode 101 and the second electrode 102 each have a single-layer structure or a stacked-layer structure. In the case of the stacked-layer structure, a layer in contact with the organic compound layer 103 serves as an anode or a cathode. In the case where the electrodes each have the stacked-layer structure, there is no limitation on work functions of materials in layers other than the layers in contact with the organic compound layer 103, and the materials can be selected in accordance with required properties such as resistivity, processing easiness, reflectivity, a light-transmitting property, and stability.

The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide (ITSO: indium tin silicon oxide), indium oxide-zinc oxide, and indium oxide containing tungsten oxide and zinc oxide (IWZO). Films of such conductive metal oxides are usually formed by a sputtering method, but may be formed by application of a sol-gel method or the like. For example, a film of indium oxide-zinc oxide is formed by a sputtering method using a target in which 1 wt % to 20 wt % zinc oxide is added to indium oxide. Furthermore, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are added to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), titanium, (Ti), aluminum (Al), nitride of a metal material (e.g., titanium nitride), or the like can be used for the anode. The anode may be a stack of layers formed of any of these materials. For example, a film in which Al, Ti, and ITSO are stacked in this order over Ti is preferable because the film has high efficiency owing to high reflectivity and enables high resolution of several thousand ppi. Graphene can also be used for the anode. Note that when a composite material that can be included in the hole-injection layer 111, which is described later, is used for a layer (typically, the hole-injection layer) that is in contact with the anode, an electrode material can be selected regardless of its work function.

The hole-injection layer 111 is provided in contact with the anode and has a function of facilitating injection of holes into the organic compound layer 103. The hole-injection layer 111 can be formed using a phthalocyanine-based compound such as phthalocyanine (abbreviation: $H_2Pc$), a phthalocyanine-based complex compound such as copper phthalocyanine (abbreviation: CuPc), an aromatic amine compound such as 4,4'-bis[N-(4-diphenylaminophenyl)-N-phenylamino]biphenyl (abbreviation: DPAB) or 4,4'-bis(N-{4-[N'-(3-methylphenyl)-N-phenylamino]phenyl}-N-phenylamino)biphenyl (abbreviation: DNTPD), or a high molecular compound such as poly(3,4-ethylenedioxythiophene)/poly(styrenesulfonic acid) (abbreviation: PEDOT/PSS).

The hole-injection layer 111 may be formed using a substance having an electron-accepting property. Examples of the substance having an acceptor property include organic compounds having an electron-withdrawing group (a halogen group or a cyano group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a fused aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has an excellent electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, a transition metal oxide such as molybdenum oxide, vanadium oxide, ruthenium oxide, tungsten oxide, or manganese oxide can be used, other than the above-described organic compounds.

The hole-injection layer 111 is preferably formed using a composite material containing any of the aforementioned materials having an acceptor property and an organic compound having a hole-transport property.

As the organic compound having a hole-transport property used in the composite material, any of a variety of organic compounds such as aromatic amine compounds, heteroaromatic compounds, aromatic hydrocarbons, and high molecular compounds (e.g., oligomers, dendrimers, and polymers) can be used. Note that the organic compound having a hole-transport property used in the composite material preferably has a hole mobility of $1\times10^{-6}$ $cm^2/Vs$ or higher. The organic compound having a hole-transport property used in the composite material preferably has a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further condensed to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to nitrogen of the amine through an arylene group may be used. Note that the organic compound having a hole-transport property preferably has an N,N-bis(4-biphenyl)amino group to enable fabricating a light-emitting device having a long lifetime.

Specific examples of the organic compound having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl) amine (abbreviation: YGTBi1BP-02), 4-[4'-(carbazol-9-yl) biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, N,N-bis(9,9-dimethyl-9H-fluoren-2-yl)-9,9'-spirobi-9H-fluoren-1-amine, N-(9,9-diphenyl-9H-fluoren-2-yl)-N,9-diphenyl-9H-carbazol-3-amine (abbreviation: PCAFLP(2)), and N-(9,9-diphenyl-9H-fluoren-2-yl)-N,9-diphenyl-9H-carbazol-2-amine (abbreviation: PCAFLP(2)-02).

As the material having a hole-transport property, the following aromatic amine compounds can also be used, for example: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

The formation of the hole-injection layer 111 can improve the hole-injection property, which allows the light-emitting device to be driven at a low voltage.

Among substances having an acceptor property, the organic compound having an acceptor property is easy to use because it is easily deposited by vapor deposition.

Note that the first compound may be used for the hole-injection layer 111.

The hole-transport layer 112 is formed using an organic compound having a hole-transport property. The organic compound having a hole-transport property preferably has a hole mobility of $1\times10^{6}$ $cm^2/Vs$ or higher.

Examples of the material having a hole-transport property include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), and 9-(1,1'-biphenyl-3-yl)-9'-(1,1'-biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: βNCCP), 9-(3-biphenyl)-9'-(2-naphthyl)-3,3'-bi-9H-carbazole (abbreviation: βNCCmBP), 9-(4-biphenyl)-9'-(2-naphthyl)-3,3'-bi-9H-carbazole (abbreviation: βNCCBP), 9,9'-di-2-naphthyl-3,3'-9H,9'H-bicarbazole (abbreviation: BisβNCz), 9-(2-naphthyl)-9'-[1,1':4',1"-terphenyl]-3-yl-3,3'-9H,9'H-bicarbazole, 9-(2-naphthyl)-9'-[1,1':3',1"-terphenyl]-3-yl-3,3'-9H,9'H-bicarbazole, 9-(2-naphthyl)-9'-[1,1':3',1"-terphenyl]-5'-yl-3,3'-9H,9'H-bicarbazole, 9-(2-naphthyl)-9'-[1,1':4',1"-terphenyl]-4-yl-3,3'-9H,9'H-bicarbazole, 9-(2-naphthyl)-9'-[1,1':3',1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-9H,9'H-bicarbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, and 9-(triphenylen-2-yl)-9'-[1,1':3',1"-terphenyl]-4-yl-3,3'-9H,9'H-bicarbazole; compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to reduction in driving voltage. Note that any of the substances given as examples of the material having a hole-transport property used for the composite material for the hole-injection layer 111 can also be suitably used as the material contained in the hole-transport layer 112.

Note that the first compound may be used for the hole-transport layer 112. In this case, the first compound is preferably an organic compound having at least one of a phenanthrene ring, a naphthalene ring, a dibenzothiophene ring, a dibenzofuran ring, a fluorene ring, a triphenylene ring, a carbazole ring, a 9,9'-spirobi[9H-fluorene] ring, a spiro[9H-fluorene-9,9'-[9H]xanthene] ring, a spiro[9H-fluorene-9,9'-[9H]thioxanthene] ring, and a spiro[acridine-9(2H),9'-[9H]fluorene] ring, and particularly preferably a compound represented by any of General Formulae (G1) to (G3) below.

[Chemical Formula 1]

(G1)

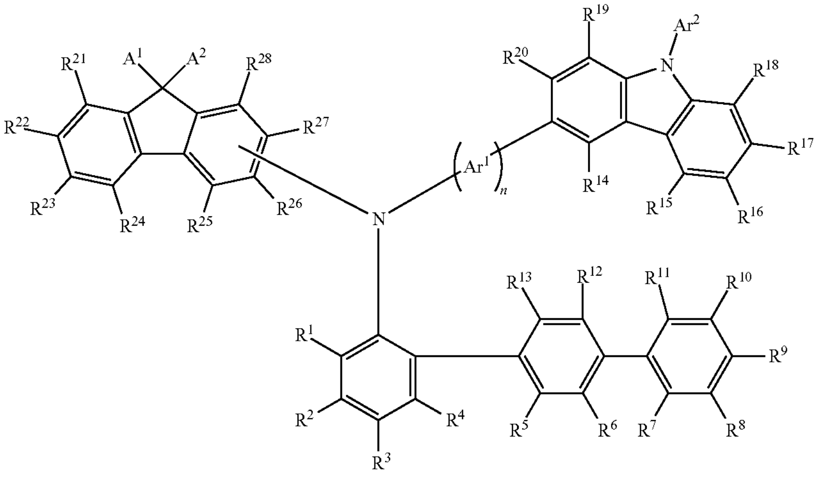

Note that in General Formula (G1) above, $Ar^1$ represents a substituted or unsubstituted arylene group having 6 to 13 carbon atoms or a substituted or unsubstituted heteroarylene group having 2 to 14 carbon atoms; $Ar^2$ represents any one of a substituted or unsubstituted aryl group having 6 to 12 carbon atoms, a substituted or unsubstituted alkyl group having 1 to 6 carbon atoms, and a substituted or unsubstituted cycloalkyl group having 3 to 20 carbon atoms; each of $A^1$ and $A^2$ independently represents any one of hydrogen, deuterium, a substituted or unsubstituted alkyl group having 1 to 20 carbon atoms, a substituted or unsubstituted cycloalkyl group having 1 to 20 carbon atoms, and a substituted or unsubstituted heteroaryl group having 2 to 30 carbon atoms; and $A^1$ and $A^2$ may be bonded to each other to form a ring. Note that when each of $A^1$ and $A^2$ is neither hydrogen nor deuterium, three dimensionality is increased and thus the organic compound represented by General Formula (G1) can have improved amorphous property. Each of $A^1$ and $A^2$ is preferably an alkyl group because the amorphous property is further improved. Moreover, when each of $A^1$ and $A^2$ is an alkyl group, solubility in a solvent or a sublimation property is improved and thus a high-purity compound can be easily obtained.

Furthermore, each of $R^1$, $R^2$, $R^4$ to $R^{26}$, and $R^{28}$ independently represents any one of hydrogen, deuterium, a substituted or unsubstituted aryl group having 6 to 30 carbon atoms, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. When $R^3$ is an aryl group, the amorphous property is reduced and the thermophysical property deteriorates. Thus, $R^3$ represents any one of hydrogen, deuterium, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. In particular, deuterium is preferable in terms of reliability because the excited state thereof is stable. With an exception, the case where $R^3$ is an aryl group having a fused structure with 11 to 30 carbon atoms is preferable because the three dimensionality is increased. Note that n represents an integer of 1 to 4.

[Chemical Formula 2]

(G2)

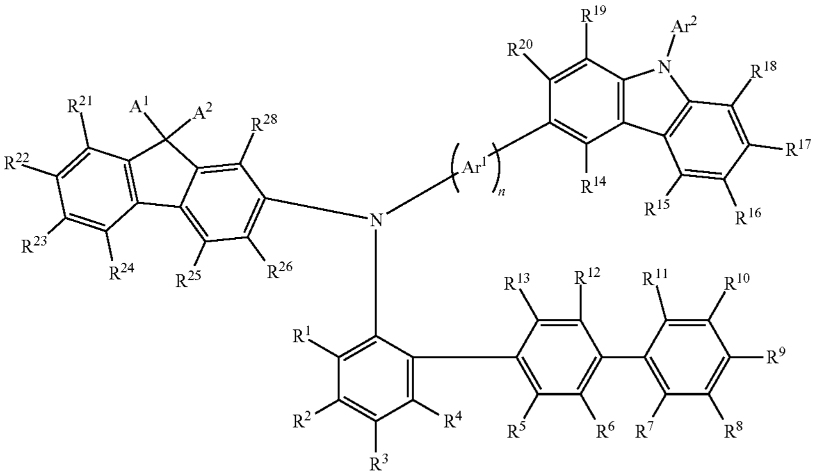

Note that in General Formula (G2) above, $Ar^1$ represents a substituted or unsubstituted arylene group having 6 to 13 carbon atoms or a substituted or unsubstituted heteroarylene group having 2 to 14 carbon atoms; $Ar^2$ represents any one of a substituted or unsubstituted aryl group having 6 to 12 carbon atoms, a substituted or unsubstituted alkyl group having 1 to 6 carbon atoms, and a substituted or unsubstituted cycloalkyl group having 3 to 20 carbon atoms; each of $A^1$ and $A^2$ independently represents any one of hydrogen, deuterium, a substituted or unsubstituted alkyl group having 1 to 20 carbon atoms, a substituted or unsubstituted cycloalkyl group having 1 to 20 carbon atoms, and a substituted or unsubstituted heteroaryl group having 2 to 30 carbon atoms; and $A^1$ and $A^2$ may be bonded to each other to form a ring. Note that when each of $A^1$ and $A^2$ is neither hydrogen nor deuterium, three dimensionality is increased and thus the organic compound represented by General Formula (G1) can have improved amorphous property. Each of $A^1$ and $A^2$ is preferably an alkyl group because the amorphous property is further improved. Moreover, when each of $A^1$ and $A^2$ is an alkyl group, solubility in a solvent or a sublimation property is improved and thus a high-purity compound can be easily obtained.

Furthermore, each of $R^1$, $R^2$, $R^4$ to $R^{26}$, and $R^{28}$ independently represents any one of hydrogen, deuterium, a substituted or unsubstituted aryl group having 6 to 30 carbon atoms, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. When $R^3$ is an aryl group, the amorphous property is reduced and the thermophysical property deteriorates. Thus, $R^3$ represents any one of hydrogen, deuterium, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. In particular, deuterium is preferable in terms of reliability because the excited state thereof is stable. With an exception, the case where $R^3$ is an aryl group having a fused structure with 11 to 30 carbon atoms is preferable because the three dimensionality is increased. Note that n represents an integer of 1 to 4.

[Chemical Formula 3]

(G3)

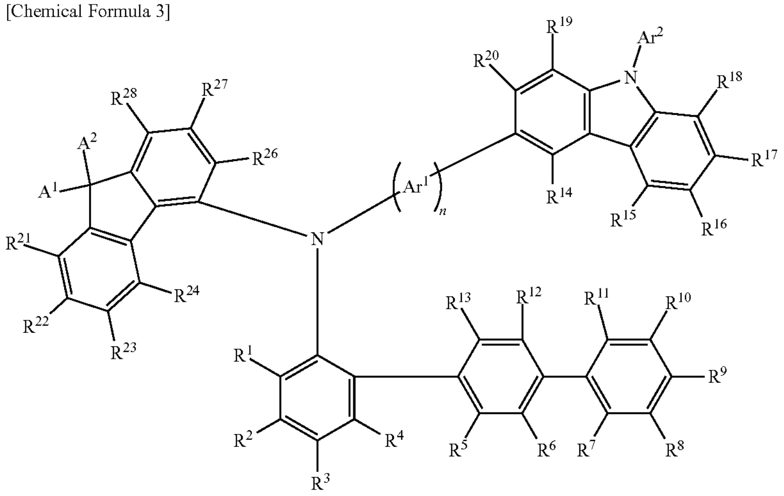

Note that in General Formula (G3) above, $Ar^1$ represents a substituted or unsubstituted arylene group having 6 to 13 carbon atoms or a substituted or unsubstituted heteroarylene group having 2 to 14 carbon atoms; $Ar^2$ represents any one of a substituted or unsubstituted aryl group having 6 to 12 carbon atoms, a substituted or unsubstituted alkyl group having 1 to 6 carbon atoms, and a substituted or unsubstituted cycloalkyl group having 3 to 20 carbon atoms; each of $A^1$ and $A^2$ independently represents any one of hydrogen, deuterium, a substituted or unsubstituted alkyl group having 1 to 20 carbon atoms, a substituted or unsubstituted cycloalkyl group having 1 to 20 carbon atoms, and a substituted or unsubstituted heteroaryl group having 2 to 30 carbon atoms; and $A^1$ and $A^2$ may be bonded to each other to form a ring. Note that when each of $A^1$ and $A^2$ is neither hydrogen nor deuterium, three dimensionality is increased and thus the organic compound represented by General Formula (G1) can have improved amorphous property. Each of $A^1$ and $A^2$ is preferably an alkyl group because the amorphous property is further improved. Moreover, when each of $A^1$ and $A^2$ is an alkyl group, solubility in a solvent or a sublimation property is improved and thus a high-purity compound can be easily obtained.

Furthermore, each of $R^1$, $R^2$, $R^4$ to $R^{26}$, and $R^{28}$ independently represents any one of hydrogen, deuterium, a substituted or unsubstituted aryl group having 6 to 30 carbon atoms, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. When $R^3$ is an aryl group, the amorphous property is reduced and the thermophysical property deteriorates. Thus, $R^3$ represents any one of hydrogen, deuterium, a substituted or unsubstituted alkyl group having 1 to 20 carbon atoms, a substituted or unsubstituted cycloalkyl group having 3 to 20 carbon atoms, and a substituted or unsubstituted heteroaryl group having 2 to 30 carbon atoms. In particular, deuterium is preferable in terms of reliability because the excited state thereof is stable. With an exception, the case where $R^3$ is an aryl group having a fused structure with 11 to 30 carbon atoms is preferable because the three dimensionality is increased. Note that n represents an integer of 1 to 4.

In any of General Formulae (G1) to (G3) above, it is preferable that each of $R^1$, $R^2$, $R^4$ to $R^{26}$, and $R^{28}$ be any one of hydrogen, deuterium, and an alkyl group having 1 to 6 carbon atoms, and it is further preferable that all of $R^1$ to $R^{24}$ and $R^{26}$ to $R^{28}$ be hydrogen.

In any of General Formulae (G1) to (G3) above, $Ar^1$ is preferably a substituted or unsubstituted arylene group having 6 to 13 carbon atoms, further preferably a substituted or unsubstituted phenylene group, still further preferably a phenylene group.

In any of General Formulae (G1) to (G3) above, $Ar^2$ is preferably a substituted or unsubstituted aryl group having 6 to 12 carbon atoms, further preferably a substituted or unsubstituted phenyl group, still further preferably a phenyl group.

In any of General Formulae (G1) to (G3), each of $A^1$ and $A^2$ is preferably independently any one of hydrogen, deuterium, and a substituted or unsubstituted alkyl group having 1 to 6 carbon atoms, further preferably an alkyl group having 1 to 6 carbon atoms, still further preferably a methyl group.

The light-emitting layer preferably includes a light-emitting substance and a host material. The light-emitting layer may additionally include other materials. Alternatively, the light-emitting layer may be a stack of two layers with different compositions.

As the light-emitting substance, fluorescent substances, phosphorescent substances, substances exhibiting thermally activated delayed fluorescence (TADF), or other light-emitting substances may be used.

Examples of the material that can be used as a fluorescent substance in the light-emitting layer are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Examples of the material that can be used when a phosphorescent substance is used as the light-emitting substance in the light-emitting layer are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz\text{-}dmp)_3]$), tris(5-methyl-3,4-diphenyl-4H-1,2,4-triazolato) iridium(III) (abbreviation: $[Ir(Mptz)_3]$), or tris[4-(3-biphenyl)-5-isopropyl-3-phenyl-4H-1,2,4-triazolato]iridium(III) (abbreviation: $[Ir(iPrptz\text{-}3b)_3]$); an organometallic iridium complex having a 1H-triazole skeleton, such as tris[3-methyl-1-(2-methylphenyl)-5-phenyl-1H-1,2,4-triazolato] iridium(III) (abbreviation: $[Ir(Mptz1\text{-}mp)_3]$) or tris(1-methyl-5-phenyl-3-propyl-1H-1,2,4-triazolato)iridium(III) (abbreviation: $[Ir(Prptz1\text{-}Me)_3]$); an organometallic iridium complex having an imidazole skeleton, such as fac-tris[1-(2,6-diisopropylphenyl)-2-phenyl-1H-imidazole]iridium (III) (abbreviation: $[Ir(iPrpim)_3]$) or tris[3-(2,6-dimethylphenyl)-7-methylimidazo[1,2-f]phenanthridinato]iridium (III) (abbreviation: $[Ir(dmpimpt\text{-}Me)_3]$); and an organometallic iridium complex in which a phenylpyridine derivative having an electron-withdrawing group is a ligand, such as bis[2-(4',6'-difluorophenyl)pyridinato-N,$C^{2'}$]iridium (III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl) phenyl]pyridinato-N,$C^{2'}$}iridium(III) picolinate (abbreviation: $[Ir(CF_3ppy)_2(pic)]$), or bis[2-(4',6'-difluorophenyl)pyridinato-N,$C^{2}$]iridium(III) acetylacetonate (abbreviation: FIr(acac)). These compounds exhibit blue phosphorescence and have an emission peak in the wavelength range of 450 nm to 520 nm.

Other examples include an organometallic iridium complex having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium (III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), or (acetylacetonato)bis(4,6-diphenylpyrimidinato)iridium(III) (abbreviation: $[Ir(dppm)_2(acac)]$); an organometallic iridium complex having a pyrazine skeleton, such as (acetylacetonato)bis(3,5-dimethyl-2-phenylpyrazinato)iridium(III) (abbreviation: $[Ir(mppr\text{-}Me)_2(acac)]$) or (acetylacetonato)bis(5-isopropyl-3-methyl-2-phenylpyrazinato)iridium(III) (abbreviation: $[Ir(mppr\text{-}iPr)_2(acac)]$); an organometallic iridium complex having a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), [2-d3-methyl-8-(2-pyridinyl-N)benzofuro[2,3-b]pyridine-κC]bis[2-(5-d3-methyl-2-pyridinyl-κN2)phenyl-κC]iridium(III) (abbreviation: $Ir(5mppy\text{-}d3)_2(mbfpypy\text{-}d3)$), [2-(methyl-d3)-8-[4-(1-methylethyl-1-d)-2-pyridinyl-κN]benzofuro[2,3-b]pyridin-7-yl-κC]bis[5-(methyl-d3)-2-[5-(methyl-d3)-2-pyridinyl-κN]phenyl-κC]iridium(III) (abbreviation: $Ir(5mtpy\text{-}d6)_2(mbfpypy\text{-}iPr\text{-}d4)$), [2-d3-methyl-(2-pyridinyl-κN)benzofuro[2,3-b]pyridine-κC]bis[2-(2-pyridinyl-κN)phen yl-κC]iridium(III) (abbreviation: $Ir(ppy)_2(mbfpypy\text{-}d3)$), or [2-(4-methyl-5-phenyl-2-pyridinyl-κN)phenyl-κC]bis[2-(2-pyridinyl-κN)phenyl-κC] iridium(III) (abbreviation: $Ir(ppy)_2(mdppy)$); and a rare earth metal complex such as tris(acetylacetonato) (monophenanthroline)terbium(III) (abbreviation: $[Tb(acac)_3(Phen)]$). These are mainly compounds that exhibit green phosphorescence and have an emission peak in the wavelength range of 500 nm to 600 nm. Note that organometallic iridium complexes having a pyrimidine skeleton have distinctively high reliability or emission efficiency and thus are particularly preferable.

Other examples include an organometallic iridium complex having a pyrimidine skeleton, such as (diisobutyrylmethanato)bis[4,6-bis(3-methylphenyl)pyrimidinato] iridium(III) (abbreviation: $[Ir(5mdppm)_2(dibm)]$), bis[4,6-bis(3-methylphenyl)pyrimidinato](dipivaloylmethanato) iridium(III) (abbreviation: $[Ir(5mdppm)_2(dpm)]$), or bis[4,6-di(naphthalen-1-yl)pyrimidinato](dipivaloylmethanato) iridium(III) (abbreviation: $[Ir(d1npm)_2(dpm)]$); an organometallic iridium complex having a pyrazine skeleton, such as (acetylacetonato)bis(2,3,5-triphenylpyrazinato) iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), or (acetylacetonato)bis[2,3-bis(4-fluorophenyl)quinoxalinato]iridium(III) (abbreviation: $[Ir(Fdpq)_2(acac)]$); an organometallic iridium complex having a pyridine skeleton, such as tris(1-phenylisoquinolinato-N,$C^{2'}$)iridium(III) (abbreviation: $[Ir(piq)_3]$) or bis(1-phenylisoquinolinato-N,$C^{2'}$)iridium(III) acetylacetonate (abbreviation: $[Ir(piq)_2(acac)]$); a platinum complex such as 2,3,7,8,12,13,17,18-octaethyl-21H,23H-porphyrinplatinum(II) (abbreviation: PtOEP); and a rare earth metal complex such as tris(1,3-diphenyl-1,3-propanedionato)(monophenanthroline)europium(III) (abbreviation: $[Eu(DBM)_3(Phen)]$) or tris[1-(2-thenoyl)-3,3,3-trifluoroacetonato](monophenanthroline)europium(III) (abbreviation: $[Eu(TTA)_3(Phen)]$). These compounds exhibit red phosphorescence and have an emission peak in the wavelength range of 600 nm to 700 nm. Organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.
[Chemical Formula 4]
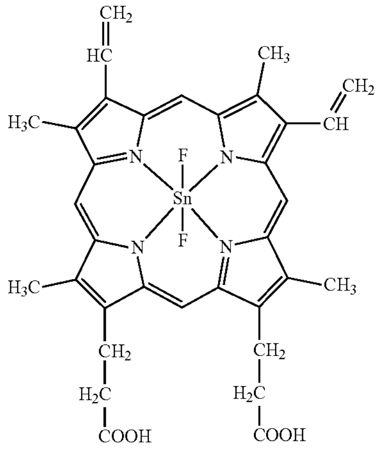
$SnF_2$(Proto IX)
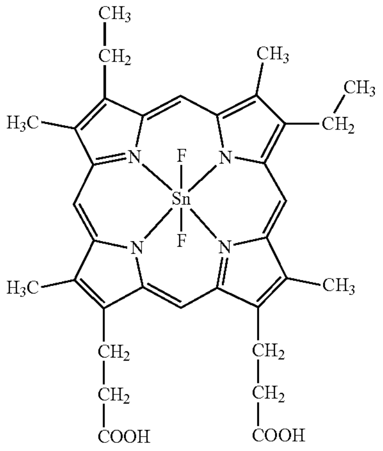
$SnF_2$(Meso IX)
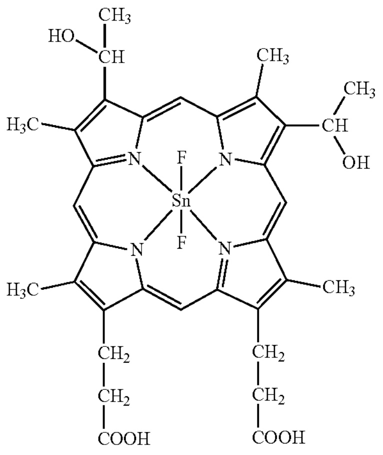
$SnF_2$(Hemato IX)
-continued
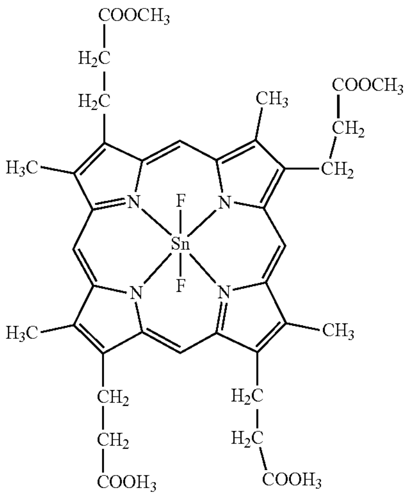
$SnF_2$(Copro III-4Me)
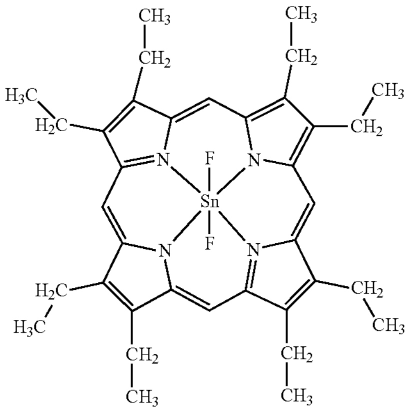
$SnF_2$(OEP)
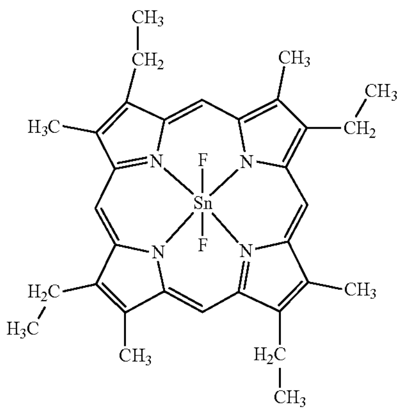
$SnF_2$(Etio I)

-continued

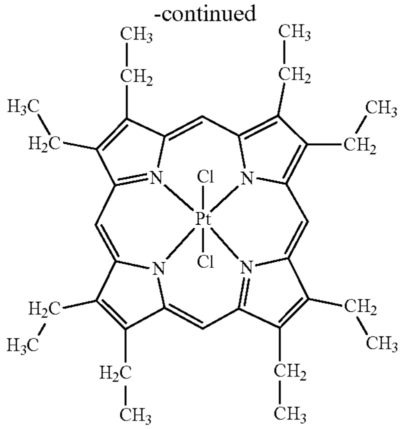

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 5]

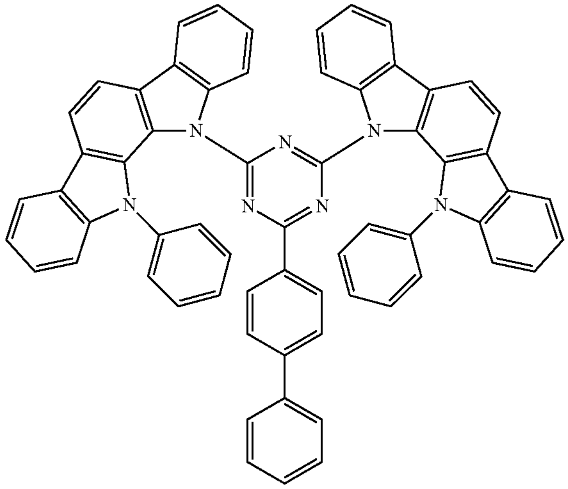

PIC-TRZ

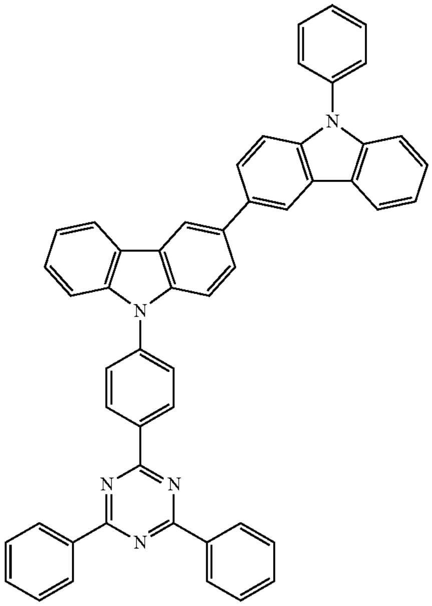

PCCzPTzn

-continued

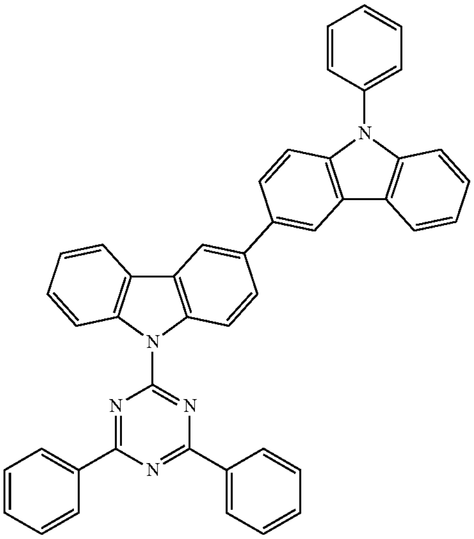

PCCzTzn

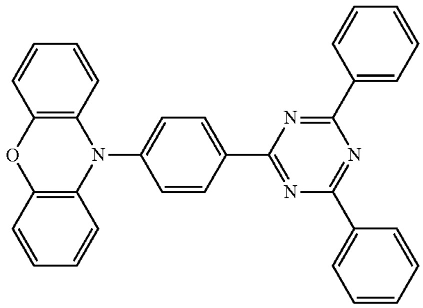

PXZ-TRZ

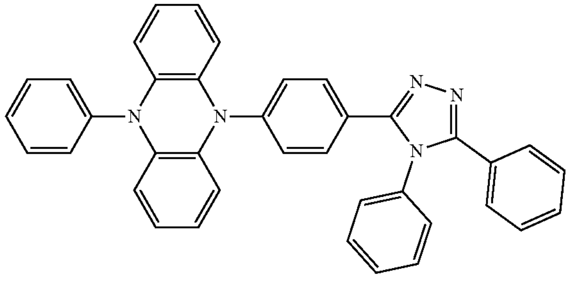

PPZ-3TPT

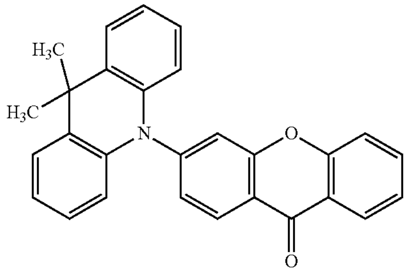

ACRXTN

-continued

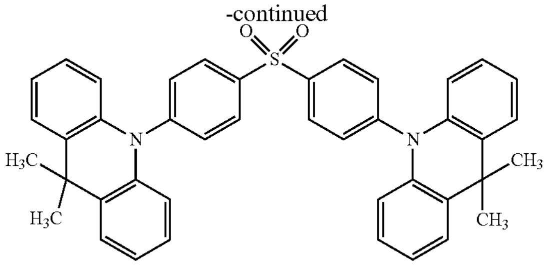

DMAC-DPS

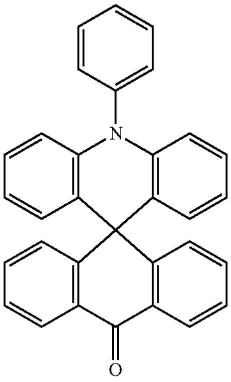

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton, for example. As the π-electron rich heteroaromatic ring, a fused aromatic ring having at least one of an acridine skeleton, a phenoxazine skeleton, a phenothiazine skeleton, a furan skeleton, a thiophene skeleton, and a pyrrole skeleton is preferable; specifically, a carbazole ring, a dibenzothiophene ring, or a ring in which an aromatic ring or a heteroaromatic ring is further fused to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to nitrogen of the amine through an arylene group may be used. Note that the organic compound having a hole-transport property preferably has an N,N-bis(4-biphenyl)amino group to enable fabricating a light-emitting device having a long lifetime.

Examples of such an organic compound include a compound having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]-9,9'-spirobi[9H-fluoren]-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to reduction in driving voltage. In addition, the organic compounds given as examples of the material having a hole-transport property that can be used for the hole-transport layer can also be used.

The material having an electron-transport property preferably has an electron mobility of $1\times10^{-7}$ $cm^2/Vs$ or higher, further preferably $1\times10^{-6}$ $cm^2/Vs$ or higher when the square root of the electric field strength [V/cm] is 600. Note that any other substance can also be used as long as the substance has an electron-transport property higher than a hole-transport property.

As the material having an electron-transport property, for example, a metal complex such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring skeleton is preferably used. As examples of the organic compound having a π-electron deficient heteroaromatic ring skeleton, an organic compound that includes a heteroaromatic ring having a polyazole skeleton, an organic compound that includes a heteroaromatic ring having a pyridine skeleton, an organic compound that includes a heteroaromatic ring having a diazine skeleton, and an organic compound that includes a heteroaromatic ring having a triazine skeleton can be given.

Among the above materials, the organic compound that includes a heteroaromatic ring having a diazine skeleton (a pyrimidine skeleton, a pyrazine skeleton, or a pyridazine skeleton), the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to reduction in driving voltage. A benzofuropyrimidine skeleton, a benzothienopyrimidine skeleton, a benzofuropyrazine skeleton, and a benzothienopyrazine skeleton are preferred because of their high acceptor properties and high reliability.

Examples of the organic compound having a π-electron deficient heteroaromatic ring skeleton include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), 2,9-di(naphthalene-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), 2-[3-(2-triphenylenyl)phenyl]-1,10-phenanthroline (abbreviation: mTpPPhen), 2-phenyl-9-(2-triphenylenyl)-1,10-phenanthroline (abbreviation: Ph-TpPhen), 2-[4-(9-phenanthrenyl)-1-naphthalenyl]-1,10-phenanthroline (abbreviation: PnNPhen), or 2-[4-(2-triphenylenyl)phenyl]-1,10-phenanthroline (abbreviation: pTpPPhen); an organic compound having a diazine skeleton, such as 2-[3-(dibenzothiophen-4-yl)phenyl]dibenzo[f,h]quinoxaline (abbreviation: 2mDBTPDBq-II), 2-[3-(3'-dibenzothiophen-4-yl)biphenyl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[3'-(dibenzothiophen-4-yl)biphenyl-3-yl]naphtho[1',2':4,5]furo[2,3-b]pyrazine (abbreviation: 9mDBtBPNfpr), 9-[3'-(dibenzothiophen-4-yl)biphenyl-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidi ne (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl) (1,1'-biphenyl-3-yl)]naphtho[1',2':4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(pN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine}(abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazole (abbreviation: PC-cgDBCzQz); and an organic compound having a heteroaromatic ring having a triazine skeleton, such as 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris(3'-(pyridin-3-yl)biphenyl-3-yl)-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), or 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn). The organic compound that includes a heteroaromatic ring having a diazine skeleton, the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no $\pi$ bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no $\pi$ bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a $\pi$ bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), 9-(1-naphthyl)-10-[4-(2-naphthyl)phenyl]anthracene (abbreviation: αN-βNPAnth), 9-(1-naphthyl)-10-(2-naphthyl)anthracene (abbreviation: α,βADN), 2-(10-phenylanthracen-9-yl) dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), and 1-[4-(10-[1,1'-biphenyl]-4-yl-9-anthracenyl)phenyl]-2-ethyl-1H-benzimidazole (abbreviation: EtBImPBPhA). In particular, CzPA, cgDBCzPA, 2mBnfPPA, and PCzPA exhibit excellent properties and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layer 114 contains a substance having an electron-transport property. The material having an electron-transport property preferably has an electron mobility of $1\times10^{-7}$ $cm^2/Vs$ or higher, further preferably $1\times10^{-6}$ $cm^2/Vs$ or higher when the square root of the electric field strength [V/cm] is 600. Note that any other substance can also be used as long as the substance has an electron-transport property higher than a hole-transport property. An organic compound including a π-electron deficient heteroaromatic ring is preferable as the above organic compound. The organic compound including a π-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton.

As the organic compound having an electron-transport property that can be used for the electron-transport layer 114, any of the above-mentioned organic compounds that can be used as the organic compound having an electron-transport property in the light-emitting layer 113 can be used. Among the above materials, the organic compound that includes a heteroaromatic ring having a diazine skeleton, the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to reduction in driving voltage. In particular, an organic compound having a phenanthroline skeleton such as mTpPPhen, PnNPhen, or mPPhen2P is preferable, and an organic compound having a phenanthroline dimer structure such as mPPhen2P has excellent stability and thus is further preferable.

Note that the first compound is preferably contained in the electron-transport layer 114, and among the above-described materials or known materials, a material that has a property similar to the property of the first compound in Embodiment 1 is used as the material included in the electron-transport layer 114. For example, mTpPPhen, PnNPhen, or mPPhen2P is preferable as the first compound.

In the case where the first compound is contained in the electron-transport layer, the first compound is preferably an organic compound represented by General Formula (G6) below.

[Chemical Formula 6]

(G6)

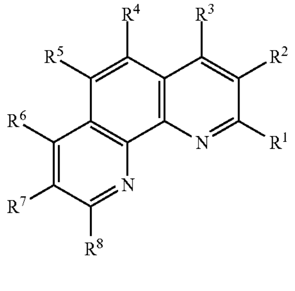

In General Formula (G6) above, each of $R^1$ to $R^8$ independently represents any one of hydrogen, deuterium, a substituted or unsubstituted aryl group having 6 to 30 carbon atoms, a substituted or unsubstituted heteroaryl group having 2 to 30 carbon atoms, a substituted or unsubstituted alkyl group having 1 to 10 carbon atoms, a substituted or unsubstituted cycloalkyl group having 3 to 10 carbon atoms, a substituted or unsubstituted alkoxy group having 1 to 10 carbon atoms, a cyano group, halogen, and a substituted or unsubstituted alkyl halide group having 1 to 10 carbon atoms, and at least one of $R^1$ to $R^8$ represents a bond with General Formula (g1) or (g2) below.

[Chemical Formula 7]

(g1)

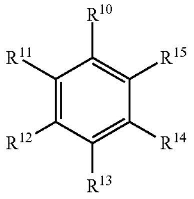

(g2)

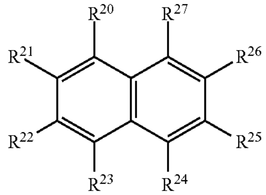

In General Formulae (g1) and (g2) above, each of $R^{10}$ and $R^{20}$ represents a bond with General Formula (G6) above; each of $R^{11}$ to $R^{13}$, $R^{15}$, $R^{21}$, $R^{22}$, and $R^{24}$ to $R^{27}$ independently represents any one of hydrogen, deuterium, a substituted or unsubstituted aryl group having 6 to 30 carbon atoms, a substituted or unsubstituted heteroaryl group having 2 to 30 carbon atoms, a substituted or unsubstituted alkyl group having 1 to 10 carbon atoms, a substituted or unsubstituted cycloalkyl group having 3 to 10 carbon atoms, a substituted or unsubstituted alkoxy group having 1 to 10 carbon atoms, a cyano group, halogen, and a substituted or unsubstituted alkyl halide group having 1 to 10 carbon atoms; and each of $R^{14}$ and $R^{23}$ independently represents either one of a substituted or unsubstituted aryl group having 6 to 30 carbon atoms and a substituted or unsubstituted heteroaryl group having 2 to 30 carbon atoms.

The first compound is further preferably an organic compound represented by General Formula (G6-1) or (G6-2) below because the organic compound can be expected to have a high glass transition temperature and a high electron-transport property.

[Chemical Formula 8]

(G6-1)

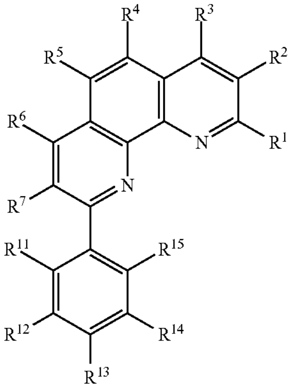

-continued (G6-2)

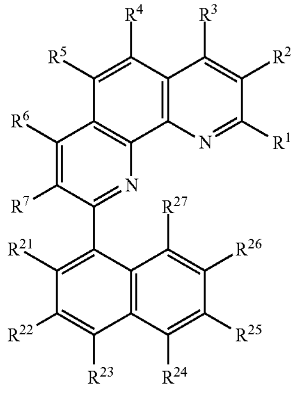

In each of General Formulae (G6-1) and (G6-2) above, each of $R^1$ to $R^7$ independently represents any one of hydrogen, deuterium, a substituted or unsubstituted aryl group having 6 to 30 carbon atoms, a substituted or unsubstituted heteroaryl group having 2 to 30 carbon atoms, a substituted or unsubstituted alkyl group having 1 to 10 carbon atoms, a substituted or unsubstituted cycloalkyl group having 3 to 10 carbon atoms, a substituted or unsubstituted alkoxy group having 1 to 10 carbon atoms, a cyano group, halogen, and a substituted or unsubstituted alkyl halide group having 1 to 10 carbon atoms; each of $R^{11}$ to $R^{13}$, $R^{15}$, $R^{21}$, $R^{22}$, and $R^{24}$ to $R^{27}$ independently represents any one of hydrogen, deuterium, a substituted or unsubstituted aryl group having 6 to 30 carbon atoms, a substituted or unsubstituted heteroaryl group having 2 to 30 carbon atoms, a substituted or unsubstituted alkyl group having 1 to 10 carbon atoms, a substituted or unsubstituted cycloalkyl group having 3 to 10 carbon atoms, a substituted or unsubstituted alkoxy group having 1 to 10 carbon atoms, a cyano group, halogen, and a substituted or unsubstituted alkyl halide group having 1 to 10 carbon atoms; and each of $R^{14}$ and $R^{23}$ represents a substituted or unsubstituted aryl group having 6 to 30 carbon atoms or a substituted or unsubstituted heteroaryl group having 2 to 30 carbon atoms.

In the groups represented by General Formulae (g1) and (g2) above and General Formulae (G6-1) and (G6-2) above, each of $R^{14}$ and $R^{23}$ is preferably a substituted or unsubstituted aryl group having 10 to 30 carbon atoms or a substituted or unsubstituted heteroaryl group, further preferably an unsubstituted aryl group having 14 to 30 carbon atoms because aggregation due to heat can be inhibited. Specifically, in the groups represented by General Formulae (g1) and (g2) above and General Formulae (G6-1) and (G6-2) above, each of $R^{14}$ and $R^{23}$ is preferably any of substituted or unsubstituted triphenylene, substituted or unsubstituted phenanthrene, substituted or unsubstituted naphthalene, substituted or unsubstituted anthracene, substituted or unsubstituted tetracene, substituted or unsubstituted phenanthroline, and substituted or unsubstituted 9,9'-spirobi[9H-fluorene].

The first compound is preferably an organic compound represented by General Formula (G7) below because a high electron-transport property can be expected.

[Chemical Formula 9]

(G7)

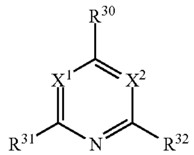

In General Formula (G7) above, each of $X^1$ and $X^2$ independently represents a nitrogen atom or a carbon atom. In addition, each of $R^{30}$ to $R^{32}$ independently represents a substituted or unsubstituted aryl group having 6 to 30 carbon atoms or a substituted or unsubstituted heteroaryl group having 2 to 30 carbon atoms, and at least one of $R^{30}$ to $R^{32}$ represents a substituted or unsubstituted aryl group having 14 to 30 carbon atoms, a substituted or unsubstituted heteroaryl group having 14 to 30 carbon atoms, a substituted or unsubstituted aryl group having a spiro ring structure having 25 to 30 carbon atoms, or a substituted or unsubstituted heteroaryl group having a spiro ring structure having 14 to 30 carbon atoms.

Note that the electron-transport layer 114 may have a stacked-layer structure. A layer in contact with the light-emitting layer 113 in the electron-transport layer 114 having a stacked-layer structure may function as a hole-blocking layer. In the case where an electron-transport layer in contact with a light-emitting layer functions as a hole-blocking layer, the HOMO level of a material contained in the electron-transport layer is preferably deeper than the HOMO level of the material contained in the light-emitting layer 113 by 0.5 eV or more.

The electron-injection layer 115 may contain a compound or a complex of an alkali metal or an alkaline earth metal, such as 8-hydroxyquinolinato-lithium (abbreviation: Liq), 1,1'-pyridine-2,6-diyl-bis(1,3,4,6,7,8-hexahydro-2H-pyrimido[1,2-a]pyrimidine) (abbreviation: hpp2Py), or the like. As the electron-injection layer 115, an alkali metal, an alkaline earth metal, or a compound thereof may be contained in a layer formed using a substance having an electron-transport property.

Figure 3B:
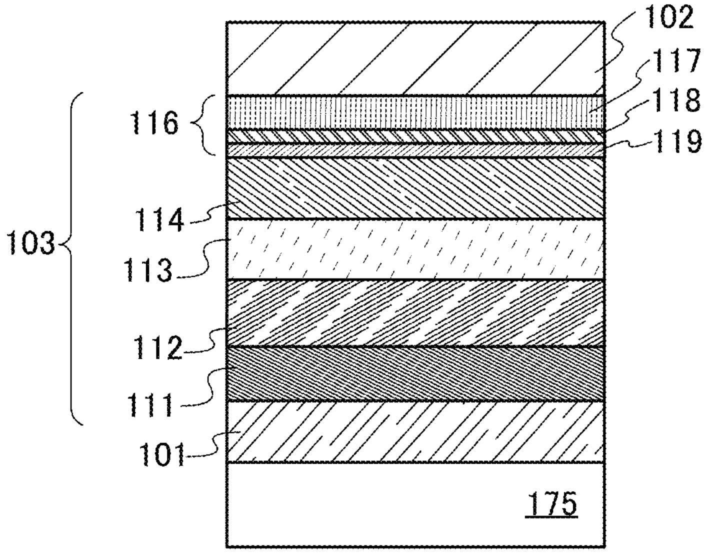

Instead of the electron-injection layer 115, a charge-generation layer 116 may be provided (FIG. 3B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode; thus, the organic EL device operates. Since the organic compound of one embodiment of the present invention has a low refractive index, using the organic compound for the p-type layer 117 enables the organic EL device to have high external quantum efficiency.

Note that the charge-generation layer 116 preferably includes one or both of an electron-relay layer 118 and an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the acceptor substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

The electron-injection buffer layer 119 can be formed using a substance having a high electron-injection property, e.g., an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)).

In the case where the electron-injection buffer layer 119 contains a substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

The second electrode 102 is an electrode including a cathode. The second electrode 102 may have a stacked-layer structure, in which case a layer in contact with the organic compound layer 103 functions as a cathode. For the cathode, a metal, an alloy, an electrically conductive compound, or a mixture thereof each having a low work function (specifically, lower than or equal to 3.8 eV) or the like can be used. Specific examples of such a cathode material include elements belonging to Group 1 or 2 of the periodic table, such as alkali metals (e.g., lithium (Li) or cesium (Cs)), magnesium (Mg), calcium (Ca), and strontium (Sr), alloys containing these elements (e.g., MgAg and AlLi), compounds (e.g., lithium fluoride (LiF), cesium fluoride (CsF), and calcium fluoride ($CaF_2$)), rare earth metals such as europium (Eu) and ytterbium (Yb), and alloys containing these rare earth metals. However, when the electron-injection layer 115 or a thin film formed using any of the above materials having a low work function is provided between the second electrode 102 and the electron-transport layer, a variety of conductive materials such as Al, Ag, ITO, or indium oxide-tin oxide containing silicon or silicon oxide can be used for the cathode regardless of the work function.

When the second electrode 102 is formed using a material that transmits visible light, the light-emitting device can emit light from the second electrode 102 side.

Films of these conductive materials can be deposited by a dry process such as a vacuum evaporation method or a sputtering method, an ink-jet method, a spin coating method, or the like. Alternatively, a wet process using a sol-gel method or a wet process using a paste of a metal material may be employed.

Any of a variety of methods can be used for forming the organic compound layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

Next, an embodiment of an organic EL device with a structure in which a plurality of light-emitting units are stacked (this type of organic EL device is also referred to as a stacked or tandem device) is described with reference to FIG. 3C. This organic EL device includes a plurality of light-emitting units between an anode and a cathode. One light-emitting unit has substantially the same structure as the organic compound layer 103 illustrated in FIG. 3A. In other words, the organic EL device illustrated in FIG. 3C includes a plurality of light-emitting units, and the organic EL device illustrated in FIG. 3A or 3B includes a single light-emitting unit.

Figure 3C:
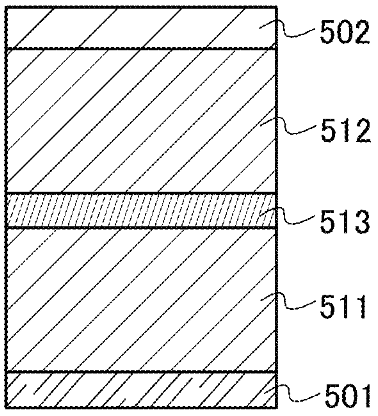

In FIG. 3C, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 3A, and the materials given in the description for FIG. 3A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when voltage is applied between the first electrode 501 and the second electrode 502. That is, in FIG. 3C, the charge-generation layer 513 injects electrons into the first light-emitting unit 511 and holes into the second light-emitting unit 512 when voltage is applied such that the potential of the anode becomes higher than the potential of the cathode.

The charge-generation layer 513 preferably has a structure similar to that of the charge-generation layer 116 described with reference to FIG. 3B. A composite material of an organic compound and a metal oxide enables low-voltage driving and low-current driving because of having an excellent carrier-injection property and an excellent carrier-transport property. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side; thus, an electron-injection layer is not necessarily formed in the light-emitting unit on the anode side.

The organic EL device having two light-emitting units is described with reference to FIG. 3C; however, one embodiment of the present invention can also be applied to an organic EL device in which three or more light-emitting units are stacked. With a plurality of light-emitting units partitioned by the charge-generation layer 513 between a pair of electrodes as in the organic EL device of this embodiment, it is possible to provide a long-life device that can emit light with high luminance at a low current density. A light-emitting apparatus that can be driven at a low voltage and has low power consumption can be provided.

When the emission colors of the light-emitting units are different, light emission of a desired color can be obtained from the organic EL device as a whole. For example, in an organic EL device having two light-emitting units, the emission colors of the first light-emitting unit may be red and green and the emission color of the second light-emitting unit may be blue, so that the organic EL device can emit white light as a whole.

The organic compound layer 103, the first light-emitting unit 511, the second light-emitting unit 512, the layers such as the charge-generation layer, and the electrodes that are described above can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the above components.

Figure 4:
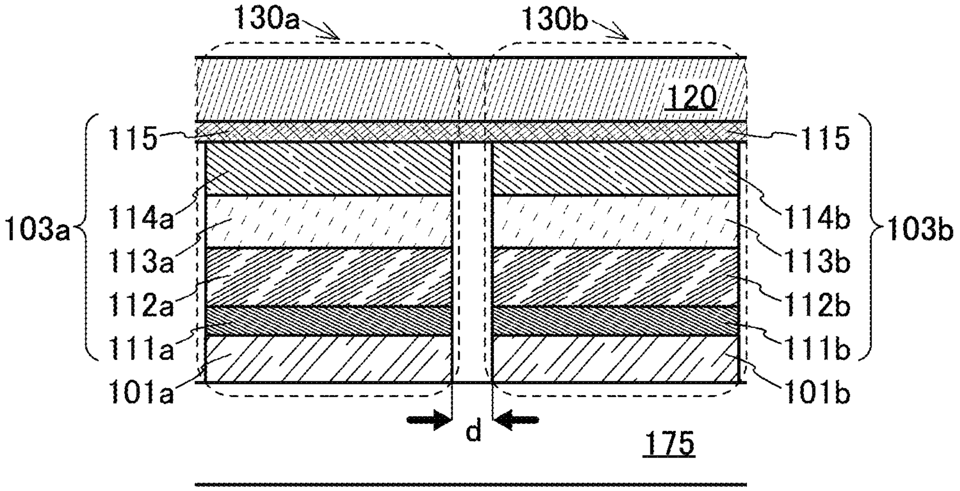
FIG. 4 illustrates light-emitting devices.

FIG. 4 illustrates two adjacent light-emitting devices (a light-emitting device 130*a* and a light-emitting device 130*b*) included in a display apparatus of one embodiment of the present invention.

The light-emitting device 130*a* includes an organic compound layer 103*a* between a first electrode 101*a* over an insulating layer 175 and the second electrode 102 facing the first electrode 101*a*. The illustrated organic compound layer 103*a* includes a hole-injection layer 111*a*, a hole-transport layer 112*a*, a light-emitting layer 113*a*, an electron-transport layer 114*a*, and the electron-injection layer 115, but may have a different stacked-layer structure.

The light-emitting device 130*b* includes an organic compound layer 103*b* between a first electrode 101*b* over the insulating layer 175 and the second electrode 102 facing the first electrode 101*b*. The illustrated organic compound layer 103*b* includes a hole-injection layer 111*b*, a hole-transport layer 112*b*, a light-emitting layer 113*b*, an electron-transport layer 114*b*, and the electron-injection layer 115, but may have a different stacked-layer structure.

Note that each of the electron-injection layer 115 and the second electrode 102 is preferably one continuous layer shared by the light-emitting device 130*a* and the light-emitting device 130*b*. The layers other than the electron-injection layer 115 included in the organic compound layer 103*a* and the organic compound layer 103*b* are independent layers because these layers are processed by a photolithography method after the electron-transport layer 114*a* is formed and after the electron-transport layer 114*b* is formed. Since processed by a photolithography method, the layers other than the electron-injection layer 115 in the organic compound layer 103*a* have end portions (contours) substantially aligned with each other in the direction perpendicular to the substrate. Furthermore, since processed by a photolithography method, the layers other than the electron-injection layer 115 in the organic compound layer 103*b* have end portions (contours) substantially aligned with each other in the direction perpendicular to the substrate. In this case, since a heating step of the photolithography method is performed after formation of the electron-transport layer 114*a* and the electron-transport layer 114*b*, the first compound is preferably contained in the electron-transport layer 114*a* and the electron-transport layer 114*b*.

Furthermore, since the organic compound layer is processed by a photolithography method, a distance d between the first electrode 101*a* and the first electrode 101*b* can be made smaller than a distance d when mask deposition is performed, and can be 2 μm to 5 μm inclusive.

Embodiment 3

In this embodiment, a mode in which the organic semiconductor device of one embodiment of the present invention is a light-emitting device that can be used as a display element of a display apparatus is described.

Figure 5A:
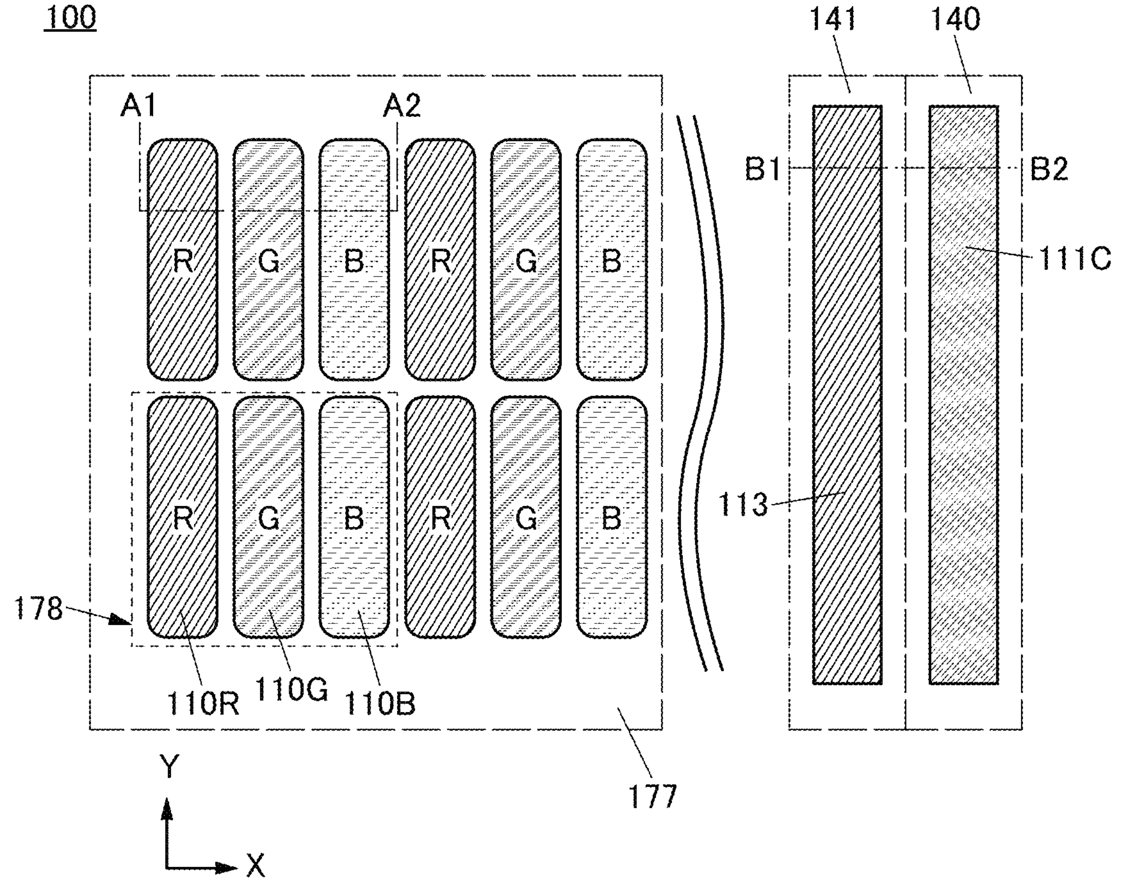
FIGS. 5A and 5B are a top view and a cross-sectional view of a light-emitting apparatus.
Figure 5B:
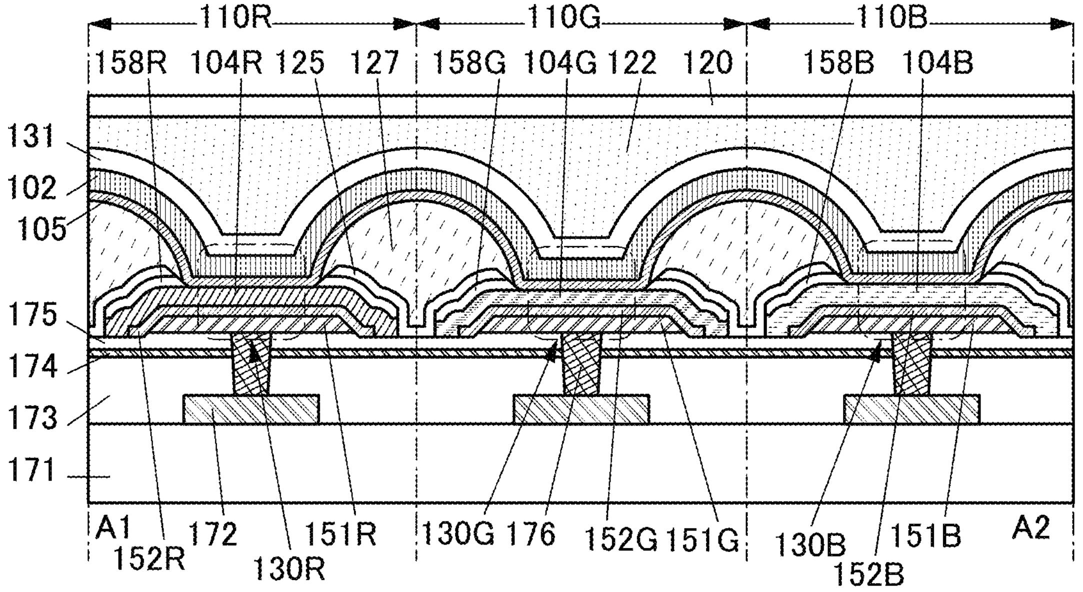

As illustrated in FIGS. 5A and 5B, a plurality of light-emitting devices 130 are formed over an insulating layer 175 to constitute a display apparatus 100.

The display apparatus 100 includes a pixel portion 177 in which a plurality of pixels 178 are arranged in matrix. The pixel 178 includes a subpixel 110R, a subpixel 110G, and a subpixel 110B.

In this specification and the like, for example, description common to the subpixels 110R, 110G, and 110B is sometimes made using the collective term "subpixel 110". As for other components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. Note that in this embodiment, three colors of red (R), green (G), and blue (B) are given as examples of colors of light emitted by the subpixels; however, subpixels of a different combination of colors may be employed. The number of subpixels is not limited to three, and may be four or more. Examples of four subpixels include subpixels emitting light of four colors of R, G, B, and white (W), subpixels emitting light of four colors of R, G, B, and yellow (Y), and four subpixels emitting light of R, G, and B and infrared light (IR).

In this specification and the like, the row direction and the column direction are sometimes referred to as the X direction and the Y direction, respectively. The X direction and the Y direction intersect with each other and are perpendicular to each other, for example.

FIG. 5A illustrates an example where subpixels of different colors are arranged in the X direction and subpixels of the same color are arranged in the Y direction. Note that subpixels of different colors may be arranged in the Y direction, and subpixels of the same color may be arranged in the X direction.

Outside the pixel portion 177, a connection portion 140 is provided and a region 141 may also be provided. The region 141 is positioned between the pixel portion 177 and the connection portion 140. A conductive layer 151C is provided in the connection portion 140.

Although FIG. 5A illustrates an example where the region 141 and the connection portion 140 are positioned on the right side of the pixel portion 177, the positions of the region 141 and the connection portion 140 are not particularly limited. The number of regions 141 and the number of connection portions 140 can each be one or more.

FIG. 5B is an example of a cross-sectional view along the dashed-dotted line A1-A2 in FIG. 5A. As illustrated in FIG. 5B, the display apparatus 100 includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is provided over a substrate (not illustrated). An opening reaching the conductive layer 172 is provided in the insulating layers 175, 174, and 173, and a plug 176 is provided to fill the opening.

In the pixel portion 177, the light-emitting device 130 is provided over the insulating layer 175 and the plug 176. A protective layer 131 is provided to cover the light-emitting device 130. A substrate 120 is bonded to the protective layer 131 with a resin layer 122. An inorganic insulating layer 125 and an insulating layer 127 over the inorganic insulating layer 125 are preferably provided between the adjacent light-emitting devices 130.

Although FIG. 5B illustrates a plurality of cross sections of the inorganic insulating layer 125 and the insulating layer 127, each of the inorganic insulating layer 125 and the insulating layer 127 is preferably one continuous layer when the display apparatus 100 is seen from above. That is, the insulating layer 127 preferably includes opening portions over the first electrodes.

In FIG. 5B, a light-emitting device 130R, a light-emitting device 130G, and a light-emitting device 130B are shown as the light-emitting devices 130. The light-emitting devices 130R, 130G, and 130B emit light of the respective colors. For example, the light-emitting device 130R can emit red light, the light-emitting device 130G can emit green light, and the light-emitting device 130B can emit blue light. Alternatively, the light-emitting device 130R, 130G, or 130B may emit visible light of another color or infrared light.

The display apparatus of one embodiment of the present invention can be, for example, a top-emission display apparatus where light is emitted in the direction opposite to a substrate over which light-emitting devices are formed. Note that the display apparatus of one embodiment of the present invention may be of a bottom emission type.

The light-emitting device 130R has a structure as described in Embodiment 1 or 2. The light-emitting device 130R includes a first electrode (pixel electrode) including a conductive layer 151R and a conductive layer 152R, a first layer 104R over the first electrode, an organic compound layer (a second layer 105 over the first layer 104R), and the second electrode (common electrode) 102 over the second layer 105. The second layer 105 is preferably positioned closer to the second electrode (common electrode) side than the light-emitting layer is, and is preferably a hole-blocking layer, an electron-transport layer, or an electron-injection layer. With such a structure, damage to the light-emitting layer or the active layer in a photolithography process can be reduced, which will contribute to favorable film quality and electrical characteristics.

The light-emitting device 130G has a structure as described in Embodiment 1 or 2. The light-emitting device 130G includes a first electrode (pixel electrode) including a conductive layer 151G and a conductive layer 152G, a first layer 104G over the first electrode, the second layer 105 over the first layer 104G, and the second electrode (common electrode) 102 over the second layer 105. The second layer 105 is preferably an electron-injection layer.

The light-emitting device 130B has a structure as described in Embodiment 1 or 2. The light-emitting device 130B includes a first electrode (pixel electrode) including a conductive layer 151B and a conductive layer 152B, a first layer 104B over the first electrode, the second layer 105 over the first layer 104B, and the second electrode (common electrode) 102 over the second layer 105. The second layer 105 is preferably an electron-injection layer.

In the light-emitting device, one of the pixel electrode (first electrode) and the common electrode (second electrode) functions as an anode and the other functions as a cathode. In this embodiment, description is made on the assumption that the pixel electrode functions as the anode and the common electrode functions as the cathode unless otherwise specified.

The first layer 104R, the first layer 104G, and the first layer 104B are island-shaped layers that are independent of each other; alternatively, a first layer of the light-emitting devices of one emission color may be independent of a first layer of the light-emitting devices of another emission color. It is preferable that the first layer 104R, the first layer 104G, and the first layer 104B not overlap with one another. Providing the island-shaped first layer 104 in each of the light-emitting devices 130 can suppress leakage current between the adjacent light-emitting devices 130 even in a high-resolution display apparatus. This can prevent cross-talk, so that a display apparatus with extremely high contrast can be obtained. Specifically, a display apparatus having high current efficiency at low luminance can be obtained.

The island-shaped first layer 104 is formed by forming an EL film and processing the EL film by a photolithography method.

The first layer 104 is preferably provided to cover the top surface and the side surface of the first electrode (pixel electrode) of the light-emitting device 130. In this case, the aperture ratio of the display apparatus 100 can be easily increased as compared to the structure where an end portion of the first layer 104 is positioned inward from an end portion of the pixel electrode. Covering the side surface of the pixel electrode of the light-emitting device 130 with the first layer 104 can inhibit the pixel electrode from being in contact with the second electrode 102; hence, a short circuit of the light-emitting device 130 can be inhibited.

In the display apparatus of one embodiment of the present invention, the first electrode (pixel electrode) of the light-emitting device preferably has a stacked-layer structure. For example, in the example illustrated in FIG. 5B, the first electrode of the light-emitting device 130 has a stacked-layer structure including the conductive layer 151 provided on the insulating layer 171 side and the conductive layer 152 provided on the organic compound layer side.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, indium tin oxide containing silicon can be suitably used for the conductive layer 152 because of having a work function of higher than or equal to 4.0 eV, for example.

The conductive layer 151 and the conductive layer 152 may each be a stack of a plurality of layers containing different materials. In that case, the conductive layer 151 may include a layer formed using a material that can be used for the conductive layer 152, such as a conductive oxide, and the conductive layer 152 may include a layer formed using a material that can be used for the conductive layer 151, such as a metal material. In the case where the conductive layer 151 is a stack of two or more layers, for example, a layer in contact with the conductive layer 152 can be formed using a material that can be used for the conductive layer 152.

The conductive layer 151 preferably has an end portion with a tapered shape. Specifically, the end portion of the conductive layer 151 preferably has a tapered shape with a taper angle of less than 90°. In that case, the conductive layer 152 provided along the side surface of the conductive layer 151 also has a tapered shape. When the side surface of the conductive layer 152 has a tapered shape, coverage with the first layer 104 provided along the side surface of the conductive layer 152 can be improved.

Next, an exemplary method for manufacturing the display apparatus 100 having the structure illustrated in FIG. 5A is described with reference to FIGS. 6A to 11C.

Manufacturing Method Example 1

Thin films included in the display apparatus (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like.

Thin films included in the display apparatus (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Thin films included in the display apparatus can be processed by a photolithography method, for example.

As light used for exposure in the photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet rays, KrF laser light, ArF laser light, or the like can be used. Exposure may be performed by liquid immersion exposure technique. As the light for exposure, extreme ultraviolet (EUV) light or X-rays may also be used. Furthermore, instead of the light used for exposure, an electron beam can be used.

For etching of thin films, a dry etching method, a wet etching method, a sandblast method, or the like can be used.

Figure 6A:
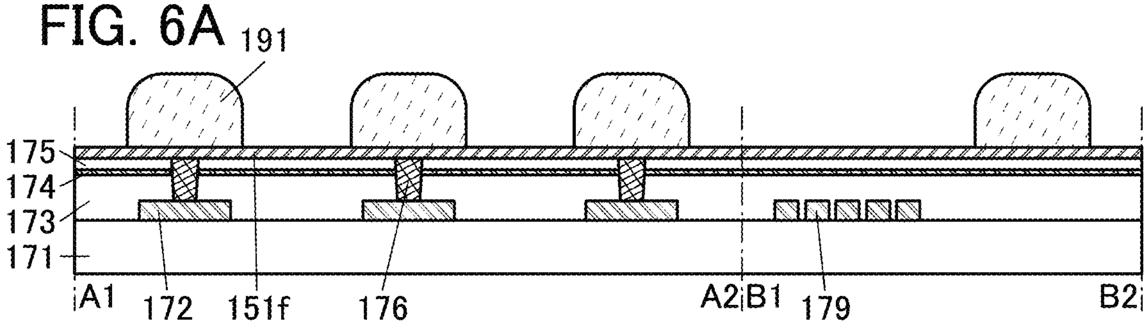
FIGS. 6A to 6E are cross-sectional views illustrating an example of a method for manufacturing a display apparatus.

First, as illustrated in FIG. 6A, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. For example, it is possible to use a glass substrate; a quartz substrate; a sapphire substrate; a ceramic substrate; an organic resin substrate; or a semiconductor substrate such as a single crystal semiconductor substrate or a polycrystalline semiconductor substrate of silicon, silicon carbide, or the like, a compound semiconductor substrate of silicon germanium or the like, or an SOI substrate.

Next, as illustrated in FIG. 6A, openings reaching the conductive layer 172 are formed in the insulating layers 175, 174, and 173. Then, the plugs 176 are formed to fill the openings.

Next, as illustrated in FIG. 6A, a conductive film **151*f* to be the conductive layers 151R, 151G, 151B, and 151C is formed over the plugs 176 and the insulating layer 175. A metal material can be used for the conductive film 151*f***, for example.

Then, as illustrated in FIG. 6A, a resist mask 191 is formed over the conductive film **151*f*. The resist mask 191** can be formed by application of a photosensitive material (photoresist), light exposure, and development.

Figure 6B:
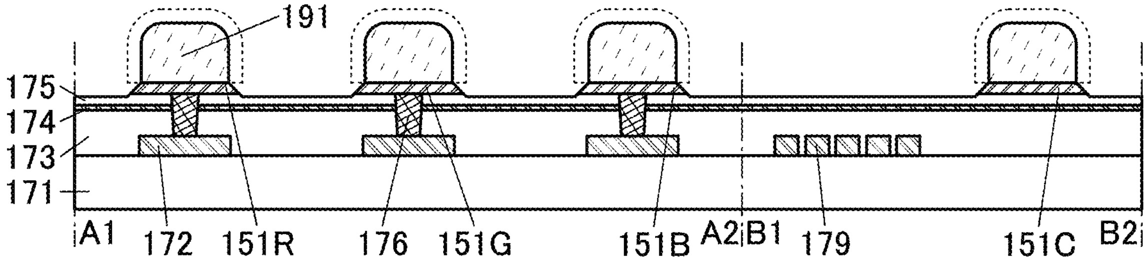

Subsequently, as illustrated in FIG. 6B, the conductive film **151*f* in a region not overlapping with the resist mask 191 is removed, for example. In this manner, the conductive layer 151** is formed.

Figure 6C:
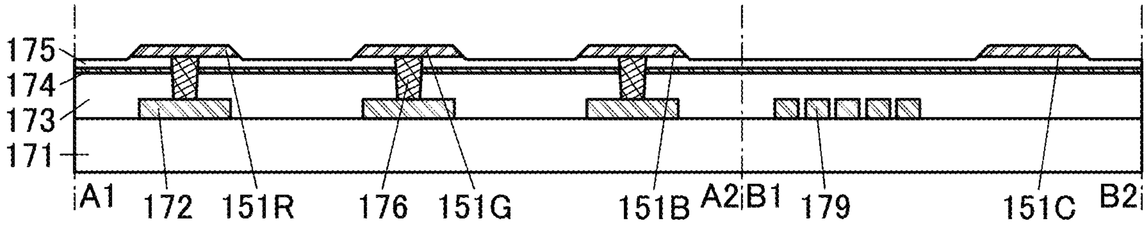

Next, the resist mask 191 is removed as illustrated in FIG. 6C. The resist mask 191 can be removed by ashing using oxygen plasma, for example.

Figure 6D:
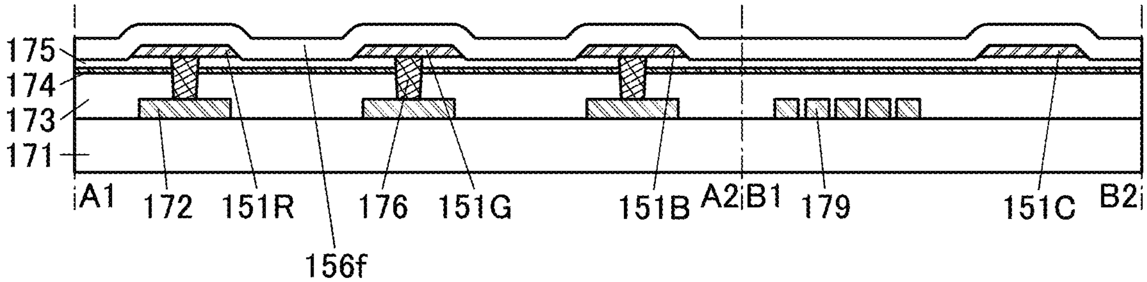

Then, as illustrated in FIG. 6D, an insulating film **156*f* to be an insulating layer 156R, an insulating layer 156G, an insulating layer 156B, and an insulating layer 156C is formed over the conductive layer 151R, the conductive layer 151G, the conductive layer 151B, the conductive layer 151C, and the insulating layer 175**.

As the insulating film **156*f***, an inorganic insulating film such as an oxide insulating film, a nitride insulating film, an oxynitride insulating film, or a nitride oxide insulating film can be used. For example, silicon oxynitride can be used.

Figure 6E:
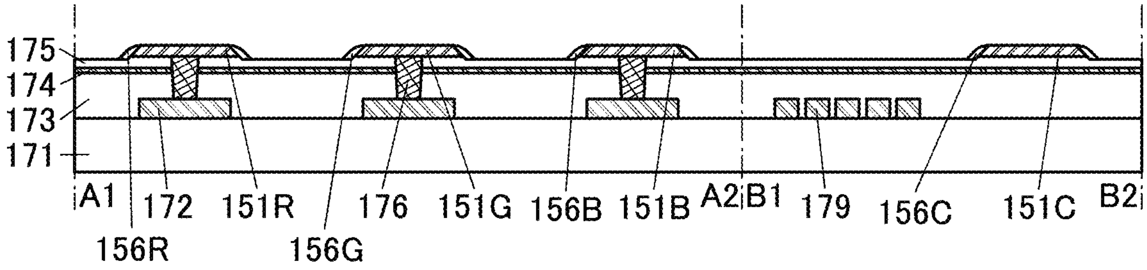

Subsequently, as illustrated in FIG. 6E, the insulating film **156*f* is processed to form the insulating layers 156R, 156G, 156B, and 156**C.

Figure 7A:
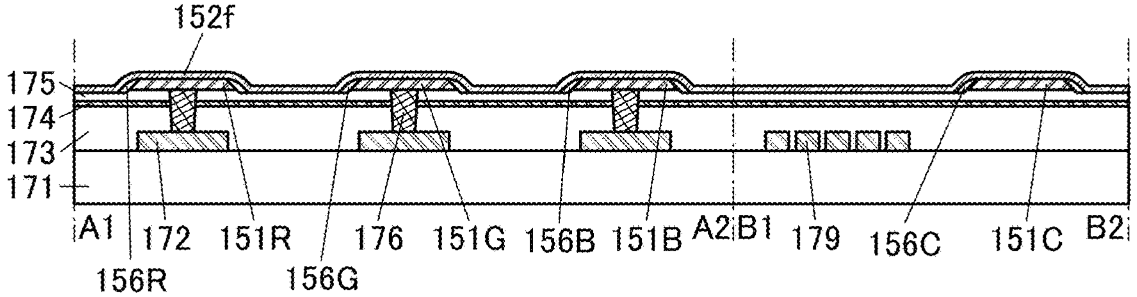
FIGS. 7A to 7D are cross-sectional views illustrating the example of the method for manufacturing a display apparatus.

Next, as illustrated in FIG. 7A, a conductive film **152*f* is formed over the conductive layers 151R, 151G, 151B, and 151C and the insulating layers 156R, 156G, 156B, 156C, and 175**.

A conductive oxide can be used for the conductive film **152*f*, for example. The conductive film 152*f*** may have a stacked-layer structure.

Figure 7B:
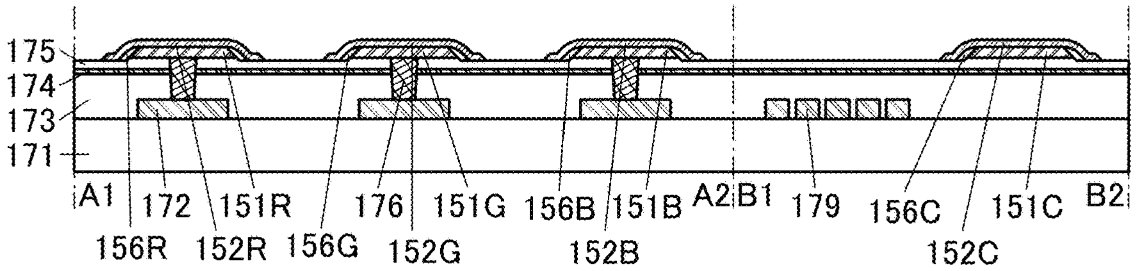

Then, as illustrated in FIG. 7B, the conductive film **152*f* is processed, so that the conductive layers 152R, 152G, 152B, and 152**C are formed.

Figure 7C:
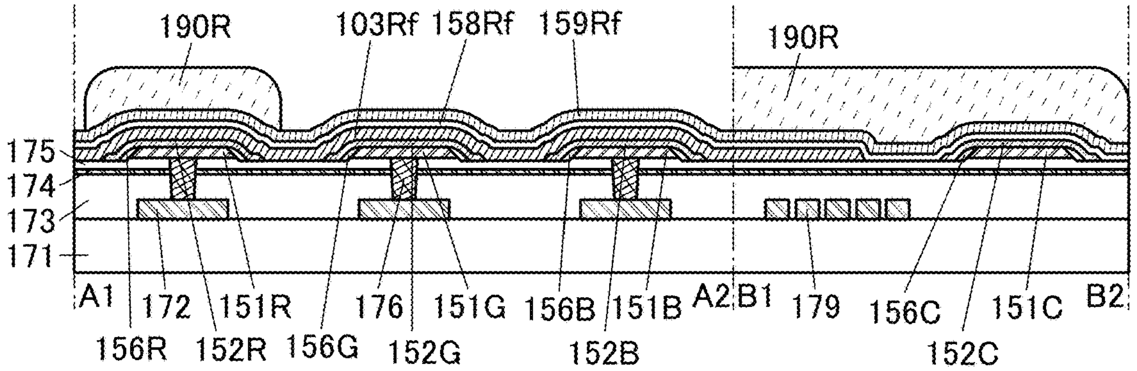

Next, as illustrated in FIG. 7C, an organic compound film 103Rf is formed over the conductive layers 152R, 152G, and 152B and the insulating layer 175. As illustrated in FIG. 7C, the organic compound film 103Rf is not formed over the conductive layer 152C.

Then, as illustrated in FIG. 7C, a sacrificial film 158Rf and a mask film 159Rf are formed.

Providing the sacrificial film 158Rf over the organic compound film 103Rf can reduce damage to the organic compound film 103Rf in the manufacturing process of the display apparatus, resulting in an increase in the reliability of the light-emitting device.

As the sacrificial film 158Rf, a film that is highly resistant to the process conditions for the organic compound film 103Rf, specifically, a film having high etching selectivity with respect to the organic compound film 103Rf is used.

For the mask film 159Rf, a film having high etching selectivity with respect to the sacrificial film 158Rf is used.

The sacrificial film 158Rf and the mask film 159Rf are formed at a temperature lower than the upper temperature limit of the organic compound film 103Rf. The typical substrate temperatures in formation of the sacrificial film 158Rf and the mask film 159Rf are each higher than or equal to 100° C. and lower than or equal to 200° C., preferably higher than or equal to 100° C. and lower than or equal to 150° C., further preferably higher than or equal to 100° C. and lower than or equal to 120° C. Since the light-emitting device of one embodiment of the present invention contains the first compound, a display apparatus with favorable display quality can be manufactured even through a heating step performed at higher temperatures.

The sacrificial film 158Rf and the mask film 159Rf are preferably films that can be removed by a wet etching method or a dry etching method.

Note that the sacrificial film 158Rf that is formed over and in contact with the organic compound film 103Rf is preferably formed by a formation method that is less likely to damage the organic compound film 103Rf than a formation method of the mask film 159Rf. For example, the sacrificial film 158Rf is preferably formed by an ALD method or a vacuum evaporation method rather than a sputtering method.

As each of the sacrificial film 158Rf and the mask film 159Rf, one or more of a metal film, an alloy film, a metal oxide film, a semiconductor film, an organic insulating film, and an inorganic insulating film, for example, can be used.

For each of the sacrificial film 158Rf and the mask film 159Rf, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used, for example. It is particularly preferable to use a low-melting-point material such as aluminum or silver. It is preferable to use a metal material that can block ultraviolet rays for one or both of the sacrificial film 158Rf and the mask film 159Rf, in which case the organic compound film 103Rf can be inhibited from being irradiated with ultraviolet rays in light exposure of a pattern and deterioration of the organic compound film 103Rf can be suppressed.

The sacrificial film 158Rf and the mask film 159Rf can each be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In the above metal oxide, in place of gallium, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

The sacrificial film 158Rf and the mask film 159Rf are preferably formed using a semiconductor material such as silicon or germanium for excellent compatibility with a semiconductor manufacturing process. Alternatively, a compound containing the above semiconductor material can be used.

As each of the sacrificial film 158Rf and the mask film 159Rf, any of a variety of inorganic insulating films can be used. In particular, an oxide insulating film is preferable because its adhesion to the organic compound film 103Rf is higher than that of a nitride insulating film.

Subsequently, a resist mask 190R is formed as illustrated in FIG. 7C. The resist mask 190R can be formed by application of a photosensitive material (photoresist), light exposure, and development.

The resist mask 190R is provided at a position overlapping with the conductive layer 152R. The resist mask 190R is preferably provided also at a position overlapping with the conductive layer 152C. This can inhibit the conductive layer 152C from being damaged during the process of manufacturing the display apparatus.

Figure 7D:
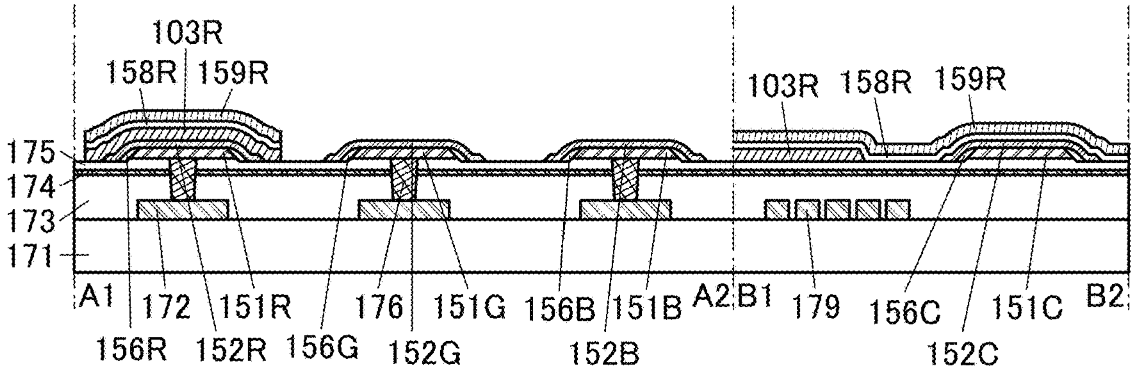

Next, as illustrated in FIG. 7D, part of the mask film 159Rf is removed using the resist mask 190R, so that the mask layer 159R is formed. The mask layer 159R remains over the conductive layers 152R and 152C. After that, the resist mask 190R is removed. Then, part of the sacrificial film 158Rf is removed using the mask layer 159R as a mask (also referred to as a hard mask), so that the sacrificial layer 158R is formed.

The use of a wet etching method can reduce damage to the organic compound film 103Rf in processing of the sacrificial film 158Rf and the mask film 159Rf, as compared to the case of using a dry etching method. In the case of using a wet etching method, it is preferable to use a developer, an alkaline aqueous solution such as a tetramethylammonium hydroxide (TMAH) aqueous solution, or an acid aqueous solution of dilute hydrofluoric acid, oxalic acid, phosphoric acid, acetic acid, nitric acid, or a chemical solution containing a mixed solution of any of these acids, for example.

In the case of using a dry etching method to process the sacrificial film 158Rf, deterioration of the organic compound film 103Rf can be suppressed by not using a gas containing oxygen as the etching gas.

The resist mask 190R can be removed by a method similar to that for the resist mask 191.

Next, as illustrated in FIG. 7D, the organic compound film 103Rf is processed to form the organic compound layer 103R. For example, part of the organic compound film 103Rf is removed using the mask layer 159R and the sacrificial layer 158R as a hard mask, whereby the organic compound layer 103R is formed.

Accordingly, as illustrated in FIG. 7D, the stacked-layer structure of the organic compound layer 103R, the sacrificial layer 158R, and the mask layer 159R remains over the conductive layer 152R. The conductive layers 152G and 152B are exposed.

The organic compound film 103Rf is preferably processed by anisotropic etching. Anisotropic dry etching is particularly preferable. Alternatively, wet etching may be used.

In the case of using a dry etching method, deterioration of the organic compound film 103Rf can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Accordingly, damage to the organic compound film 103Rf can be reduced. Furthermore, a defect such as attachment of a reaction product generated during the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a Group 18 element such as He and Ar as the etching gas, for example. Alternatively, a gas containing oxygen and at least one of the above is preferably used as the etching gas. Alternatively, an oxygen gas may be used as the etching gas.

Figure 8A:
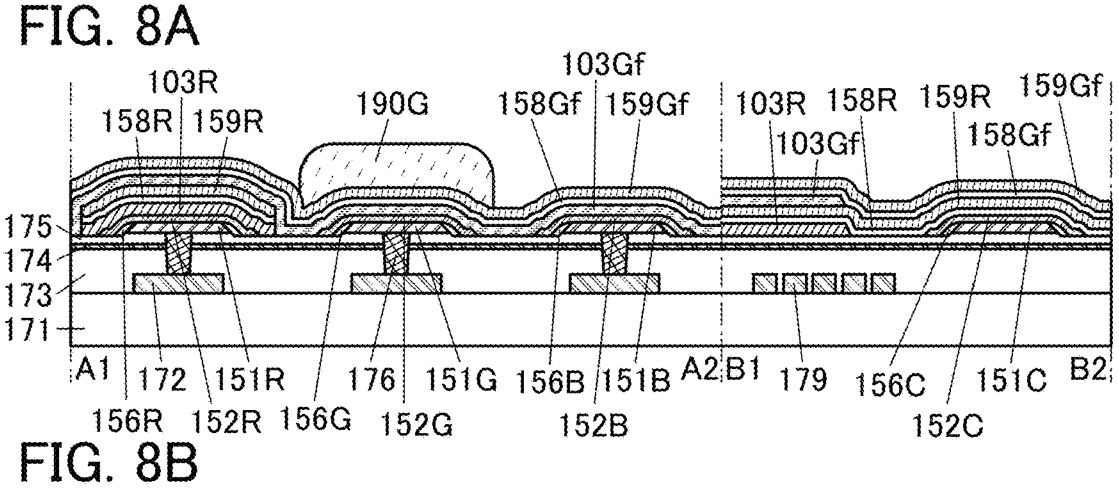
FIGS. 8A to 8D are cross-sectional views illustrating the example of the method for manufacturing a display apparatus.

Then, as illustrated in FIG. 8A, an organic compound film 103Gf to be the organic compound layer 103G is formed.

The organic compound film 103Gf can be formed by a method similar to that for forming the organic compound film 103Rf. The organic compound film 103Gf can have a structure similar to that of the organic compound film 103Rf.

Subsequently, as illustrated in FIG. 8A, a sacrificial film 158Gf and a mask film 159Gf are formed in this order. A resist mask 190G is then formed. The materials and the formation methods of the sacrificial film 158Gf and the mask film 159Gf are similar to those of the sacrificial film 158Rf and the mask film 159Rf. The material and the formation method of the resist mask 190G are similar to those of the resist mask 190R.

The resist mask 190G is provided at a position overlapping with the conductive layer 152G.

Figure 8B:
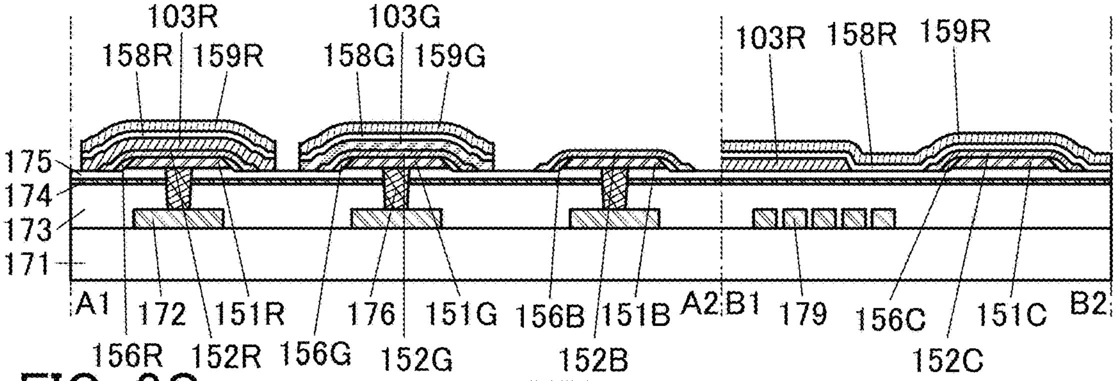

Subsequently, as illustrated in FIG. 8B, part of the mask film 159Gf is removed using the resist mask 190G, so that a mask layer 159G is formed. The mask layer 159G remains over the conductive layer 152G. After that, the resist mask 190G is removed. Then, part of the sacrificial film 158Gf is removed using the mask layer 159G as a mask, so that the sacrificial layer 158G is formed. Next, the organic compound film 103Gf is processed to form the organic compound layer 103G.

Figure 8C:
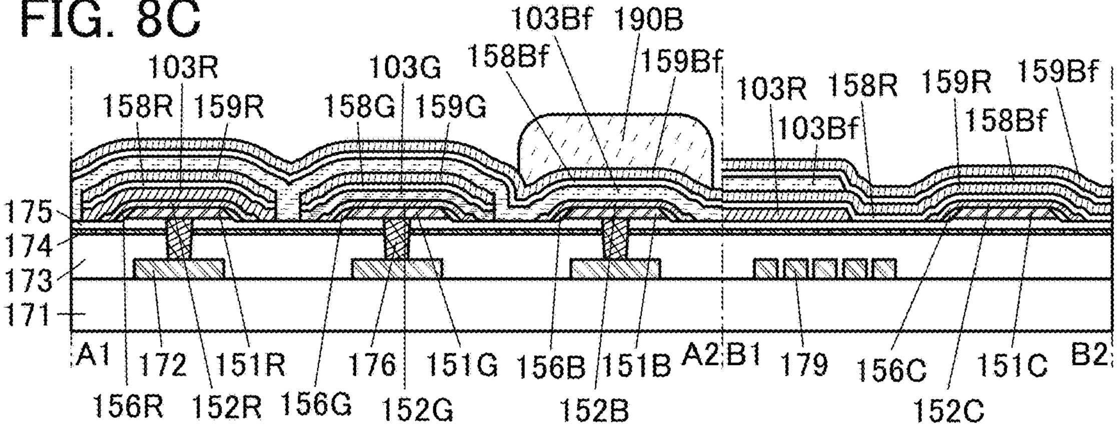

Then, an organic compound film 103Bf is formed as illustrated in FIG. 8C.

The organic compound film 103Bf can be formed by a method similar to that for forming the organic compound film 103Rf. The organic compound film 103Bf can have a structure similar to that of the organic compound film 103Rf.

Subsequently, a sacrificial film 158Bf and a mask film 159Bf are formed in this order as illustrated in FIG. 8C. A resist mask 190B is then formed. The materials and the formation methods of the sacrificial film 158Bf and the mask film 159Bf are similar to those of the sacrificial film 158Rf and the mask film 159Rf. The material and the formation method of the resist mask 190B are similar to those of the resist mask 190R.

The resist mask 190B is provided at a position overlapping with the conductive layer 152B.

Figure 8D:
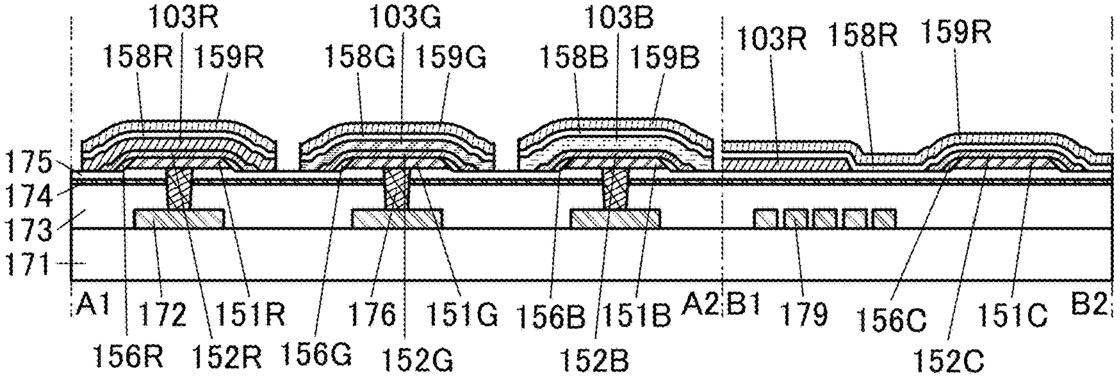

Subsequently, as illustrated in FIG. 8D, part of the mask film 159Bf is removed using the resist mask 190B, so that a mask layer 159B is formed. The mask layer 159B remains over the conductive layer 152B. After that, the resist mask 190B is removed. Then, part of the sacrificial film 158Bf is removed using the mask layer 159B as a mask, so that the sacrificial layer 158B is formed. Next, the organic compound film 103Bf is processed to form the organic compound layer 103B. For example, part of the organic compound film 103Bf is removed using the mask layer 159B and the sacrificial layer 158B as a hard mask to form the organic compound layer 103B.

Accordingly, as illustrated in FIG. 8D, the stacked-layer structure of the organic compound layer 103B, the sacrificial layer 158B, and the mask layer 159B remains over the conductive layer 152B. The mask layers 159R and 159G are exposed.

Note that the side surfaces of the organic compound layers 103R, 103G, and 103B are preferably perpendicular or substantially perpendicular to their formation surfaces. For example, the angle between the formation surfaces and these side surfaces is preferably greater than or equal to 600 and less than or equal to 90°.

The distance between two adjacent layers among the organic compound layers 103R, 103G, and 103B, which are formed by a photolithography method as described above, can be reduced to less than or equal to 8 μm, less than or equal to 5 μm, less than or equal to 3 μm, less than or equal to 2 μm, or less than or equal to 1 μm. Here, the distance can be specified, for example, by the distance between opposite end portions of two adjacent layers among the organic compound layers 103R, 103G, and 103B. Reducing the distance between the island-shaped organic compound layers makes it possible to provide a display apparatus having high resolution and a high aperture ratio. In addition, the distance between the first electrodes of adjacent light-emitting devices can also be shortened to be, for example, less than or equal to 10 μm, less than or equal to 8 μm, less than or equal to 5 μm, less than or equal to 3 μm, or less than or equal to 2 μm. Note that the distance between the first electrodes of adjacent light-emitting devices is preferably greater than or equal to 2 μm and less than or equal to 5 μm.

Figure 9A:
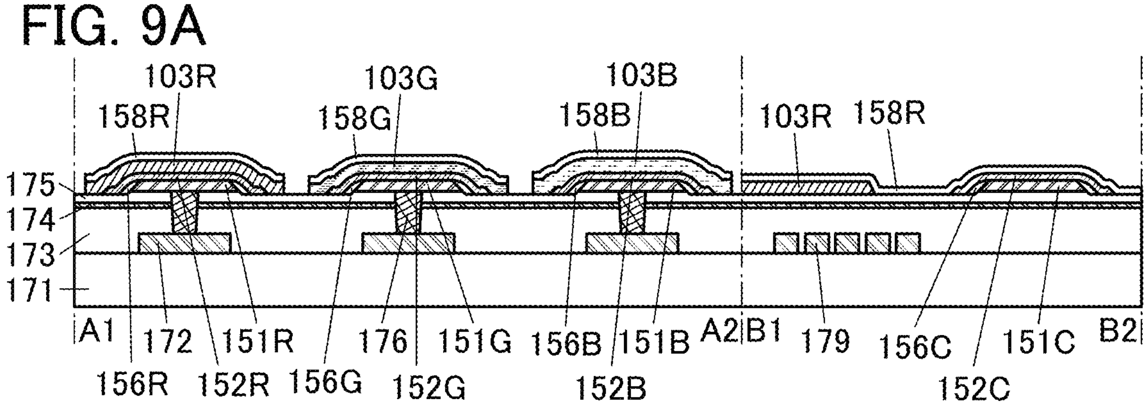
FIGS. 9A to 9C are cross-sectional views illustrating the example of the method for manufacturing a display apparatus.

Next, as illustrated in FIG. 9A, the mask layers 159R, 159G, and 159B are preferably removed.

The step of removing the mask layers can be performed by a method similar to that for the step of processing the mask layers. Specifically, by using a wet etching method, damage caused to the organic compound layer 103 at the time of removing the mask layers can be reduced as compared to the case of using a dry etching method.

The mask layers may be removed by being dissolved in a polar solvent such as water or an alcohol. Examples of an alcohol include ethyl alcohol, methyl alcohol, isopropyl alcohol (IPA), and glycerin.

After the mask layers are removed, drying treatment may be performed in order to remove water adsorbed on surfaces. For example, heat treatment in an inert gas atmosphere or a reduced-pressure atmosphere can be performed. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 9B:
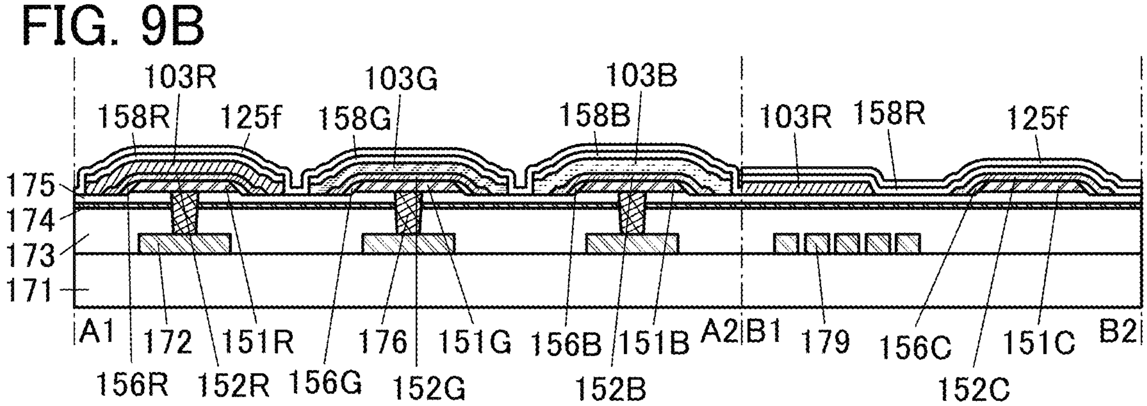

Next, an inorganic insulating film **125*f* is formed as illustrated in FIG. 9**B.

Figure 9C:
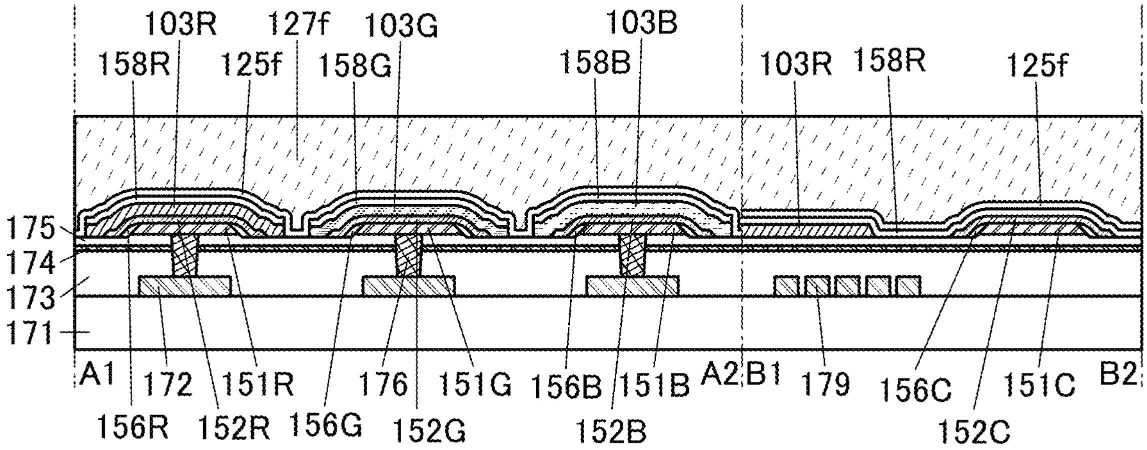

Then, as illustrated in FIG. 9C, an insulating film **127*f* to be the insulating layer 127 is formed over the inorganic insulating film 125*f***.

The substrate temperature at the time of forming the inorganic insulating film **125*f* and the insulating film 127*f*** is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film **125*f***, an insulating film having a thickness of greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed at a substrate temperature in the above-described range.

The inorganic insulating film **125*f* is preferably formed by an ALD method, for example. An ALD method is preferably used, in which case deposition damage can be reduced and a film with good coverage can be formed. As the inorganic insulating film 125***f*, an aluminum oxide film is preferably formed by an ALD method, for example.

The insulating film 127*f* is preferably formed by the aforementioned wet process. The insulating film 127*f* is preferably formed by spin coating using a photosensitive material, for example, and specifically preferably formed using a photosensitive resin composition containing an acrylic resin.

Then, part of the insulating film 127*f* is exposed to visible light or ultraviolet rays. The insulating layer 127 is formed in regions that are sandwiched between any two of the conductive layers 152R, 152G, and 152B and around the conductive layer 152C.

The width of the insulating layer 127 formed later can be controlled in accordance with the exposed region of the insulating film 127*f*. In this embodiment, processing is performed such that the insulating layer 127 includes a portion overlapping with the top surface of the conductive layer 151.

Light used for the exposure preferably includes the i-line (wavelength: 365 nm). Furthermore, light used for the exposure may include at least one of the g-line (wavelength: 436 nm) and the h-line (wavelength: 405 nm).

Figure 10A:
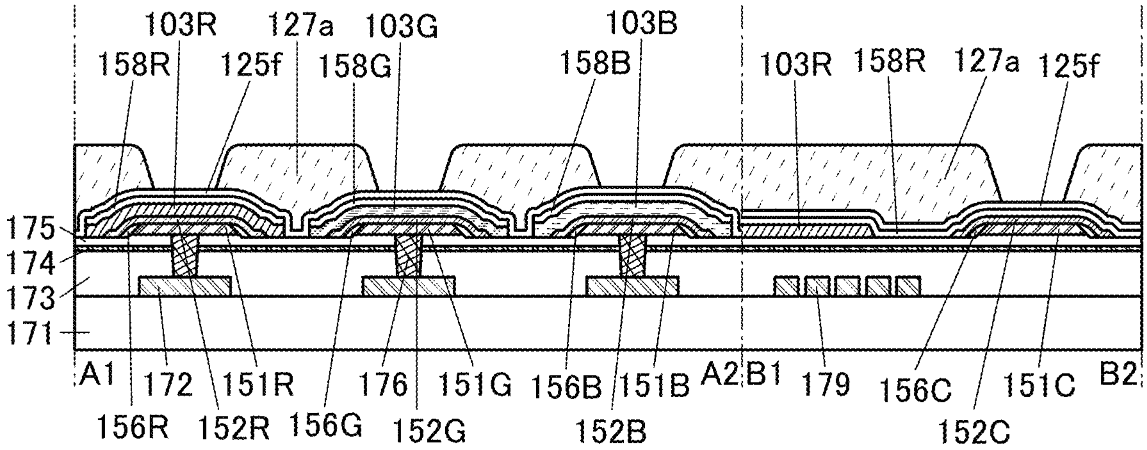
FIGS. 10A to 10C are cross-sectional views illustrating the example of the method for manufacturing a display apparatus.

Next, the region of the insulating film 127*f* exposed to light is removed by development as illustrated in FIG. 10A, so that an insulating layer 127*a* is formed.

Figure 10B:
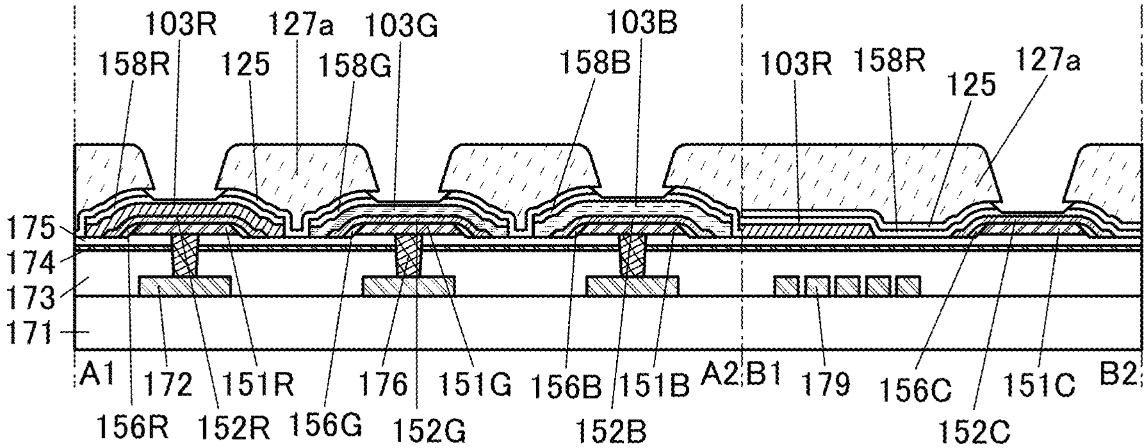

Next, as illustrated in FIG. 10B, etching treatment is performed with the insulating layer 127*a* as a mask to remove part of the inorganic insulating film 125*f* and reduce the thickness of part of the sacrificial layers 158R, 158G, and 158B. Thus, the inorganic insulating layer 125 is formed under the insulating layer 127*a*. Moreover, the surfaces of the thin portions in the sacrificial layers 158R, 158G, and 158B are exposed. Note that the etching treatment using the insulating layer 127*a* as a mask may be hereinafter referred to as first etching treatment.

The first etching treatment can be performed by dry etching or wet etching. Note that the inorganic insulating film 125*f* is preferably formed using a material similar to that of the sacrificial layers 158R, 158G, and 158B, in which case the first etching treatment can be performed concurrently.

In the case of performing dry etching, a chlorine-based gas is preferably used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158R, 158G, and 158B can be formed with favorable in-plane uniformity.

As a dry etching apparatus, a dry etching apparatus including a high-density plasma source can be used. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used.

The first etching treatment is preferably performed by wet etching. The use of a wet etching method can reduce damage to the organic compound layers 103R, 103G, and 103B, as compared to the case of using a dry etching method. For example, the wet etching can be performed using an alkaline solution. For instance, TMAH, which is an alkaline solution, can be used for the wet etching of an aluminum oxide film. Alternatively, an acid solution containing fluoride can also be used. In this case, puddle wet etching can be performed.

Note that the inorganic insulating film 125*f* is preferably formed using a material similar to that of the sacrificial layers 158R, 158G, and 158B, in which case the above etching treatment can be performed concurrently.

The sacrificial layers 158R, 158G, and 158B are not removed completely by the first etching treatment, and the etching treatment is stopped when the thickness of the sacrificial layers 158R, 158G, and 158B is reduced. The corresponding sacrificial layers 158R, 158G, and 158B remain over the organic compound layers 103R, 103G, and 103B in this manner, whereby the organic compound layers 103R, 103G, and 103B can be prevented from being damaged by treatment in a later step.

Next, light exposure is preferably performed on the entire substrate so that the insulating layer 127*a* is irradiated with visible light or ultraviolet rays. The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after the development can sometimes increase the degree of transparency of the insulating layer 127*a*. In addition, it is sometimes possible to lower the substrate temperature required for subsequent heat treatment for changing the shape of the insulating layer 127*a* into a tapered shape.

Here, when a barrier insulating layer against oxygen (e.g., an aluminum oxide film) exists as each of the sacrificial layers 158R, 158G, and 158B, diffusion of oxygen to the organic compound layers 103R, 103G, and 103B can be suppressed.

Figure 10C:
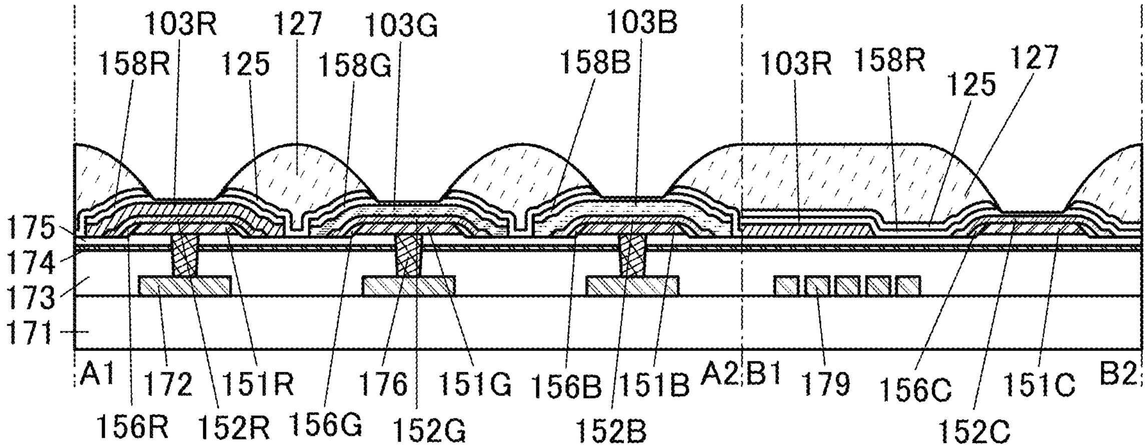

Then, heat treatment (also referred to as post-baking) is performed. The heat treatment can change the insulating layer 127*a* into the insulating layer 127 having a tapered side surface (FIG. 10C). The heat treatment is conducted at a temperature lower than the upper temperature limit of the organic compound layer. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. Accordingly, adhesion between the insulating layer 127 and the inorganic insulating layer 125 can be improved, and corrosion resistance of the insulating layer 127 can be increased.

When the sacrificial layers 158R, 158G, and 158B are not completely removed by the first etching treatment and the thinned sacrificial layers 158R, 158G, and 158B are left, the organic compound layers 103R, 103G, and 103B can be prevented from being damaged and deteriorating in the heat treatment. This increases the reliability of the light-emitting device.

Figure 11A:
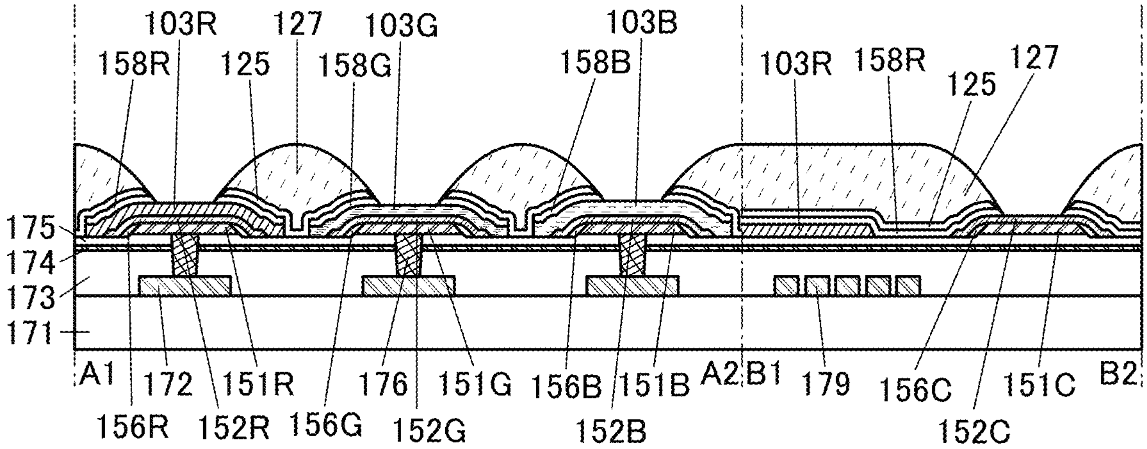
FIGS. 11A to 11C are cross-sectional views illustrating the example of the method for manufacturing a display apparatus.

Next, as illustrated in FIG. 11A, etching treatment is performed with the insulating layer 127 as a mask to remove part of the sacrificial layers 158R, 158G, and 158B. Thus, openings are formed in the sacrificial layers 158R, 158G, and 158B, and the top surfaces of the organic compound layers 103R, 103G, and 103B and the conductive layer 152C are exposed. Note that this etching treatment may be hereinafter referred to as second etching treatment.

An end portion of the inorganic insulating layer 125 is covered with the insulating layer 127. FIG. 11A illustrates an example in which part of an end portion of the sacrificial layer 158G (specifically, a tapered portion formed by the first etching treatment) is covered with the insulating layer 127 and a tapered portion formed by the second etching treatment is exposed.

The second etching treatment is performed by wet etching. The use of a wet etching method can reduce damage to the organic compound layers 103R, 103G, and 103B, as compared to the case of using a dry etching method. Wet etching can be performed using an alkaline solution or an acid solution, for example. An aqueous solution is preferable in order that the organic compound layer 103 is not dissolved.

Figure 11B:
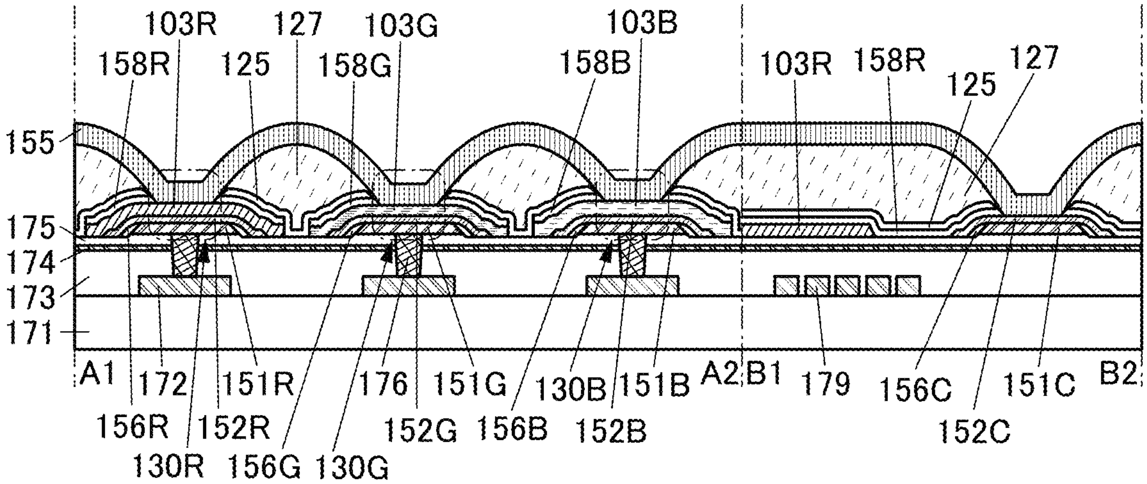

Next, as illustrated in FIG. 11B, a common electrode 155 is formed over the organic compound layers 103R, 103G, and 103B, the conductive layer 152C, and the insulating layer 127. The common electrode 155 can be formed by a sputtering method, a vacuum evaporation method, or the like.

Figure 11C:
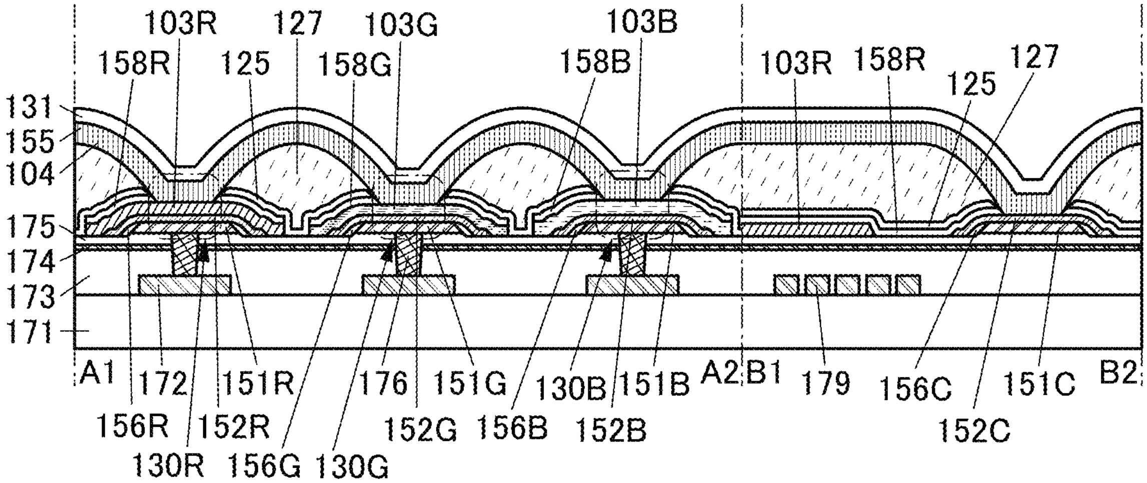

Next, as illustrated in FIG. 11C, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, so that the display apparatus can be manufactured. In the method for manufacturing the display apparatus of one embodiment of the present invention, the insulating layer 156 is formed to include a region overlapping with the side surface of the conductive layer 151 and the conductive layer 152 is formed to cover the conductive layer 151 and the insulating layer 156 as described above. This can increase the yield of the display apparatus and inhibit generation of defects.

As described above, in the method for manufacturing the display apparatus of one embodiment of the present invention, the island-shaped organic compound layers 103R, 103G, and 103B are formed not by using a fine metal mask but by processing a film formed on the entire surface; thus, the island-shaped layers can be formed to have a uniform thickness. Consequently, a high-resolution display apparatus or a display apparatus with a high aperture ratio can be obtained. Furthermore, even when the resolution or the aperture ratio is high and the distance between the subpixels is extremely short, the organic compound layers 103R, 103G, and 103B can be inhibited from being in contact with each other in the adjacent subpixels. As a result, generation of leakage current between the subpixels can be inhibited. This can prevent crosstalk, so that a display apparatus with extremely high contrast can be obtained. Moreover, even a display apparatus that includes tandem light-emitting devices formed by a photolithography method can have favorable characteristics.

Embodiment 4

In this embodiment, a display apparatus of one embodiment of the present invention will be described.

The display apparatus in this embodiment can be a high-resolution display apparatus. Thus, the display apparatus in this embodiment can be used for display portions of information terminals (wearable devices) such as watch-type and bracelet-type information terminals and display portions of wearable devices capable of being worn on a head, such as a VR device like a head mounted display (TIMID) and a glasses-type AR device.

The display apparatus in this embodiment can be a high-definition display apparatus or a large-sized display apparatus. Accordingly, the display apparatus in this embodiment can be used for display portions of a digital camera, a digital video camera, a digital photo frame, a mobile phone, a portable game console, a portable information terminal, and an audio reproducing device, in addition to display portions of electronic apparatuses with a relatively large screen, such as a television device, desktop and notebook personal computers, a monitor of a computer and the like, digital signage, and a large game machine such as a pachinko machine.

[Display Module]

Figure 12A:
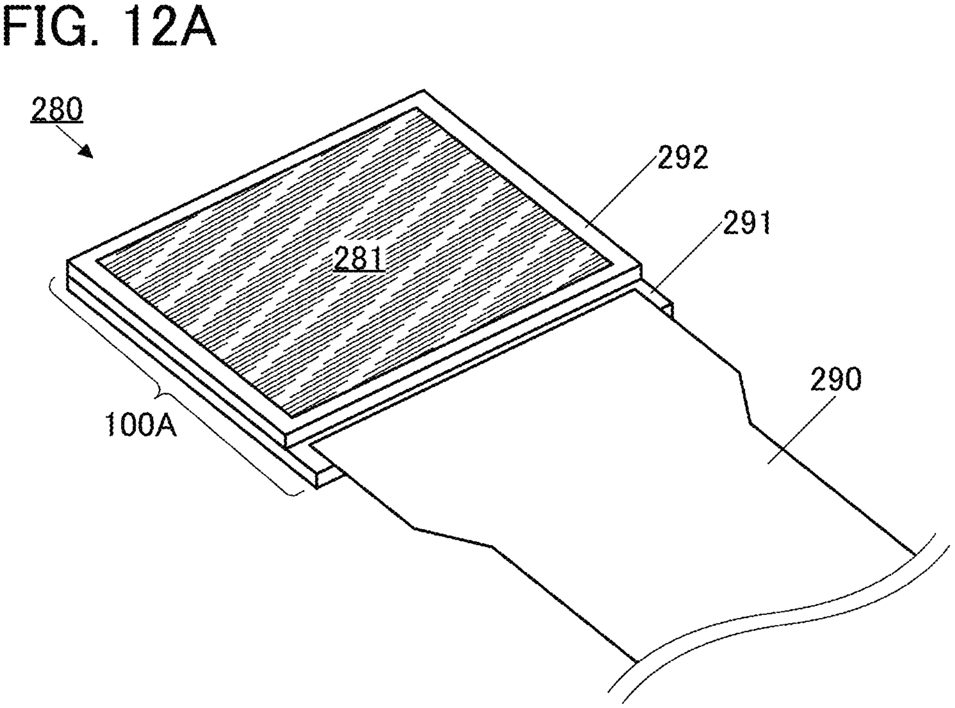
FIGS. 12A and 12B are perspective views illustrating a structure example of a display module.

FIG. 12A is a perspective view of a display module 280. The display module 280 includes a display apparatus 100A and an FPC 290. Note that the display apparatus included in the display module 280 is not limited to the display apparatus 100A and may be any of display apparatuses 100B to 100E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 12B:
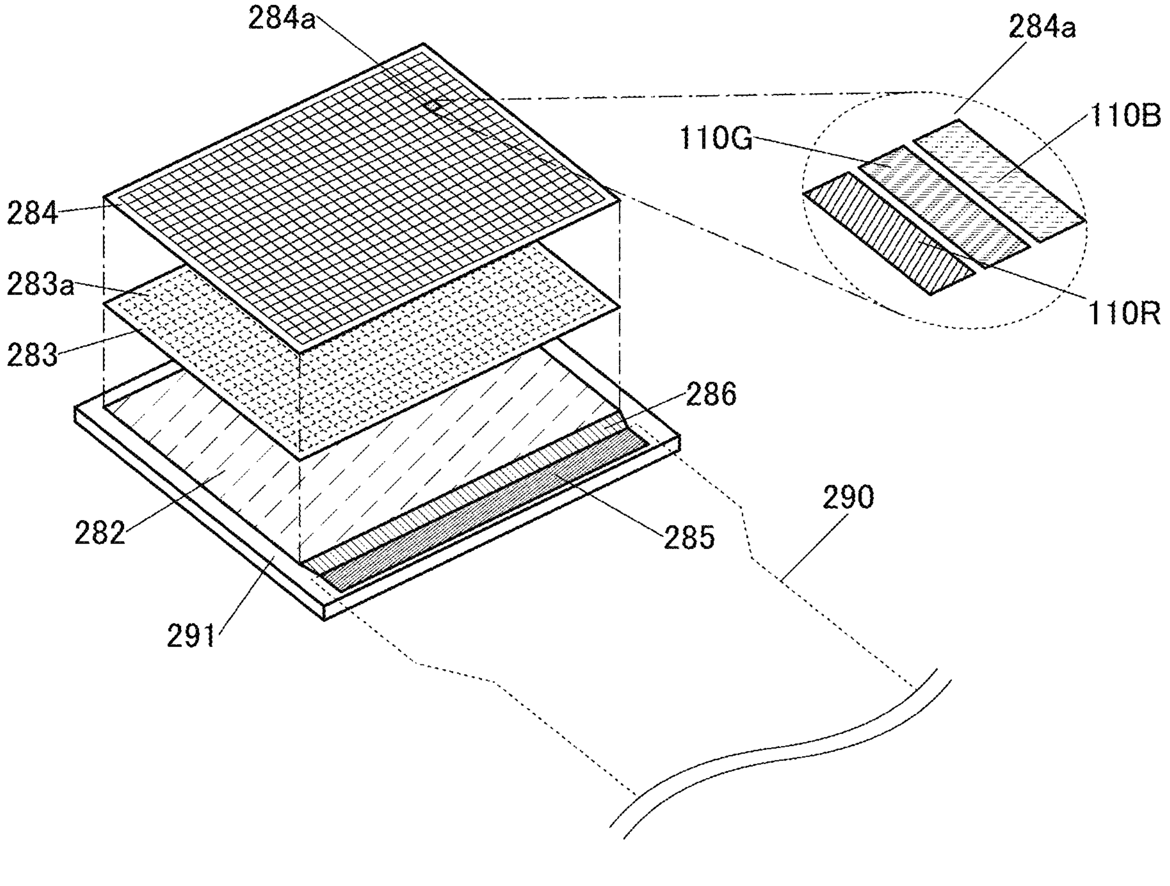

FIG. 12B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 12B. The pixels 284*a* can employ any of the structures described in the above embodiments. FIG. 12B illustrates an example where the pixel 284*a* has a structure similar to that of the pixel 178 illustrated in FIGS. 5A and 5B.

The pixel circuit portion 283 includes a plurality of pixel circuits 283*a* arranged periodically.

One pixel circuit 283*a* is a circuit that controls driving of a plurality of elements included in one pixel 284*a*.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high.

Such a display module 280 has extremely high resolution, and thus can be suitably used for a VR device such as an HMD or a glasses-type AR device. For example, even in the case of a structure in which the display portion of the display module 280 is seen through a lens, pixels of the extremely-high-resolution display portion 281 included in the display module 280 are prevented from being recognized when the display portion is enlarged by the lens, so that display providing a high sense of immersion can be performed. Without being limited thereto, the display module 280 can be suitably used for electronic apparatuses including a relatively small display portion.

[Display Apparatus 100A]

Figure 13A:
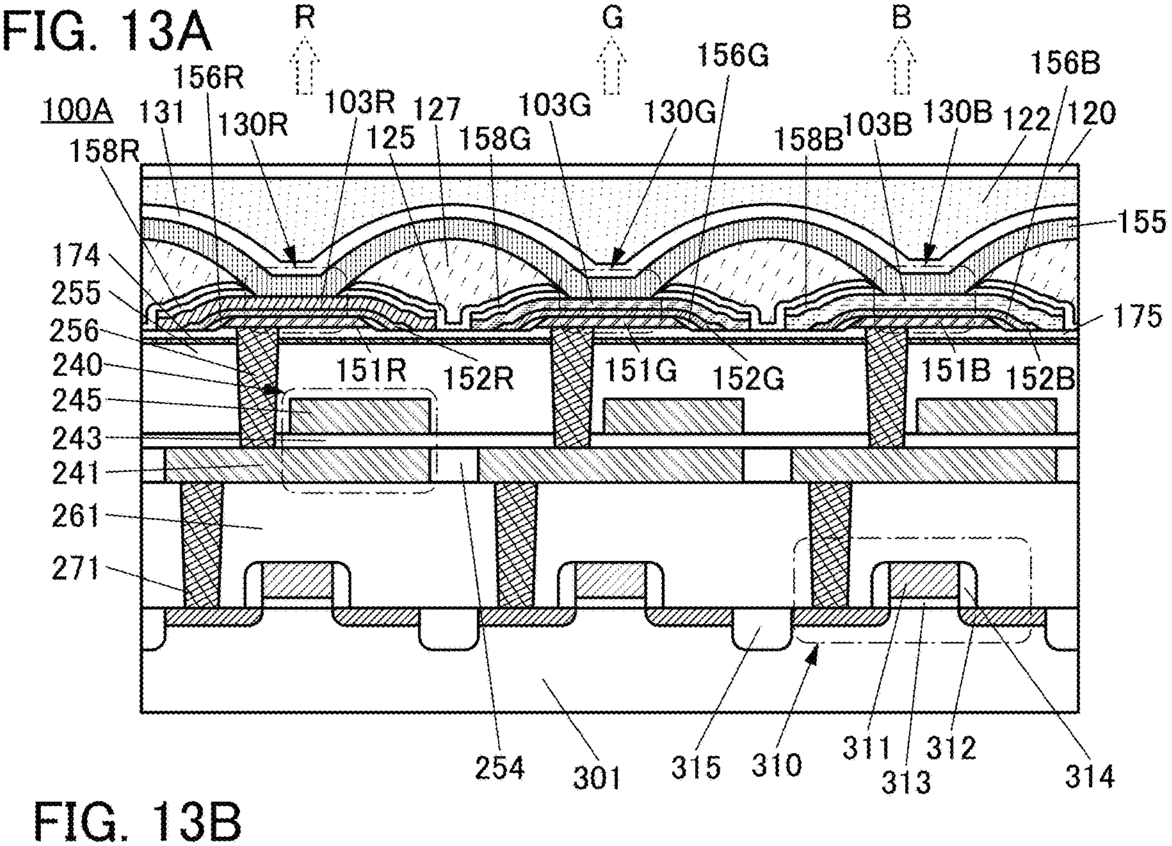
FIGS. 13A and 13B are cross-sectional views each illustrating a structure example of a display apparatus.

The display apparatus 100A illustrated in FIG. 13A includes a substrate 301, the light-emitting devices 130R, 130G, and 130B, a capacitor 240, and a transistor 310.

The substrate 301 corresponds to the substrate 291 in FIGS. 12A and 12B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting devices 130R, 130G, and 130B are provided over the insulating layer 175. An insulator is provided in regions between adjacent light-emitting devices.

The insulating layer 156R is provided to include a region overlapping with the side surface of the conductive layer 151R. The insulating layer 156G is provided to include a region overlapping with the side surface of the conductive layer 151G. The insulating layer 156B is provided to include a region overlapping with the side surface of the conductive layer 151B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the organic compound layer 103R. The sacrificial layer 158G is positioned over the organic compound layer 103G. The sacrificial layer 158B is positioned over the organic compound layer 103B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. Any of a variety of conductive materials can be used for the plugs.

The protective layer 131 is provided over the light-emitting devices 130R, 130G, and 130B. The substrate 120 is bonded to the protective layer 131 with the resin layer 122. Embodiment 3 can be referred to for the details of the light-emitting device 130 and the components thereover up to the substrate 120. The substrate 120 corresponds to the substrate 292 in FIG. 12A.

Figure 13B:
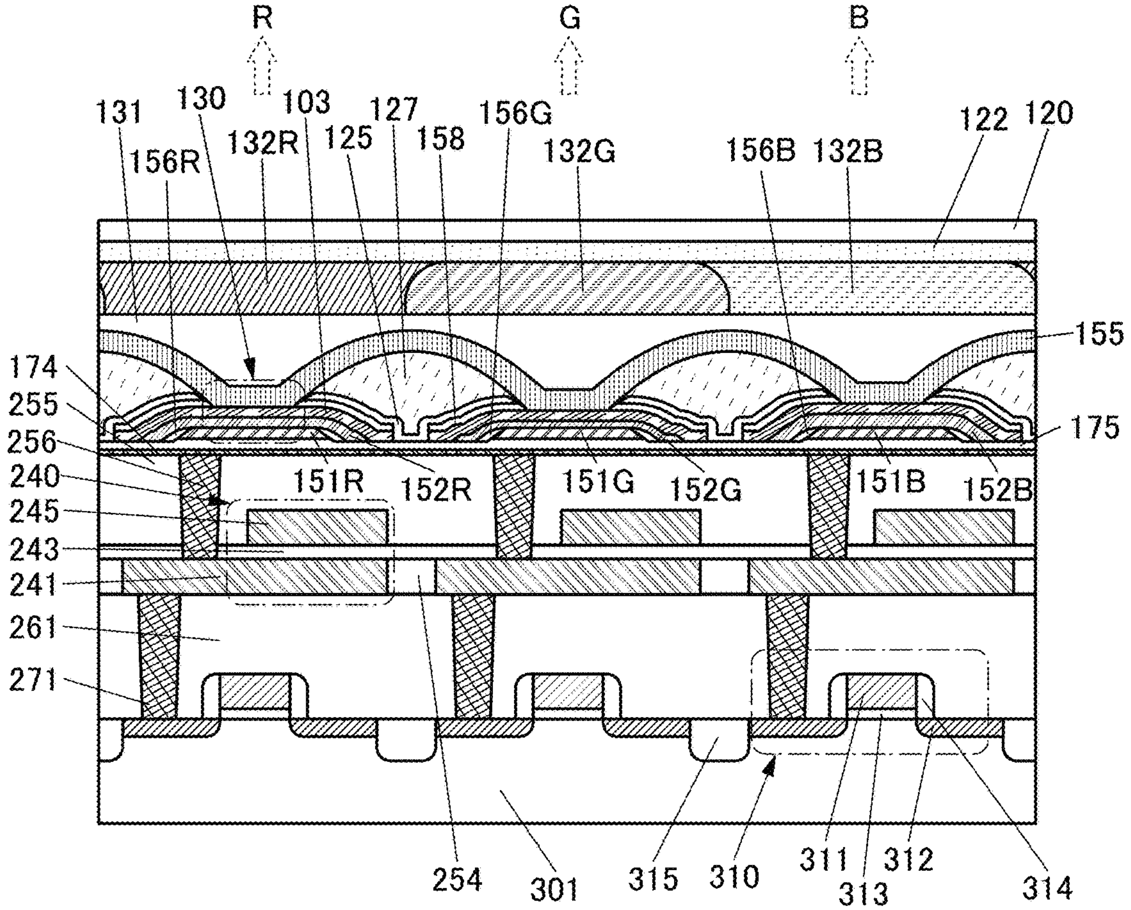

FIG. 13B illustrates a variation example of the display apparatus 100A illustrated in FIG. 13A. The display apparatus illustrated in FIG. 13B includes coloring layers 132R, 132G, and 132B, and each of the light-emitting devices 130 includes a region overlapping with one of the coloring layers 132R, 132G, and 132B. In the display apparatus illustrated in FIG. 13B, the light-emitting device 130 can emit white light, for example. The coloring layer 132R, the coloring layer 132G, and the coloring layer 132B can transmit red light, green light, and blue light, respectively, for example.

[Display Apparatus 100B]

Figure 14:
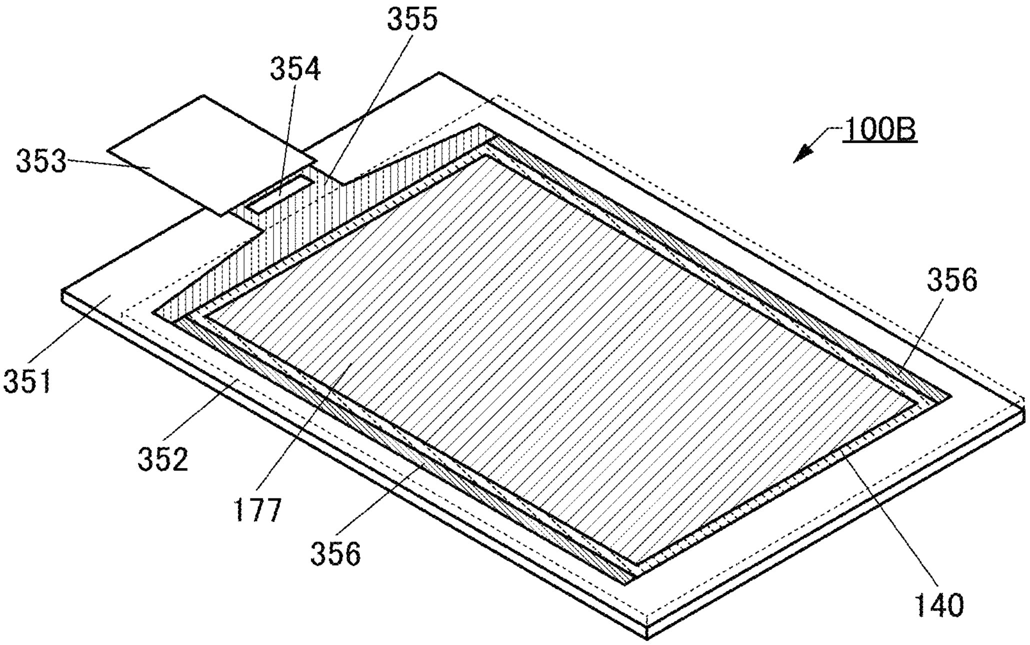
FIG. 14 is a perspective view illustrating a structure example of a display apparatus.

FIG. 14 is a perspective view of the display apparatus 100*n*.

In the display apparatus 100B, a substrate 352 and a substrate 351 are bonded to each other. In FIG. 14, the substrate 352 is denoted by a dashed line.

The display apparatus 100B includes the pixel portion 177, the connection portion 140, a circuit 356, a wiring 355, and the like. FIG. 14 illustrates an example in which an IC 354 and an FPC 353 are mounted on the display apparatus 100B. Thus, the structure illustrated in FIG. 14 can be regarded as a display module including the display apparatus 100B, the integrated circuit (IC), and the FPC. Here, a display apparatus in which a substrate is equipped with a connector such as an FPC or mounted with an IC is referred to as a display module.

The connection portion 140 is provided outside the pixel portion 177. The number of connection portions 140 may be one or more. In the connection portion 140, a common electrode of a light-emitting device is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 14 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the display apparatus 100B and the display module are not necessarily provided with an IC. Alternatively, the IC may be mounted on the FPC by a COF method, for example.

Figure 15:
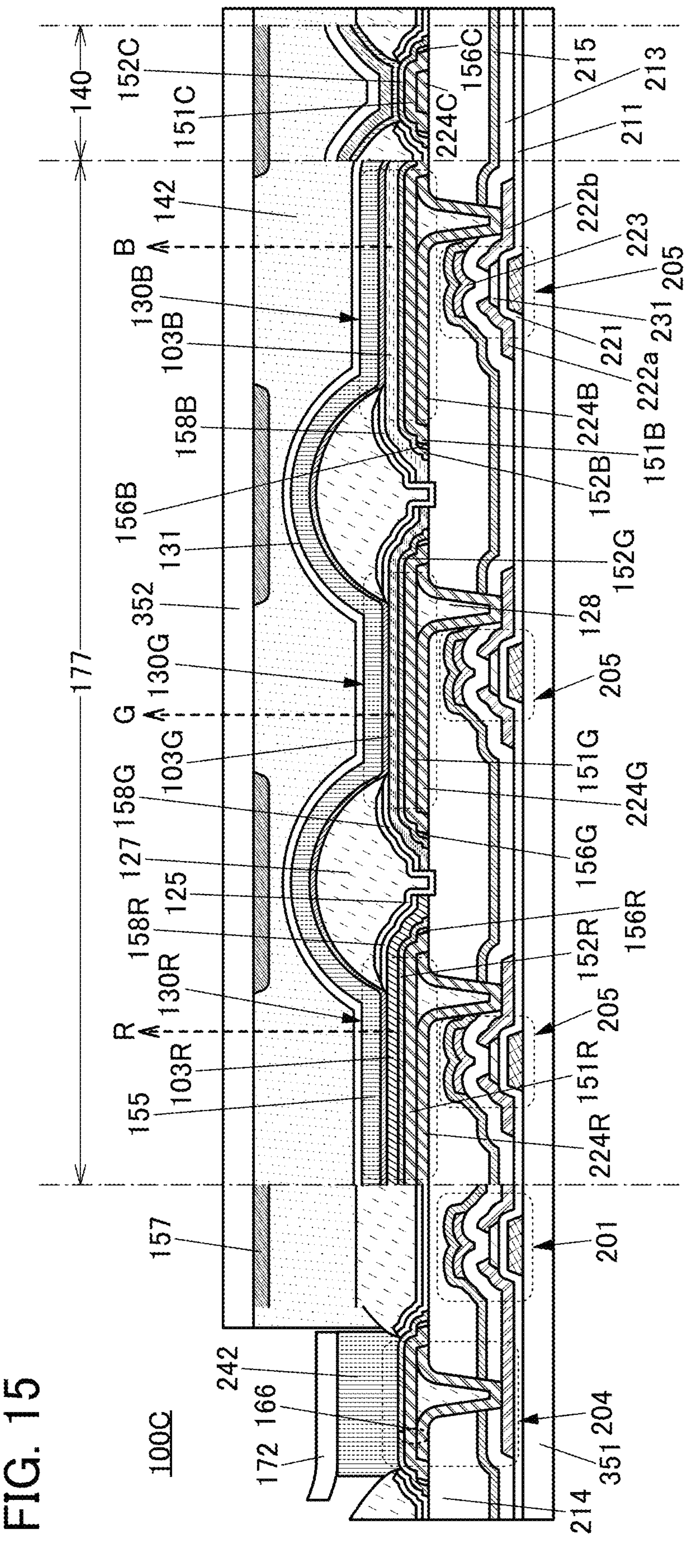
FIG. 15 is a cross-sectional view illustrating a structure example of a display apparatus.

FIG. 15 illustrates an example of cross sections of part of a region including the FPC 353, part of the circuit 356, part of the pixel portion 177, part of the connection portion 140, and part of a region including an end portion of the display apparatus 100B, which is denoted as 100C in FIG. 15.

[Display Apparatus 100C]

The display apparatus 100C illustrated in FIG. 15 includes a transistor 201, a transistor 205, the light-emitting device 130R that emits red light, the light-emitting device 130G that emits green light, the light-emitting device 130B that emits blue light, and the like between the substrate 351 and the substrate 352.

Embodiments 1 to 3 can be referred to for the details of the light-emitting devices 130R, 130G, and 130B.

The light-emitting device 130R includes a conductive layer 224R, the conductive layer 151R over the conductive layer 224R, and the conductive layer 152R over the conductive layer 151R. The light-emitting device 130G includes a conductive layer 224G, the conductive layer 151G over the conductive layer 224G, and the conductive layer 152G over the conductive layer 151G. The light-emitting device 130B includes a conductive layer 224B, the conductive layer 151B over the conductive layer 224B, and the conductive layer 152B over the conductive layer 151B.

The conductive layer 224R is connected to a conductive layer 222*b* included in the transistor 205 through an opening provided in an insulating layer 214. An end portion of the conductive layer 151R is positioned outward from an end portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting device 130G are not described in detail because they are respectively similar to the conductive layers 224R, 151R, and 152R and the insulating layer 156R in the light-emitting device 130R; the same applies to the conductive layers 224B, 151B, and 152B and the insulating layer 156B in the light-emitting device 130B.

The conductive layers 224R, 224G, and 224B each have a depression portion covering the opening provided in the insulating layer 214. A layer 128 is embedded in the depression portion.

The layer 128 has a function of filling the depression portions of the conductive layers 224R, 224G, and 224B to obtain planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping with the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting devices 130R, 130G, and 130B. The protective layer 131 and the substrate 352 are bonded to each other with an adhesive layer 142. The substrate 352 is provided with a light-blocking layer 157. A solid sealing structure, a hollow sealing structure, or the like can be employed to seal the light-emitting device 130. In FIG. 15, a solid sealing structure is employed, in which a space between the substrate 352 and the substrate 351 is filled with the adhesive layer 142. Alternatively, the space may be filled with an inert gas (e.g., nitrogen or argon), i.e., a hollow sealing structure may be employed. In that case, the adhesive layer 142 may be provided not to overlap with the light-emitting device. Alternatively, the space may be filled with a resin other than the frame-like adhesive layer 142.

FIG. 15 illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 15, the insulating layer 156C is provided to include a region overlapping with the side surface of the conductive layer 151C.

The display apparatus 100C has a top-emission structure. Light from the light-emitting device is emitted toward the substrate 352. For the substrate 352, a material having a high visible-light-transmitting property is preferably used. In the case where the light-emitting device emits infrared light or near-infrared light, a material having a high infrared- or near-infrared-light-transmitting property is preferably used for the substrate 352. The pixel electrode contains a material that reflects visible light, and the counter electrode (the common electrode 155) contains a material that transmits visible light.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

An inorganic insulating film is preferably used as each of the insulating layers 211, 213, and 215.

An organic insulating layer is suitable for the insulating layer 214 functioning as a planarization layer.

Each of the transistors 201 and 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate.

A connection portion 204 is provided in a region of the substrate 351 not overlapping with the substrate 352. In the connection portion 204, the wiring 355 is electrically connected to the FPC 353 through a conductive layer 166 and a connection layer 242. As an example, the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

A light-blocking layer 157 is preferably provided on the surface of the substrate 352 on the substrate 351 side. The light-blocking layer 157 can be provided over a region between adjacent light-emitting devices, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, an anisotropic conductive film (ACF), an anisotropic conductive paste (ACP), or the like can be used.

[Display Apparatus 100D]

Figure 16:
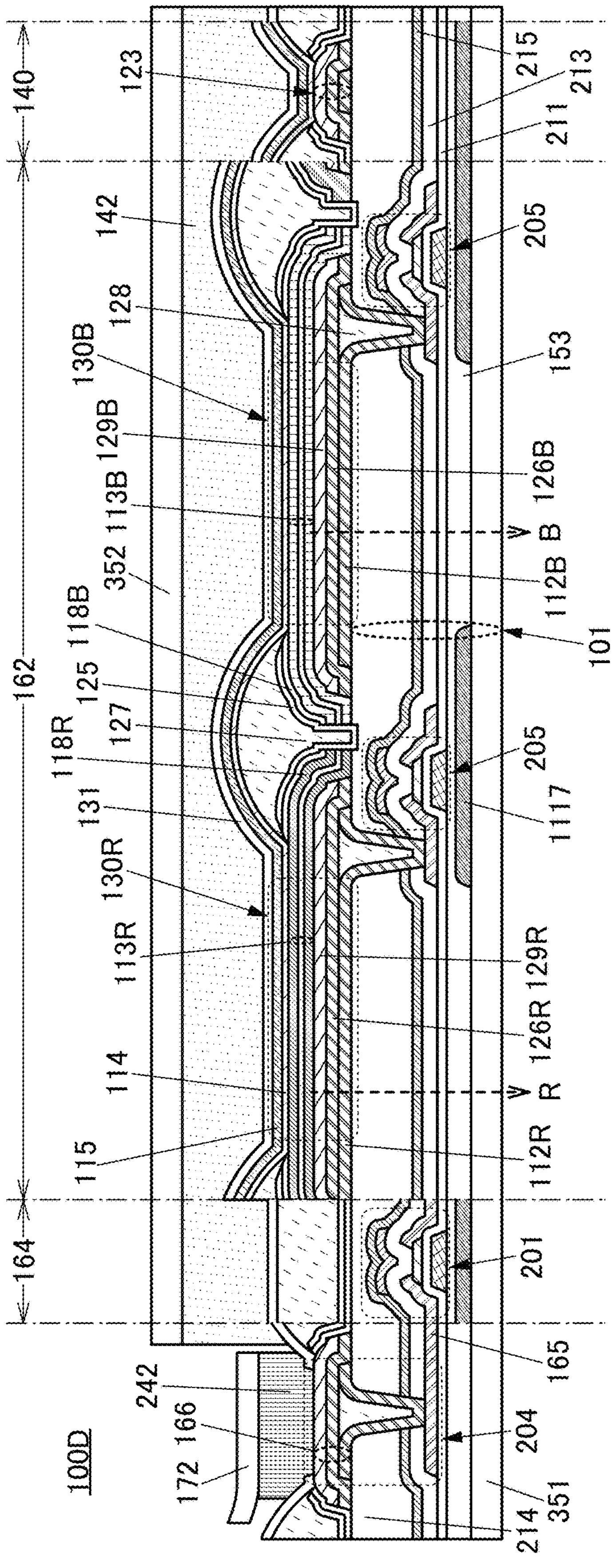
FIG. 16 is a cross-sectional view illustrating a structure example of a display apparatus.

The display apparatus 100D in FIG. 16 differs from the display apparatus 100C in FIG. 15 mainly in having a bottom-emission structure.

Light from the light-emitting device is emitted toward the substrate 351. For the substrate 351, a material having a high visible-light-transmitting property is preferably used. By contrast, there is no limitation on the light-transmitting property of a material used for the substrate 352.

A light-blocking layer 1117 is preferably formed between the substrate 351 and the transistor 201 and between the substrate 351 and the transistor 205. FIG. 16 illustrates an example in which the light-blocking layer 1117 is provided over the substrate 351, an insulating layer 153 is provided over the light-blocking layer 1117, and the transistors 201 and 205 and the like are provided over the insulating layer 153.

The light-emitting device 130R includes a conductive layer 112R, a conductive layer 126R over the conductive layer 112R, and a conductive layer 129R over the conductive layer 126R.

The light-emitting device 130B includes a conductive layer 112B, a conductive layer 126B over the conductive layer 112B, and a conductive layer 129B over the conductive layer 126B.

A material having a high visible-light-transmitting property is used for each of the conductive layers 112R, 112B, 126R, 126B, 129R, and 129B. A material that reflects visible light is preferably used for the common electrode 155.

Although not shown in FIG. 16, the light-emitting device 130G is also provided.

Although FIG. 16 and the like illustrate an example in which the top surface of the layer 128 includes a flat portion, the shape of the layer 128 is not particularly limited.

[Display Apparatus 100E]

Figure 17:
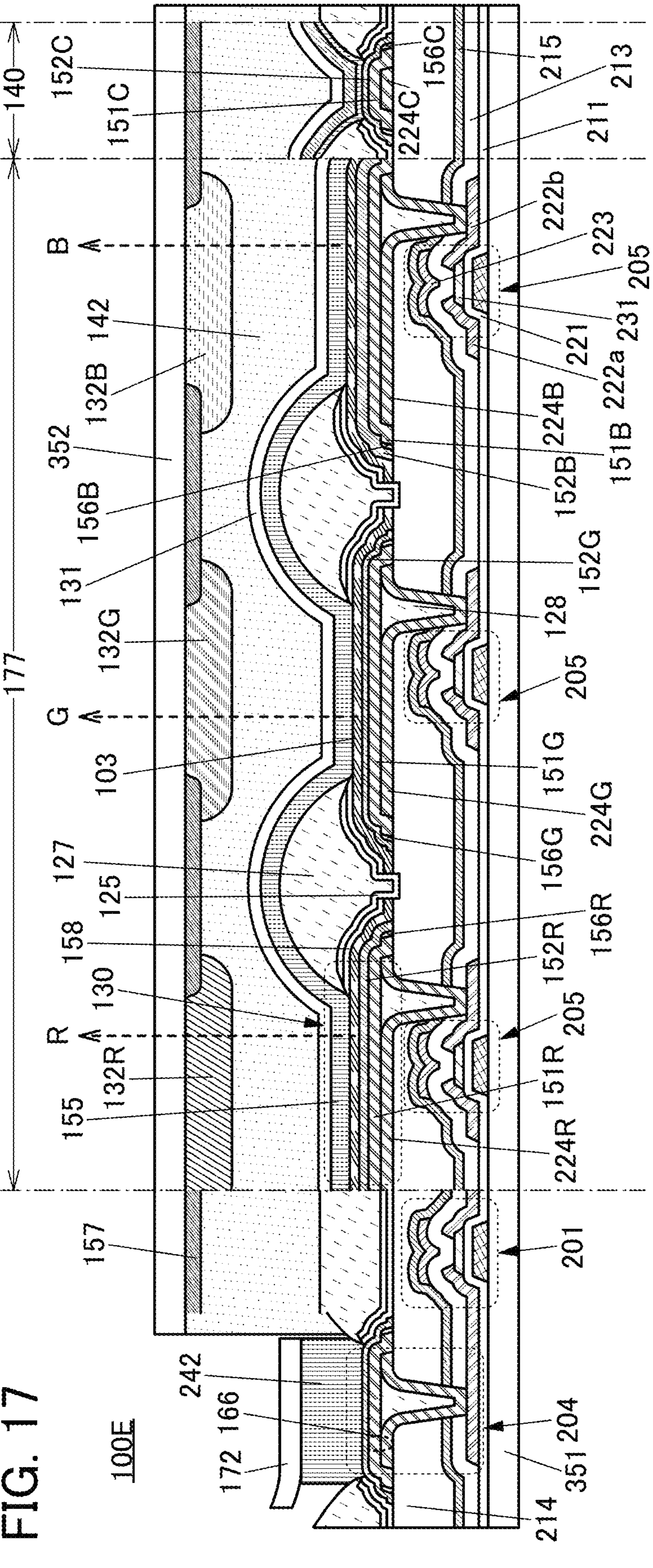
FIG. 17 is a cross-sectional view illustrating a structure example of a display apparatus.

The display apparatus 100E illustrated in FIG. 17 is a variation example of the display apparatus 100C illustrated in FIG. 15 and differs from the display apparatus 100C mainly in including the coloring layers 132R, 132G, and 132B.

In the display apparatus 100E, the light-emitting device 130 includes a region overlapping with one of the coloring layers 132R, 132G, and 132B. The coloring layers 132R, 132G, and 132B can be provided on a surface of the substrate 352 on the substrate 351 side. End portions of the coloring layers 132R, 132G, and 132B can overlap with the light-blocking layer 157.

In the display apparatus 100E, the light-emitting device 130 can emit white light, for example. The coloring layer 132R, the coloring layer 132G, and the coloring layer 132B can transmit red light, green light, and blue light, respectively, for example. Note that in the display apparatus 100E, the coloring layers 132R, 132G, and 132B may be provided between the protective layer 131 and the adhesive layer 142.

Although FIG. 15, FIG. 17, and the like illustrate an example in which the top surface of the layer 128 includes a flat portion, the shape of the layer 128 is not particularly limited.

This embodiment can be combined as appropriate with any of the other embodiments and the examples. In this specification, in the case where a plurality of structure examples are shown in one embodiment, the structure examples can be combined as appropriate.

Embodiment 5

In this embodiment, electronic apparatuses of embodiments of the present invention will be described.

Electronic apparatuses of this embodiment each include the display apparatus of one embodiment of the present invention in their display portions. The display apparatus of one embodiment of the present invention has high display performance and can be easily increased in resolution and definition. Thus, the display apparatus of one embodiment of the present invention can be used for display portions of a variety of electronic apparatuses.

Examples of the electronic apparatuses include a digital camera, a digital video camera, a digital photo frame, a mobile phone, a portable game console, a portable information terminal, and an audio reproducing device, in addition to electronic apparatuses with a relatively large screen, such as a television device, desktop and notebook personal computers, a monitor of a computer and the like, digital signage, and a large game machine such as a pachinko machine.

In particular, the display apparatus of one embodiment of the present invention can have high resolution, and thus can be favorably used for an electronic apparatus having a relatively small display portion. Examples of such an electronic apparatus include watch-type and bracelet-type information terminals (wearable devices) and wearable devices worn on the head, such as a VR device like a head-mounted display, a glasses-type AR device, and an MR device.

The electronic apparatus in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

Examples of head-mounted wearable devices are described with reference to FIGS. 18A to 18D.

Figure 18A:
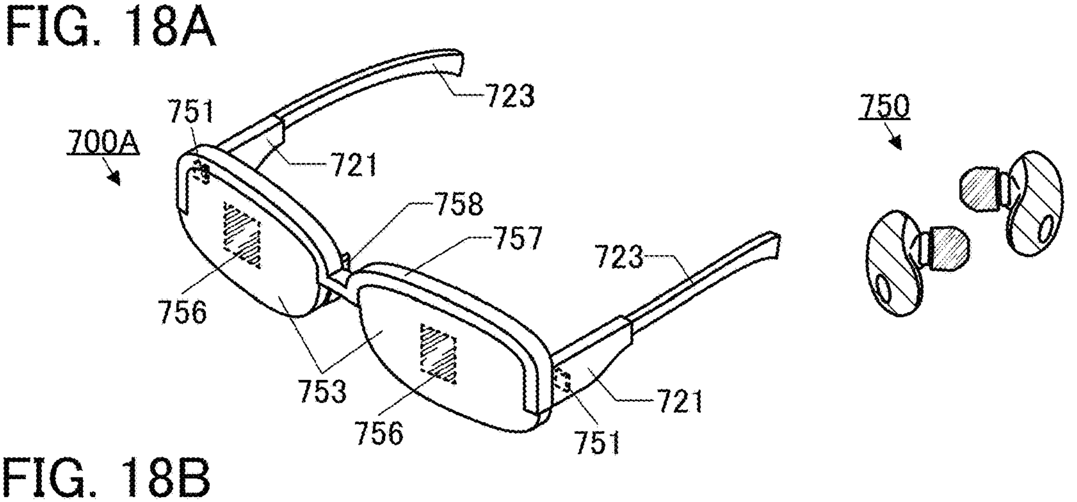
FIGS. 18A to 18D illustrate examples of electronic apparatuses.
Figure 18B:
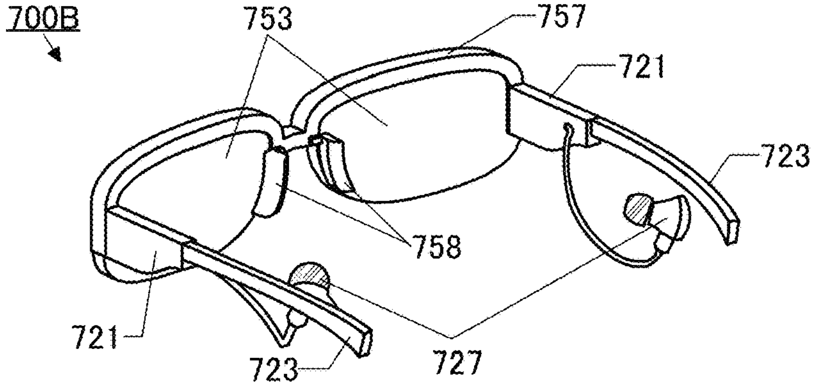

An electronic apparatus 700A illustrated in FIG. 18A and an electronic apparatus 700B illustrated in FIG. 18B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, a highly reliable electronic apparatus is obtained.

The electronic apparatuses 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753.

In the electronic apparatuses 700A and 700B, a camera capable of capturing images of the front side may be provided as the image capturing portion. Furthermore, when the electronic apparatuses 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic apparatuses 700A and 700B are provided with a battery, so that they can be charged wirelessly and/or by wire.

A touch sensor module may be provided in the housing 721.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

Figure 18C:
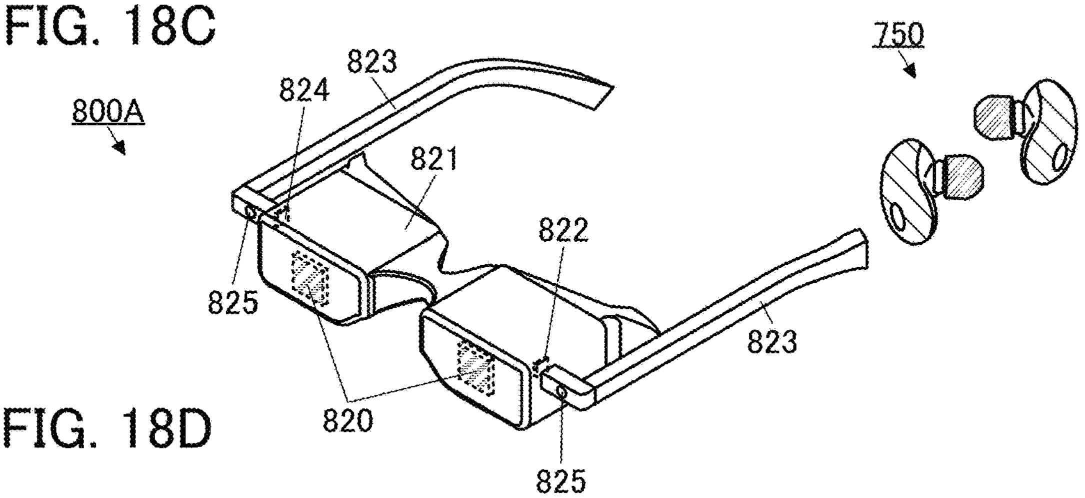
Figure 18D:
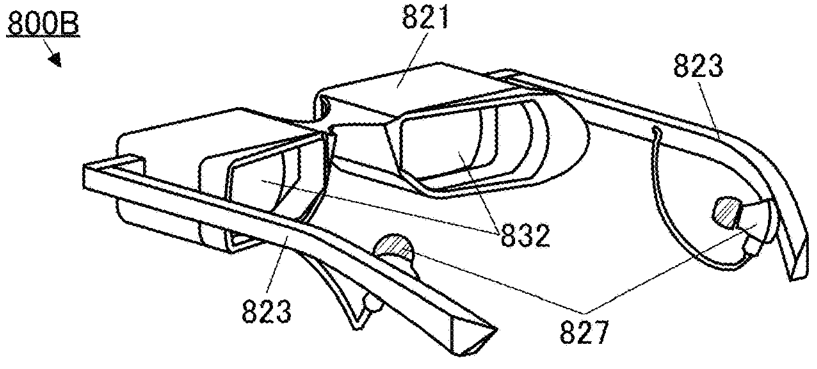

An electronic apparatus 800A illustrated in FIG. 18C and an electronic apparatus 800B illustrated in FIG. 18D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, a highly reliable electronic apparatus is obtained.

The display portions 820 are positioned inside the housing 821 so as to be seen through the lenses 832. When the pair of display portions 820 display different images, three-dimensional display using parallax can be performed.

The electronic apparatuses 800A and 800B preferably include a mechanism for adjusting the lateral positions of the lenses 832 and the display portions 820 so that the lenses 832 and the display portions 820 are positioned optimally in accordance with the positions of the user's eyes.

The electronic apparatus 800A or the electronic apparatus 800B can be mounted on the user's head with the wearing portions 823.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

The electronic apparatus 800A may include a vibration mechanism that functions as bone-conduction earphones.

The electronic apparatuses 800A and 800B may each include an input terminal. To the input terminal, a cable for supplying a video signal from a video output device or the like, power for charging a battery provided in the electronic apparatus, and the like can be connected.

The electronic apparatus of one embodiment of the present invention may have a function of performing wireless communication with earphones 750.

The electronic apparatus may include an earphone portion. The electronic apparatus 700B in FIG. 18B includes earphone portions 727. Part of a wiring that connects the earphone portion 727 and the control portion may be positioned inside the housing 721 or the mounting portion 723.

Similarly, the electronic apparatus 800B in FIG. 18D includes earphone portions 827. For example, the earphone portion 827 can be connected to the control portion 824 by wire.

As described above, both the glasses-type device (e.g., the electronic apparatuses 700A and 700B) and the goggles-type device (e.g., the electronic apparatuses 800A and 800B) are preferable as the electronic apparatus of one embodiment of the present invention.

Figure 19A:
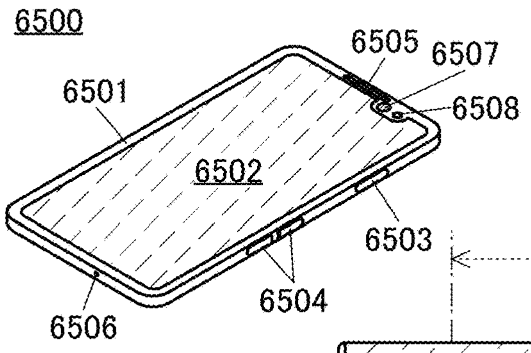
FIGS. 19A to 19F illustrate examples of electronic apparatuses.

An electronic apparatus 6500 illustrated in FIG. 19A is a portable information terminal that can be used as a smartphone.

The electronic apparatus 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. Thus, a highly reliable electronic apparatus is obtained.

Figure 19B:
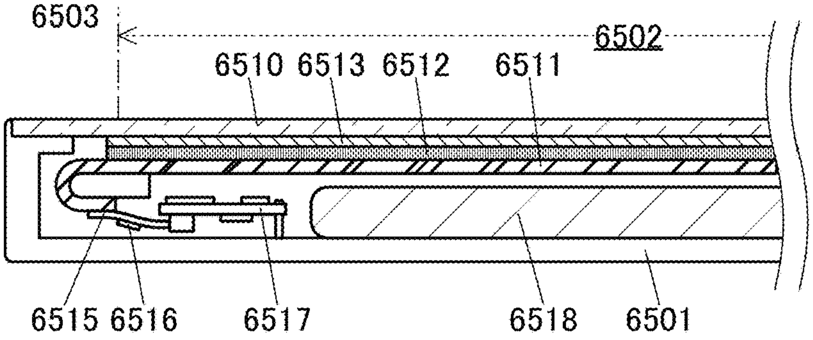

FIG. 19B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display apparatus of one embodiment of the present invention can be used in the display panel 6511. Thus, an extremely lightweight electronic apparatus can be achieved. Since the display panel 6511 is extremely thin, the battery 6518 with high capacity can be mounted without an increase in the thickness of the electronic apparatus. Moreover, part of the display panel 6511 is folded back so that a connection portion with the FPC 6515 is provided on the back side of the pixel portion, whereby an electronic apparatus with a narrow bezel can be achieved.

Figure 19C:
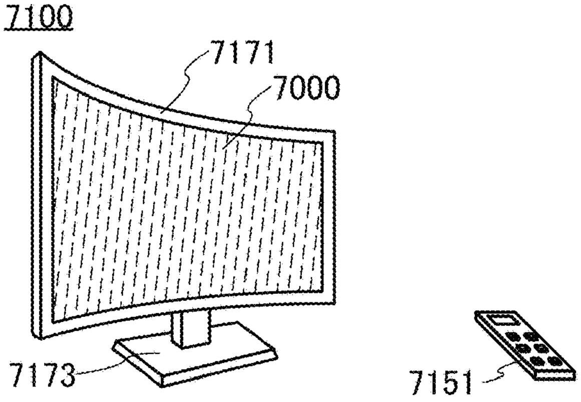

FIG. 19C illustrates an example of a television device. In a television device 7100, a display portion 7000 is incorporated in a housing 7171. Here, the housing 7171 is supported by a stand 7173.

The display apparatus of one embodiment of the present invention can be used in the display portion 7000. Thus, a highly reliable electronic apparatus is obtained.

Operation of the television device 7100 illustrated in FIG. 19C can be performed with an operation switch provided in the housing 7171 and a separate remote controller 7151.

Figure 19D:
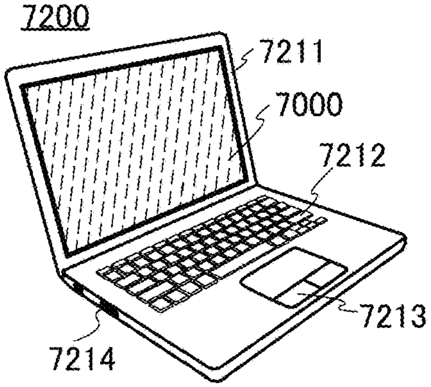

FIG. 19D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. Thus, a highly reliable electronic apparatus is obtained.

Figure 19E:
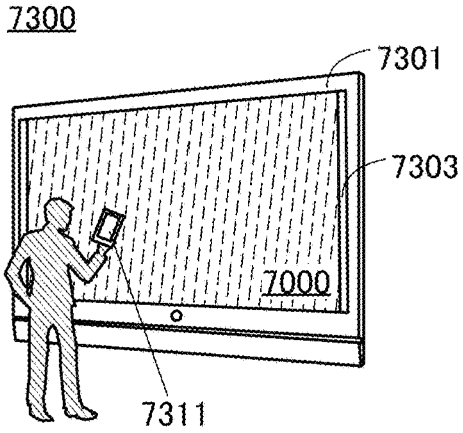
Figure 19F:
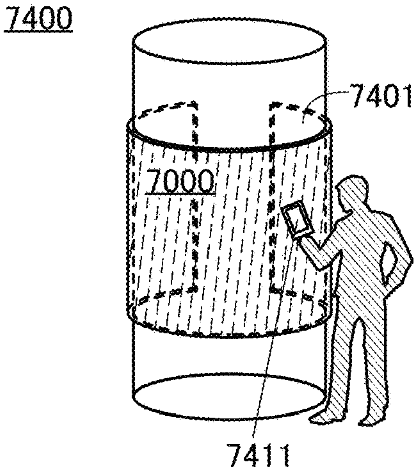

FIGS. 19E and 19F illustrate examples of digital signage. Digital signage 7300 illustrated in FIG. 19E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 19F shows digital signage 7400 attached to a cylindrical pillar 7401. The digital signage 7400 includes the display portion 7000 provided along a curved surface of the pillar 7401.

In FIGS. 19E and 19F, the display apparatus of one embodiment of the present invention can be used in the display portion 7000. Thus, a highly reliable electronic apparatus is obtained.

A larger area of the display portion 7000 can increase the amount of information that can be provided at a time. The display portion 7000 having a larger area attracts more attention, so that the effectiveness of the advertisement can be increased, for example.

As illustrated in FIGS. 19E and 19F, it is preferable that the digital signage 7300 or the digital signage 7400 can work with an information terminal 7311 or an information terminal 7411, such as a smartphone that a user has, through wireless communication.

Electronic apparatuses illustrated in FIGS. 20A to 20G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic apparatuses shown in FIGS. 20A to 20G have a variety of functions. For example, the electronic apparatuses can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium.

The electronic apparatuses in FIGS. 20A to 20G are described in detail below.

Figure 20A:
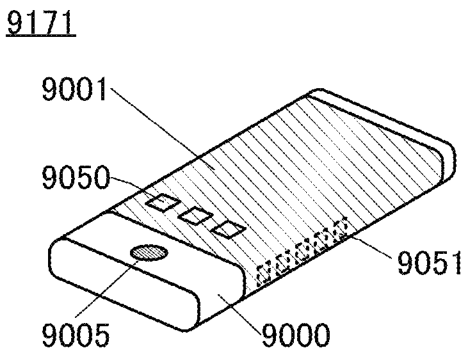
FIGS. 20A to 20G illustrate examples of electronic apparatuses.

FIG. 20A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 20A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 20B:
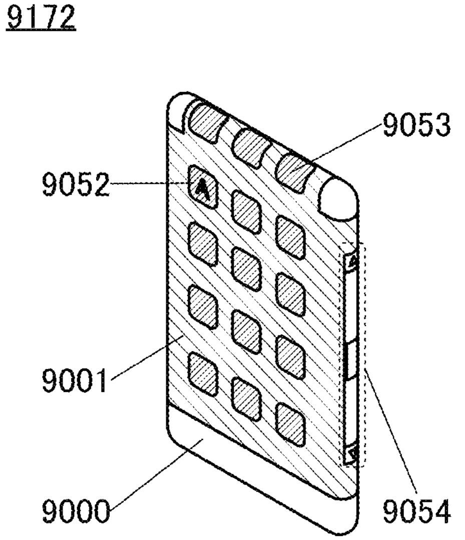

FIG. 20B is a perspective view of a portable information terminal 9172. The portable information terminal 9172 has a function of displaying information on three or more surfaces of the display portion 9001. Here, information 9052, information 9053, and information 9054 are displayed on different surfaces. For example, the user of the portable information terminal 9172 can check the information 9053 displayed such that it can be seen from above the portable information terminal 9172, with the portable information terminal 9172 put in a breast pocket of user's clothes.

Figure 20C:
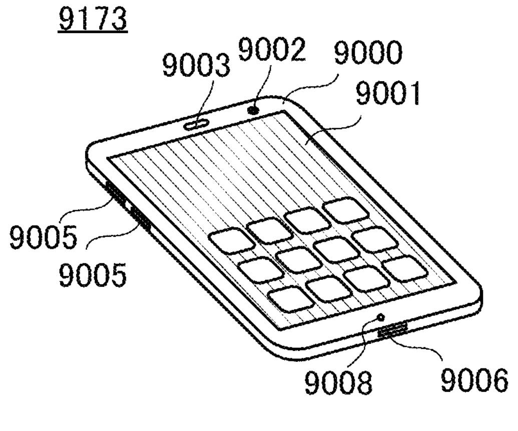

FIG. 20C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 20D:
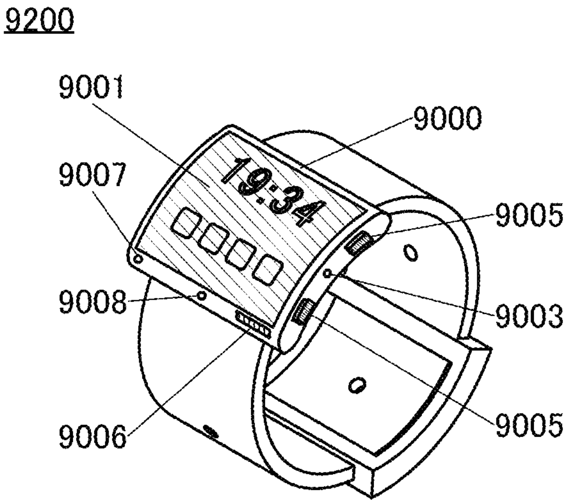

FIG. 20D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 20E:
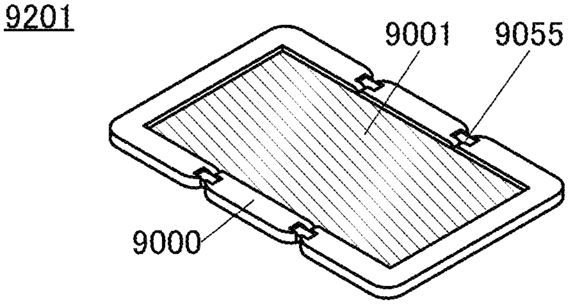
Figure 20F:
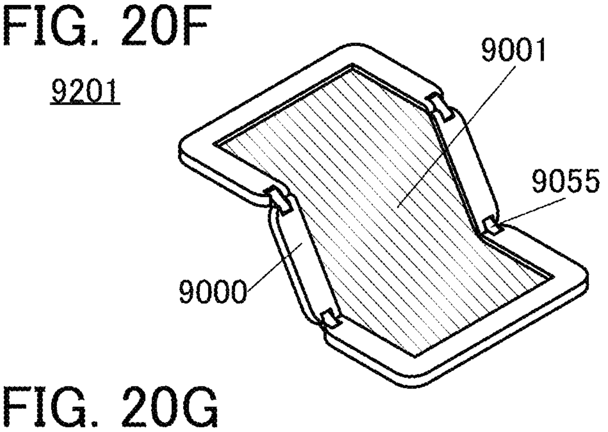
Figure 20G:
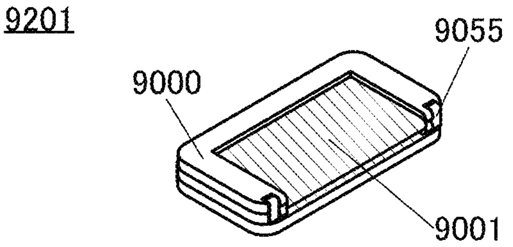

FIGS. 20E to 20G are perspective views of a foldable portable information terminal 9201. FIG. 20E is a perspective view showing the portable information terminal 9201 that is opened. FIG. 20G is a perspective view showing the portable information terminal 9201 that is folded. FIG. 20F is a perspective view showing the portable information terminal 9201 that is shifted from one of the states in FIGS. 20E and 20G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined as appropriate with any of the other embodiments and the examples. In this specification, in the case where a plurality of structure examples are shown in one embodiment, the structure examples can be combined as appropriate.

Example 1

In this example, a detailed fabrication method, characteristics, and an analysis result of Sample 1 that is the light-emitting apparatus of one embodiment of the present invention including the light-emitting device of one embodiment of the present invention are described.

Structure formulae of main compounds used in this example are shown below.
[Chemical Formula 10]
(100)
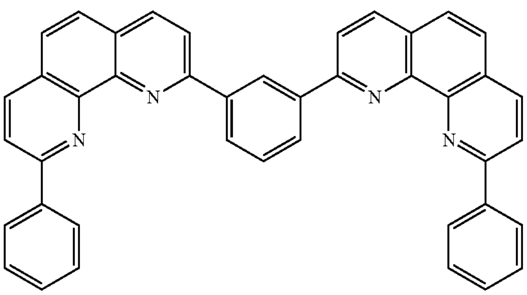
mPPhen2P
(101)
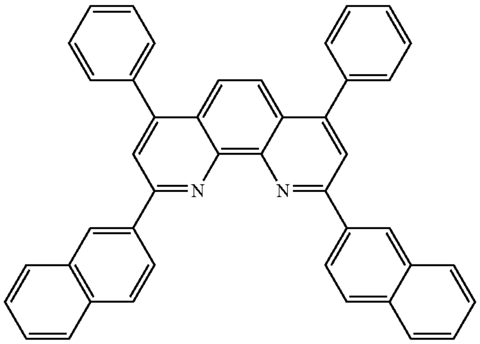
NBPhen
(i)
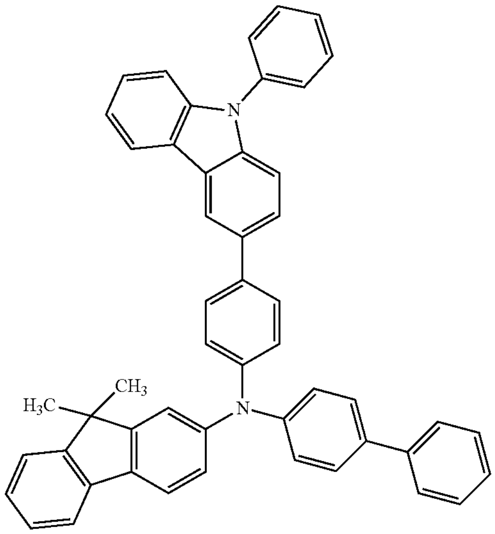
PCBBiF
-continued
(ii)
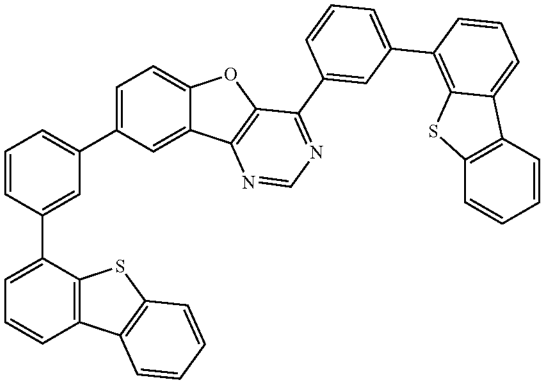
4,8mDBtP2Bfpm
(iii)
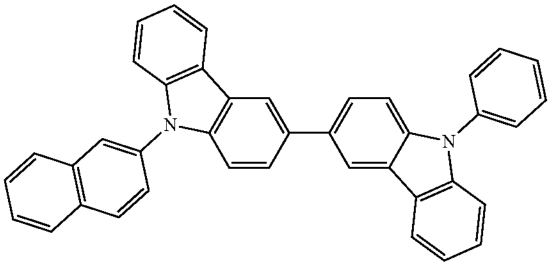
β NCCP
(iv)
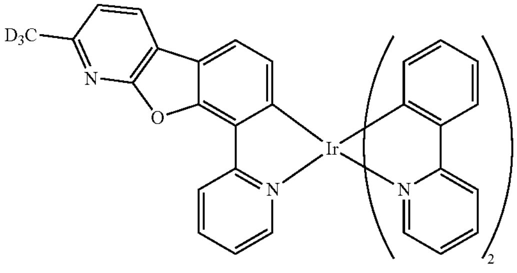
Ir(ppy)$_2$(mbfpypy-d3)

-continued (v)

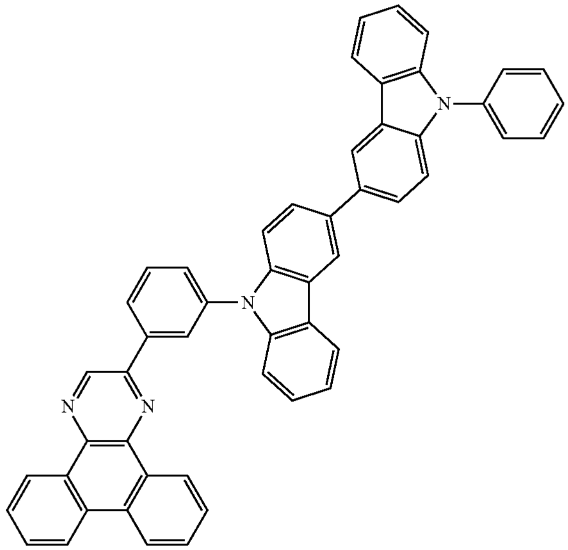

2mPCCzPDBq (Method for Fabricating Sample 1)

First, over a silicon substrate, 50-nm-thick titanium (Ti), 70-nm-thick aluminum (Al), and 6-nm-thick Ti as a reflective electrode and 10-nm-thick indium tin oxide containing silicon oxide (ITSO) as a transparent electrode were stacked by a sputtering method in this order from the substrate side. This stacked-layer film was patterned by a photolithography method, whereby a first electrode was formed. Note that the transparent electrode functions as an anode, and the transparent electrode and the reflective electrode are collectively regarded as the first electrode.

Next, over the first electrode, silicon oxide was deposited to a thickness of 10 nm by a sputtering method, whereby an inorganic insulating film was formed. The insulating film was processed by a photolithography method, whereby a plurality of opening portions overlapping with the first electrode were formed.

The opening portions were formed on the assumption of stripe arrangement in which 63001 pixels (251×251) are arranged in a matrix in a 2-mm square, and the area where the first electrode is exposed in the opening portion (i.e., the light-emitting area of a subpixel) is roughly 6.42 μm×1.14 μm. This arrangement corresponds to a pixel density of 3207 ppi.

Next, in pretreatment for forming the light-emitting device over the substrate, the surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $1\times10^{-4}$ Pa, and was subjected to vacuum baking at 170° C. for 60 minutes in a heating chamber of the vacuum evaporation apparatus and then, the substrate was cooled down for approximately 30 minutes.

Then, the substrate provided with the first electrode was fixed to a substrate holder provided in the vacuum evaporation apparatus such that the surface on which the first electrode was formed faced downward. Over the inorganic insulating film and the first electrode, N-(1,1'-biphenyl-4-yl)-N-[4-(9-phenyl-9H-carbazol-3-yl)phenyl]-9,9-dimethyl- 9H-fluoren-2-amine (abbreviation: PCBBiF) represented by Structure Formula (i) and a fluorine-containing electron acceptor material with a molecular weight of 672 (OCHD-003) were deposited by co-evaporation to a thickness of 10 nm such that the weight ratio of PCBBiF to OCHD-003 was 1:0.03, whereby a hole-injection layer was formed.

Over the hole-injection layer, PCBBiF was deposited by evaporation to a thickness of 100 nm, whereby a hole-transport layer was formed.

Then, over the hole-transport layer, 4,8-bis[3-(dibenzothiophen-4-yl)phenyl]-[1]benzofuro[3,2-d]pyrimidine (abbreviation: 4,8mDBtP2Bfpm) represented by Structure Formula (ii) above, 9-(2-naphthyl)-9'-phenyl-9H,9'H-3,3'-bicarbazole (abbreviation: βNCCP) represented by Structure Formula (iii) above, and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy\text{-}d_3)$) represented by Structure Formula (iv) above were deposited by co-evaporation to a thickness of 40 nm such that the weight ratio of 4,8mDBtP2Bfpm to βNCCP and $Ir(ppy)_2(mbfpypy\text{-}d_3)$ was 0.6:0.4:0.1, whereby a light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structure Formula (v) above was deposited by evaporation to a thickness of 10 nm and then 2,2'-(1,3-phenylene)bis(9-phenyl-1,10-phenanthroline) (abbreviation: mPPhen2P) represented by Structure Formula (100) above was deposited by evaporation to a thickness of 15 nm, whereby an electron-transport layer was formed.

After the formation of the electron-transport layer, heating was performed at 80° C. for 60 minutes under a reduced pressure (approximately 60 Pa). That is, a layer to be a free surface in Sample 1 is the layer formed of mPPhen2P.

After the heating, another heating was performed at 70° C. for 90 minutes in a vacuum (approximately $1\times10^{-4}$ Pa). Then, lithium fluoride (LiF) and ytterbium (Yb) were deposited by co-evaporation to a thickness of 1.5 nm at a weight ratio of LiF:Yb=1:0.5, whereby an electron-injection layer was formed.

Note that this heating step assumes heat generated in a formation step of a protective film over an organic semiconductor film.

After that, silver (Ag) and magnesium (Mg) were deposited by co-evaporation to a thickness of 25 nm at a volume ratio of Ag:Mg=1:0.1 and indium tin oxide (ITO) was deposited to a thickness of 70 nm by a sputtering method, whereby a second electrode was formed. Thus, the light-emitting device of one embodiment of the present invention was fabricated. Then, the light-emitting device was sealed using a glass substrate in a glove box containing a nitrogen atmosphere so as not to be exposed to the air. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, Sample 1 was fabricated. Note that in Example 1, Sample 1 was fabricated in an environment of Class 1000 or a higher cleanliness level.

(Method for Fabricating Sample 2)

Sample 2 was fabricated in a manner similar to that of Sample 1, except that NBPhen represented by Structure Formula (101) above was used instead of mPPhen2P in Sample 1.

The device structures of the light-emitting devices included in Sample 1 and Sample 2 are shown below.

TABLE 1

| | | Film thickness (nm) | Sample 1 | Sample 2 |
|---|---|---|---|---|
| Second electrode | | 70 | ITO | |
| | | 25 | Ag:Mg (1:0.1) | |
| Electron-injection layer | | 1.5 | LiF:Yb (1:0.5) | |
| Heating step | | | | |
| Electron-transport layer | | 15 | mPPhen2P | NBPhen |
| | | 10 | 2mPCCzPDBq | |
| Light-emitting layer | | 40 | 4,8mDBtP2Bfpm:βNCCP:$Ir(ppy)_2$(mbfpypy-d3) (0.6:0.4:0.1) | |
| Hole-transport layer | | 100 | PCBBiF | |
| Hole-injection layer | | 10 | PCBBiF:OCHD-003 (1:0.03) | |
| First electrode | 4 | 10 | ITSO | |
| | 3 | 6 | Ti | |
| | 2 | 70 | Al | |
| | 1 | 50 | Ti | |

Figure 21:
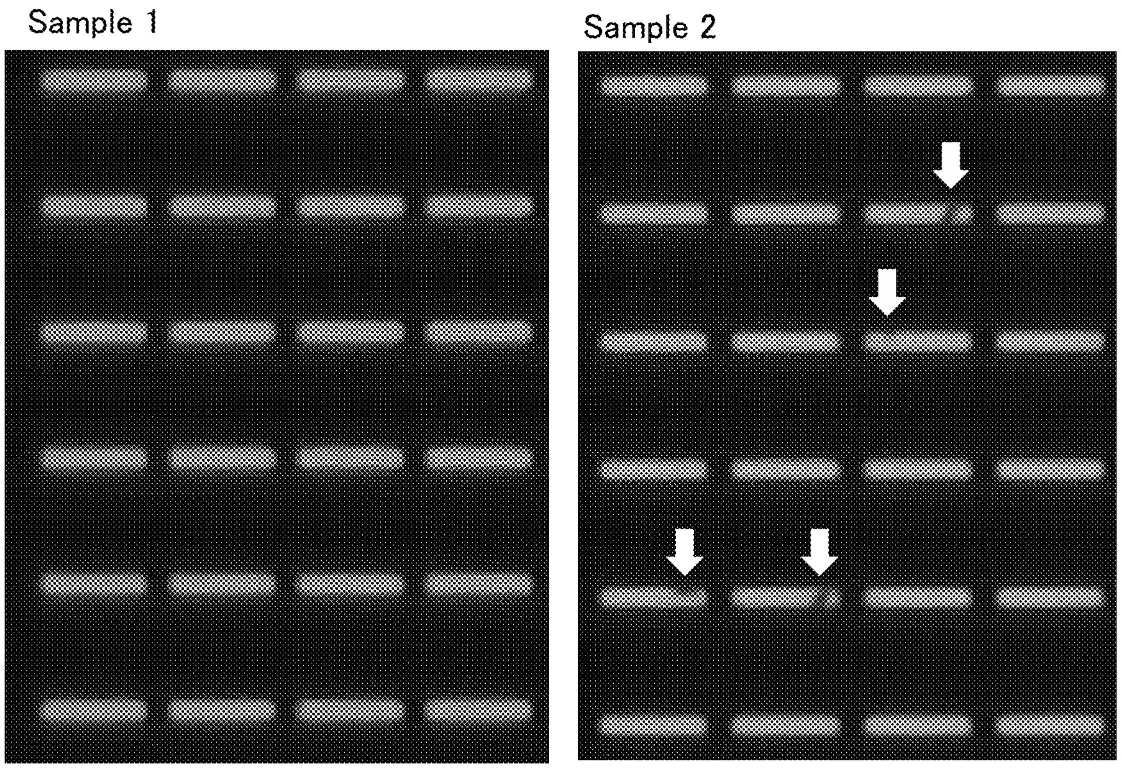
FIG. 21 shows optical micrographs of Sample 1 and Sample 2.

FIG. 21 shows micrographs of Sample 1 and Sample 2 with green-light-emitting devices emitting light.

The results show that Sample 1 and Sample 2 are free from significant display defects and have favorable display although both samples underwent the heating step at 80° C. in the state where the organic compound layer was not sandwiched between the electrodes.

However, while a noticeable display defect was not caused in Sample 1 using mPPhen2P for the electron-transport layer, a plurality of non-light-emitting regions (portions indicated by arrows in the micrograph) were found in light-emitting regions (anode formation regions) of the light-emitting devices of Sample 2 using NBPhen. Note that a non-light-emitting region in a pixel which is supposed to emit light in driving is sometimes referred to as a defective pixel in this specification.

These samples in a non-conduction state (non-light-emitting state) were also observed with an optical microscope. It was found that in Sample 2, thread-like unevenness was caused in a region corresponding to the above non-light-emitting region (with respect to the light-emitting surface). It was confirmed by observation of a cross section of the non-light-emitting region of Sample 2 with a scanning transmission electron microscope (STEM) that the organic layer on the cathode side aggregated to make the thickness larger than that in the light-emitting region, resulting in poor film quality. On the other hand, such poor film quality was not seen in Sample 1.

Note that similar observation was performed on Sample 3 fabricated under the condition where the temperature of heating after the formation of the electron-transport layer of Sample 1 was changed from 80° C. to 100° C., and Sample 4 fabricated under the condition where the temperature was changed from 80° C. to 120° C. As in Sample 1, a non-light-emitting region, i.e., a defective pixel, was not found in the state where light-emitting devices were emitting light, and unevenness like the one found in Sample 2 with poor film quality was not found in the observation in the non-conduction state.

Similar observation was performed on Sample 5 and Sample 6 each fabricated in a continuous vacuum process without performing the heating step after the formation of the electron-transport layer of Sample 1 and Sample 2. Unlike in Sample 2, no poor film quality and no display defect were found in Sample 5 and Sample 6.

Note that Sample 3, Sample 4, and Sample 5 had equivalent initial characteristics and reliability. This also indicates that the device of one embodiment of the present invention exhibits favorable display performance and device characteristics even after heat treatment of the free interface of the organic compound.

Here, results of analyzing thermophysical properties of mPPhen2P, 2mPCCzPDBq, and NBPhen by thermogravimetry-differential thermal analysis (TG-DTA) using high-sensitivity differential thermal analysis and differential scanning calorimetry (DSC) are shown.

First, the thermal weight loss percentage of mPPhen2P was measured by TG measurement for determining the maximum temperature in DSC. The measurement was conducted using a high-sensitivity differential type differential thermogravimeter (TG-DTA 2410SA, manufactured by Bruker AXS K.K.).

In the measurement, 5 mg of powder mPPhen2P was heated from room temperature (25° C.) to 500° C. at a temperature rising rate of 40° C./min under an atmospheric pressure and a nitrogen stream. Note that on the assumption of the purity and the state of a material deposited by vacuum deposition in an actual organic semiconductor device, the powder sample of mPPhen2P was purified by sublimation in advance and the purity thereof was confirmed to be 99.9% or higher by high performance liquid column chromatography (HPLC).

Figure 22:
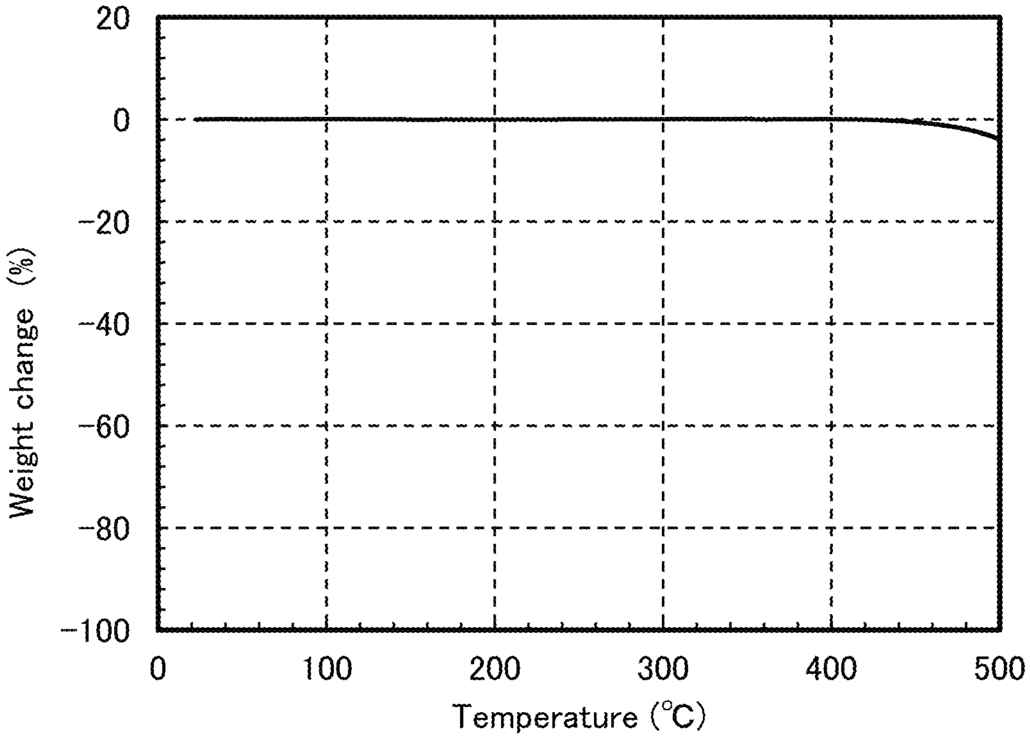
FIG. 22 is a graph showing the weight loss percentage of mPPhen2P obtained by TG measurement.

FIG. 22 shows the measured weight loss percentage. The weight of mPPhen2P was found to be reduced by approximately 3% at 490° C., but was hardly reduced at 440° C. and was not reduced at all at 400° C.

Accordingly, it can be determined that mPPhen2P hardly sublimates under an atmospheric pressure at a temperature lower than the 3% weight loss temperature obtained by TG measurement by 50° C. or more, preferably a temperature lower than the 3% weight loss temperature obtained by TG measurement by 100° C. or more.

Furthermore, when DSC is performed with the maximum temperature set higher than or equal to a temperature lower than the 3% weight loss temperature by 150° C., preferably higher than or equal to a temperature lower than the 3% weight loss temperature by 100° C., the DSC can be performed at a temperature where no melting point is missed and a material hardly sublimates under an atmospheric pressure.

Note that in the case where the TG measurement is not performed, the maximum temperature in the DSC is preferably a temperature lower than or equal to a temperature three times as high as the glass transition temperature of a material to be measured. In consideration of the upper limit of the vacuum vapor deposition temperature of an organic compound, it is probably sufficient to perform the measurement up to 450° C. In the case of a complex, it is probably sufficient to perform the measurement up to 350° C. In the case where sublimation, vaporization, decomposition, or the like occurs in the measurement at a temperature up to 450° C. or 350° C., the maximum temperature is preferably set lower. Whether sublimation, vaporization, or decomposition occurs in the measurement at a certain maximum temperature is preferably judged in the following manner: the measurement is performed again on the same sample under the same temperature rising condition for checking whether the cycle performance is the same that in as the previous measurement, i.e., whether baselines overlap with each other.

Note that the maximum temperature in the DSC is preferably determined by performing the TG measurement in advance as described above.

Note that in the following DSC, the maximum temperature was set at 360° C., which was lower than the 3% weight loss temperature by 130° C., and it was confirmed that there was no melting point peak of mPPhen2P in the range from 360° C. to 440° C.

Next, the thermophysical property of mPPhen2P was measured with a differential scanning calorimeter (DSC8500 manufactured by PerkinElmer, Inc.) using powder mPPhen2P. First, under a nitrogen stream, 5.0 mg of powder mPPhen2P was put in an aluminum sample pan (product number: 02190041), the temperature was raised from room temperature to 360° C. (first heating step), and the temperature was kept at 360° C. for three minutes. Then, the temperature was lowered from 360° C. to −10° C. at 40° C./min (temperature falling step). Then, the temperature was kept for three minutes, and then raised to 360° C. at 40° C./min (second heating step).

Figure 1B:
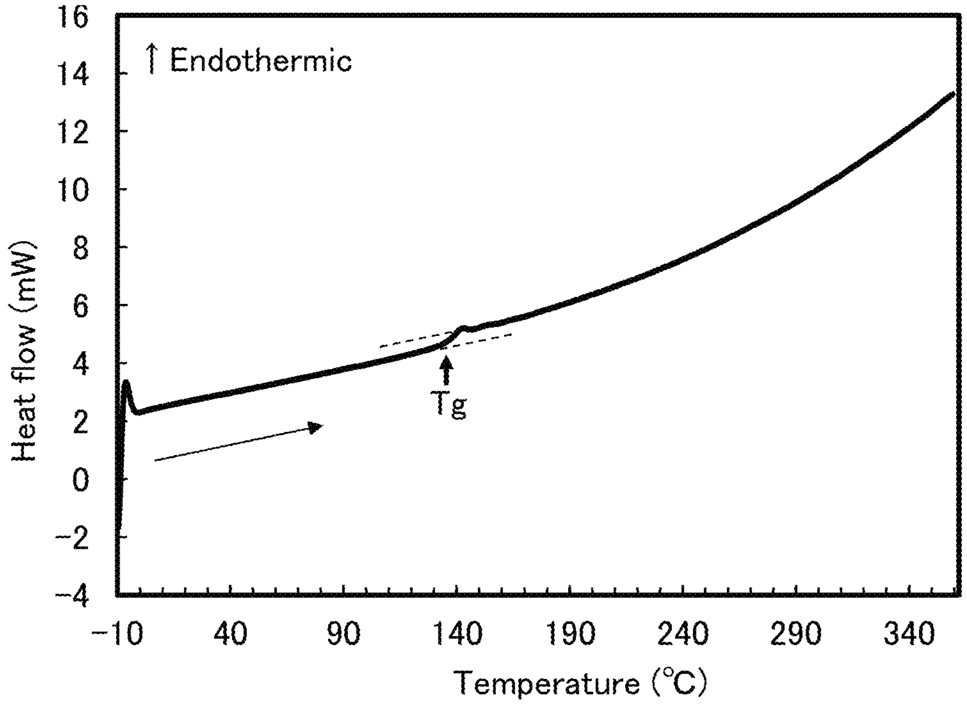
FIG. 1B shows a measurement result of mPPhen2P in a second heating step in the DSC.

FIG. 1A shows the DSC curve (temperature-heat flow graph) in the temperature falling step, and FIG. 1B shows that in the second heating step. A baseline shift of mPPhen2P in the endothermic direction is found at around 135° C. in the second heating step. This indicates the glass transition of mPPhen2P from a powder state, which reveals that mPPhen2P is a compound having a glass transition temperature (Tg). Note that mPPhen2P is in a supercooled liquid state, i.e., in a state including a melted state, at this temperature or higher.

In general, Tg is defined as a temperature at which a baseline shift in the endothermic direction occurs. FIG. 2 is an enlarged view of FIG. 1B. As shown in FIG. 2, Tg can be a temperature at an intersection of a baseline on the low-temperature side and a line of rising of the baseline.

Here, as seen in the graph, the baseline shift of mPPhen2P is accompanied by an endothermic peak because of enthalpy relaxation. Owing to the enthalpy relaxation, the glass state can be stabilized more. The energy of the endothermic peak due to the enthalpy relaxation in mPPhen2P (an integral value from a rising tail to a falling tail (approximately 130° C. to 175° C.)) was as high as 3.6 J/g, revealing that mPPhen2P easily keeps a stable glass state. Accordingly, a light-emitting device using a compound having an endothermic peak due to enthalpy relaxation can have higher tolerance for a heating step and favorable display quality. The energy of an endothermic peak due to enthalpy relaxation is preferably higher than or equal to 1 J/g, further preferably higher than or equal to 3 J/g, still further preferably higher than or equal to 5 J/g. Note that stabilization due to enthalpy relaxation has its limit and the upper limit is approximately 20 J/g; thus, the energy of an endothermic peak due to enthalpy relaxation is preferably lower than or equal to 20 J/g.

It is found from FIG. 2 that at least three endothermic peaks due to enthalpy relaxation exist approximately from 130° C. to 175° C. in the second heating step. This indicates that mPPhen2P includes a plurality of kinds of glass states in the above temperature range and thus has a high level of amorphousness.

An endothermic peak other than the peaks due to enthalpy relaxation is not found in the second heating step, and a melting point is not found. This indicates that no crystal existed in the sample.

A noticeable exothermic peak is found in neither the second heating step nor the temperature falling step in the DSC measurement. That is, noticeable cold crystallization or crystallization of mPPhen2P was not seen in this measurement.

The temperature of the sample was returned to room temperature and the state thereof was checked. As a result, glassy mPPhen2P was adhered also to a lid of the sample pan, revealing that mPPhen2P had been melted.

The above results show that mPPhen2P of one embodiment of the present invention does not easily crystallize or aggregate.

Note that peaks at around 350° C. to 360° C. in the temperature falling step and at around −10° C. to 5° C. in the heating step are peaks appearing due to control of the apparatus, and do not indicate the thermophysical property of mPPhen2P.

The thermophysical property of 2mPCCzPDBq was measured using powder 2mPCCzPDBq in a manner similar to that of mPPhen2P. First, under a nitrogen stream, 5.0 mg of powder 2mPCCzPDBq was put in an aluminum sample pan (product number: 02190041), the temperature was raised from room temperature to 380° C. (first heating step), and the temperature was kept at 380° C. for three minutes. Then, the temperature was lowered from 380° C. to −10° C. at 40° C./min (temperature falling step). Then, the temperature was kept for three minutes, and then raised to 380° C. at 40° C./min (second heating step).

Figure 23A:
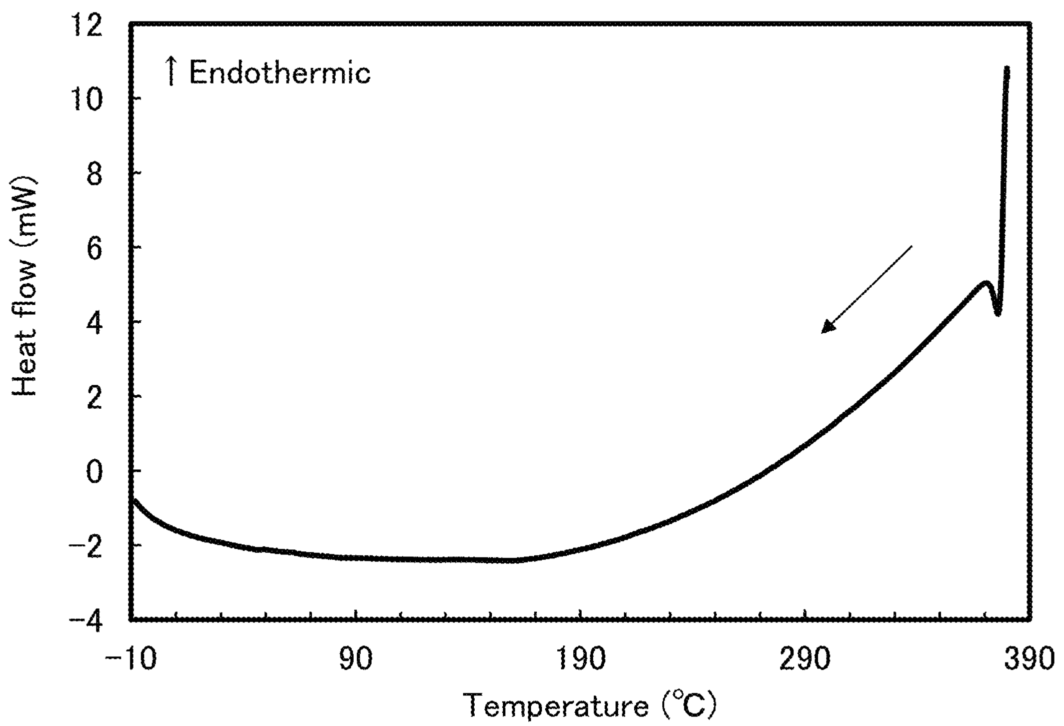
FIG. 23A shows a measurement result of 2mPCCzPDBq in a temperature falling step in DSC.
Figure 23B:
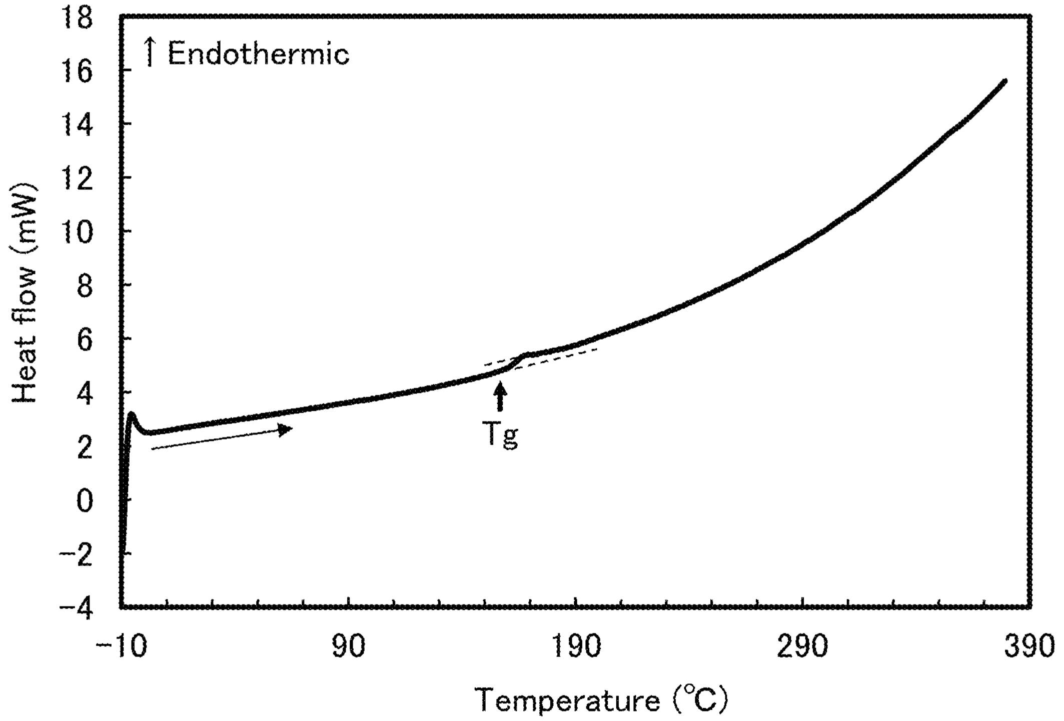
FIG. 23B shows a measurement result of 2mPCCzPDBq in a second heating step in the DSC.

FIG. 23A shows the DSC curve (temperature-heat flow graph) of 2mPCCzPDBq in the temperature falling step, and FIG. 23B shows that in the second heating step. A baseline shift of 2mPCCzPDBq in the endothermic direction is found at around 159° C. in the second heating step. This indicates the glass transition of 2mPCCzPDBq from a powder state, which reveals that 2mPCCzPDBq is a compound having a glass transition temperature (Tg). Note that 2mPCCzPDBq is in a supercooled liquid state, i.e., in a state including a melted state, at this temperature or higher.

Here, as seen in the graph, the baseline shift of 2mPCCzPDBq is accompanied by an endothermic peak because of enthalpy relaxation. Owing to the enthalpy relaxation, the glass state can be stabilized more. Thus, 2mPCCzPDBq is found to easily keep a stable glass state.

An endothermic peak other than the peaks due to enthalpy relaxation is not found in the second heating step, and a melting point is not found. This indicates that no crystal existed in the sample.

A noticeable exothermic peak is found in neither the second heating step nor the temperature falling step in the DSC measurement. That is, noticeable cold crystallization or crystallization of 2mPCCzPDBq was not seen in this measurement.

The temperature of the sample was returned to room temperature and the state thereof was checked. As a result, glassy 2mPCCzPDBq was adhered also to a lid of the sample pan, revealing that 2mPCCzPDBq had been melted.

The above results show that 2mPCCzPDBq of one embodiment of the present invention does not easily crystallize or aggregate.

Note that peaks at around 370° C. to 380° C. in the temperature falling step and at around −10° C. to 5° C. in the heating step are peaks appearing due to control of the apparatus, and do not indicate the thermophysical property of 2mPCCzPDBq.

Next, the thermophysical property of NBPhen was also measured with a differential scanning calorimeter (DSC8500 manufactured by PerkinElmer, Inc.) using powder NBPhen. First, under a nitrogen stream, 1.2 mg of powder NBPhen was put in an aluminum sample pan, the temperature was raised from room temperature to 360° C. (first heating step), and the temperature was kept at 360° C. for three minutes. Then, the temperature was lowered from 360° C. to −10° C. at 40° C./min (temperature falling step). Then, the temperature was kept for three minutes, and then raised to 360° C. at 40° C./min (second heating step).

Figure 24A:
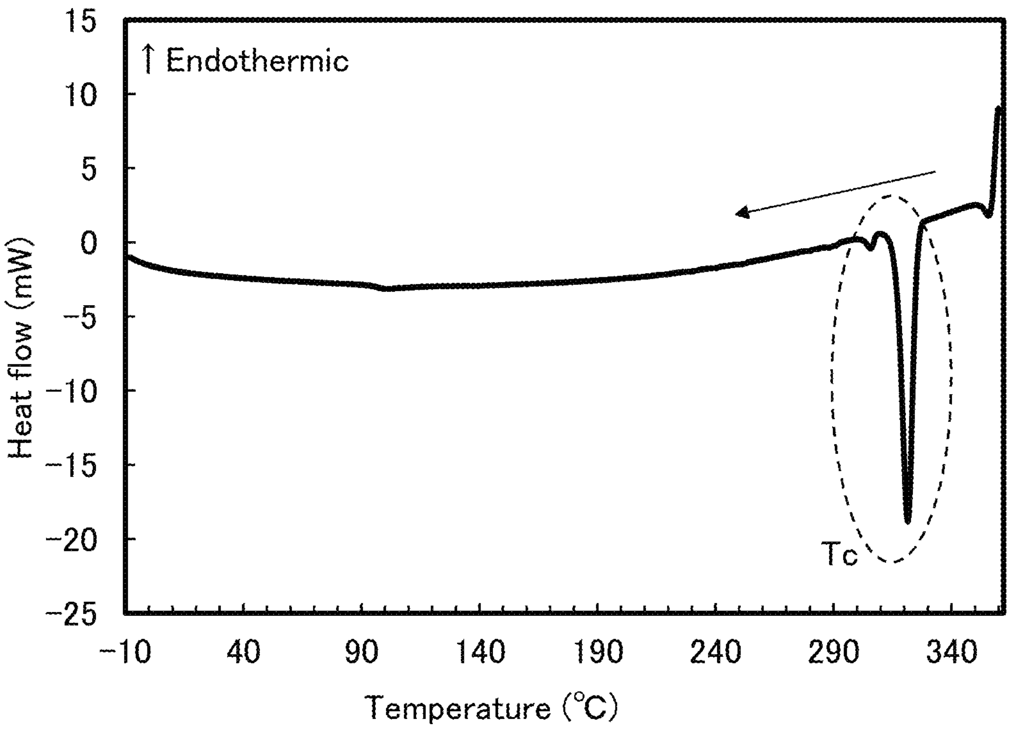
FIG. 24A shows a measurement result of NBPhen in a temperature falling step in DSC.
Figure 24B:
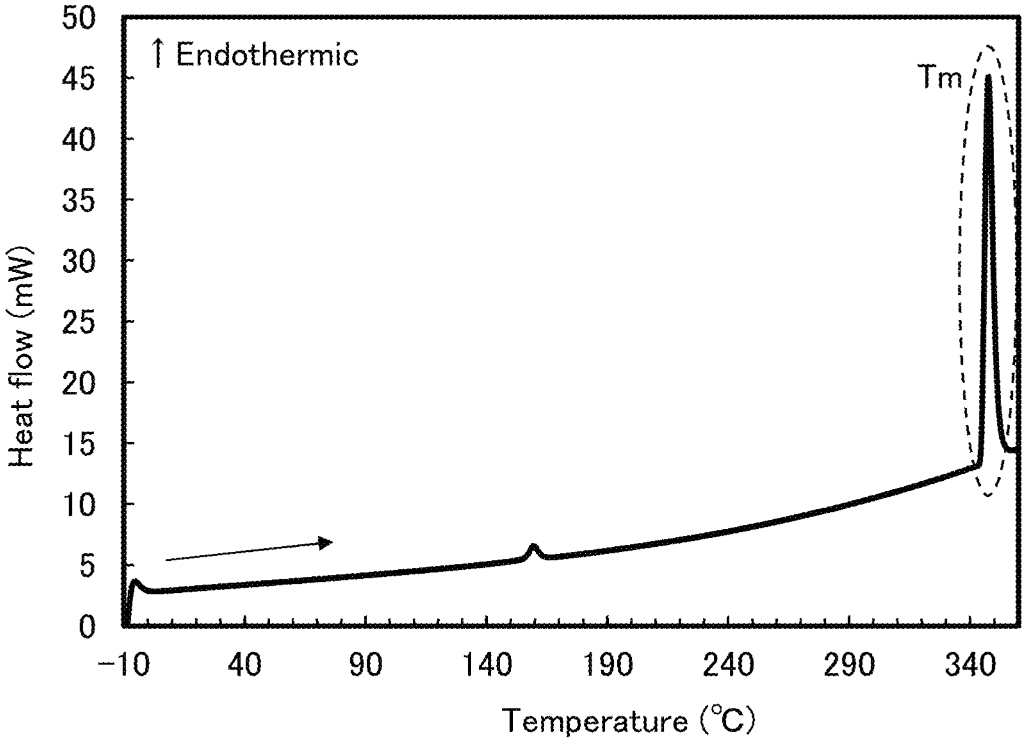
FIG. 24B shows a measurement result of NBPhen in a second heating step in the DSC.

FIG. 24A shows the DSC curve in the temperature falling step and FIG. 24B shows that in the second heating step. A crystallization peak of a large exothermic peak with an energy of 150 J/g is found at around 280° C. to 330° C. in the temperature falling step. Appearance of the crystallization peak means that NBPhen forms a crystal when cooled from the melted state.

A melting point peak of a large endothermic peak with an energy of 157 J/g is found at around 340° C. to 360° C. in the second heating step. Appearance of the melting point peak means that there existed a crystal in the sample. Since the amount of heat (150 J/g) of the crystallization peak in the temperature falling step is almost the same as the amount of heat (157 J/g) of the melting point peak, it is indicated that a crystal formed in the temperature falling step was melted in the heating step. Then, the temperature of the sample was returned to room temperature and the state thereof was checked. As a result, glassy NBPhen was adhered also to a lid of the sample pan, revealing that NBPhen had been melted.

Note that an endothermic peak without a baseline shift in the endothermic direction is found at around 160° C. in the second heating step. This suggests a phase transition from a crystal generated in the temperature falling step into another crystal state.

Note that peaks at around 350° C. to 360° C. in the temperature falling step and at around −10° C. to 5° C. in the second heating step are peaks appearing due to control of the apparatus, and do not indicate the thermophysical property of NBPhen.

From the above results, it is found that NBPhen easily crystallizes and aggregates, which does not satisfy the thermophysical property conditions of the first compound of one embodiment of the present invention.

Next, 4,8mDBtP2Bfpm and βNCCP were subjected to DSC measurement in a manner similar to that of mPPhen2P and NBPhen. The results show that 4,8mDBtP2Bfpm and βNCCP each have a thermophysical property corresponding to that of the first compound of one embodiment of the present invention. That is, when 4,8mDBtP2Bfpm and βNCCP were each subjected to the DSC measurement in such a manner that a cooling step was performed from the state in which the compound was melted in a first heating step and a second heating step was successively performed, an exothermic peak was not observed in the cooling step and an exothermic peak and a melting point peak were not observed in the second heating step.

Furthermore, the glass transition temperatures (Tg) of 2mPCCzPDBq, 4,8mDBtP2Bfpm, and βNCCP are 159° C., 135° C., and 135° C., respectively, which are favorable and higher than or equal to 120° C.

Next, mPPhen2P, 2mPCCzPDBq, and NBPhen were deposited over silicon substrates to form single-layer film samples, which were then subjected to a heat resistance test.

A method for fabricating Sample 11 (mPPhen2P), Sample 12 (2mPCCzPDBq), and Sample 13 (NBPhen) is described below.

First, a sample layer was formed over a silicon substrate with a vacuum deposition apparatus, sealed with a glass substrate, and cut into square shapes of 2 cm×2 cm to form the samples. At this time, the sample layer was not completely sealed to be prevented from being tightly covered. Furthermore, sealing was performed with an adjusted gap between the silicon substrate and the glass substrate (several ten micrometers to several hundred micrometers) so that the sample layer and the glass substrate were not in contact with each other. Note that steps from the formation of the sample layer to sealing were performed in the environment of Class 100 or a higher cleanliness level so that a dust would not be attached to the sample layer. After sealing, the samples were stored at room temperature (around 25° C.) under a nitrogen stream (in a desiccator).

For the sample layer of Sample 11, mPPhen2P was deposited by evaporation over the silicon substrate to a thickness of 15 nm.

For the sample layer of Sample 12, 2mPCCzPDBq was deposited by evaporation over the silicon substrate to a thickness of 15 nm.

For the sample layer of Sample 13, NBPhen was deposited by evaporation over the silicon substrate to a thickness of 15 nm.

Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 120° C. After one hour passed, the substrates were cooled down to 40° C. and placed in the air, and then the samples were taken out with tweezers. Note that this baking step was performed within 72 hours from the formation of the sample layers.

The samples formed by such a method were observed visually and with an optical microscope (large-size measuring microscope STM6-LM, Olympus Corporation). Note that this observation was performed within 72 hours from the baking step.

Figure 25A:
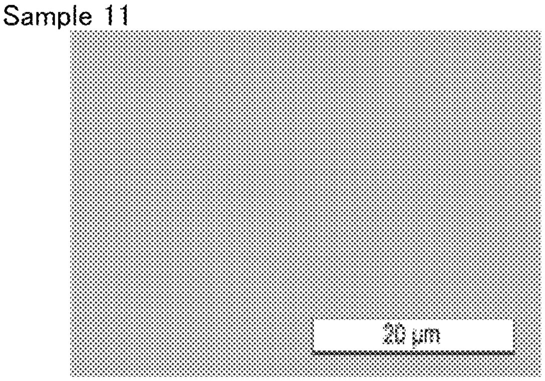
FIG. 25A, FIG. 25B, and FIG. 25C are micrographs of Sample 11 (mPPhen2P), Sample 12 (2mPCCzPDBq), and Sample 13 (NBPhen), respectively.
Figure 25B:
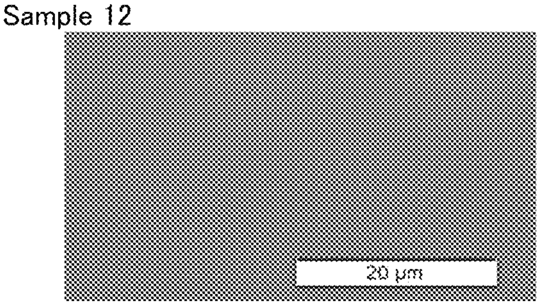
Figure 25C:
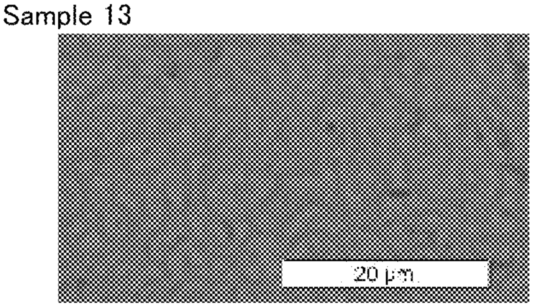

FIGS. 25A to 25C are photographs of the samples formed in this example (bright field observation at a magnification of 100 times or 1000 times). Note that FIGS. 25A and 25B show the samples baked at 120° C. and FIG. 25C shows the sample baked at 80° C.

The structures of the samples and the results based on FIGS. 25A to 25C are shown in Table 2. Note that in Table 2, a circle indicates absence of abnormality in film quality and a cross indicates presence of abnormality in film quality.

TABLE 2

| | | Heating temperature (° C.) | | | |
|---|---|---|---|---|---|
| Number | Sample structure | Ref | 80 | 100 | 120 |
| 11 | mPPhen2P | ○ | ○ | ○ | ○ |
| 12 | 2mPCCzPDBq | ○ | ○ | ○ | ○ |
| 13 | NBPhen | ○ | x | x | x |

The above results show that abnormality in film quality did not occur in Sample 11 (mPPhen2P) or Sample 12 (2mPCCzPDBq) even when the heat resistance test at a high temperature of 120° C. was performed and that abnormality in film quality occurred in Sample 13 (NBPhen) at a low temperature of 80° C.

That is, it is revealed that abnormality in film quality occurred at a low temperature of 80° C. in the entire organic film in Sample 13 using NBPhen having an exothermic peak and a melting point peak, and abnormality in film quality did not occur even at a high temperature of 120° C. in Sample 11 and Sample 12 using mPPhen2P and 2mPCCzPDBq, respectively, having neither an exothermic peak nor a melting point peak.

As described above, a film formed of a compound which does not have an exothermic peak in a cooling step or an exothermic peak and a melting point peak in a second heating step in differential scanning calorimetry performed in a specific measurement method is found to have high heat resistance. As a result, a light-emitting device using the compound can have tolerance for heat in a manufacturing process and favorable display quality.

The organic compound layers of Sample 1 and Sample 2 include 2mPCCzPDBq, 4,8mDBtP2Bfpm, and βNCCP each of which has a thermophysical property corresponding to that of the first compound of one embodiment of the present invention, with which a film having high heat resistance can be formed. Thus, Sample 1 and Sample 2 can be organic semiconductor devices having favorable characteristics with few display defects even after heating.

Meanwhile, difference in the result between Sample 1 and Sample 2 is derived from difference in the material used for the electron-transport layer to be a free surface in heating; mPPhen2P was used for Sample 1 and NBPhen was used for Sample 2. Since Sample 1 was subjected to heating at 80° C. in the state where mPPhen2P which satisfies the thermophysical property condition of the first compound of one embodiment of the present invention existed in the free surface of the organic compound layer, a defect in light emission was inhibited from occurring. On the other hand, NBPhen, which does not satisfy the thermophysical property condition of the first compound, was used in the free surface in Sample 2. Thus, a defect in light emission occurred in Sample 2 probably due to aggregation of the NBPhen layer.

Here, the device of Sample 2 and the film of Sample 12 both including NBPhen were subjected to the heating step at 80° C. for one hour. However, Sample 2 had much less abnormalities in film quality in the surface observed with an optical microscope.

This is probably because Sample 2 has a stacked-layer structure of organic compounds while Sample 12 is a single-layer film. That is, this is probably because in Sample 2, 2mPCCzPDBq, 4,8mDBtP2Bfpm, and βNCCP are included between NBPhen and the first electrode (inorganic layer), i.e., in the organic compound layer, and in Sample 12, NBPhen and the glass substrate (inorganic layer) are directly in contact with each other.

Note that it is preferable that an organic compound having the thermophysical property of the first compound, i.e., the first compound, be included as an organic compound between NBPhen and the first electrode in Sample 2.

The total thickness of layers containing compounds having the property of the first compound of one embodiment of the present invention is preferably 30% or more, further preferably 50% or more, still further preferably 80% or more, the most preferably 100% of the thickness of the organic compound layer. In this case, the thicknesses of layers containing respective compounds can be estimated by analysis in the depth direction with respect to a substrate by time-of-flight secondary ion mass spectrometry (ToF-SIMS), for example. In addition, the content of the compounds that have the property of the first compound in the respective layers is preferably 50% or more, further preferably 80% or more. Similarly, the content of the compounds that have the property of the first compound with respect to the organic compound layer is preferably 30% or more, further preferably 50% or more, still further preferably 80% or more. In this case, the content can be estimated from the absorption intensity ratio, refractive index intensity ratio, or the like obtained from solutions of the compounds by high performance liquid chromatography (HPLC).

As for another criterion for judging the melted state, when the temperature of a sample is returned to room temperature after the DSC measurement and the state looks different from the powder state before the measurement and the material is in the glassy state with transparency, the sample can be judged as having been melted. Alternatively, when a change in a sample from a powder state to a state with transparency can be observed in the heating step with a DSC apparatus having a function of taking an image of a sample during measurement, the sample can also be judged as having been melted.

In the DSC measurement, a temperature keeping period is set between the cooling step (temperature falling step) from the state where a compound is melted in the first heating step and the second heating step (temperature rising step). In order to relatively compare samples with good reproducibility, this keeping period is preferably the same among the samples; the keeping period is preferably longer than or equal to one minute and shorter than or equal to ten minutes, further preferably longer than or equal to one minute and shorter than or equal to three minutes. For the same reason, a temperature keeping period is set between the first heating step by which a compound is melted and the cooling step; the keeping time is preferably longer than or equal to one minute and shorter than or equal to ten minutes, further preferably longer than or equal to one minute and shorter than or equal to three minutes.

In the DSC measurement, the amounts of heat of a melting point peak, a crystallization peak, and a cold crystallization peak are each calculated as an integral value from a rising tail to a falling tail of each peak. It is most preferable that none of these peaks exists, in which case crystallization or aggregation is unlikely to occur. In the case where a peak exists, the energy of the peak is preferably lower than or equal to 20 J/g.

From the above results, with the use of the first compound (a compound having neither a melting point peak, nor a crystallization peak, nor a cold crystallization peak in DSC) of one embodiment of the present invention for an organic compound layer, an organic semiconductor device that has favorable characteristics with few display defects even after a heating step is performed can be manufactured. Specifically, it is found that poor film quality due to the heating step can be greatly inhibited in an organic semiconductor device manufactured using mPPhen2P corresponding to the first compound of one embodiment of the present invention in the free interface of an organic compound layer, and the organic semiconductor device achieves favorable display quality. That is, it is found that the first compound is preferably used in the free interface of an independently formed organic compound layer. Note that the layer preferably has a thickness of 10 nm or more, further preferably 15 nm or more. Moreover, this layer is preferably formed closer to the second electrode side than the light-emitting layer or the active layer is. In this case, favorable display performance, favorable efficiency, or a favorable lifetime can be expected.

Example 2

Example 2 shows some examples of compounds which do not have an exothermic peak in a cooling step or an exothermic peak and a melting point peak in a second heating step in DSC in such a manner that the cooling step is performed from the state where a compound is melted in a first heating step and the second heating is sequentially performed.

In this example, DSC measurement results of compounds other than mPPhen2P and NBPhen measured in Example 1 are shown. Since DSC is performed in a manner similar to that in Example 1, the detailed description is omitted.

Names and structure formulae of substances measured in this example are shown below.

Structure Formula (200) represents 2-[3-(2-triphenylenyl)phenyl]-1,10-phenanthroline (abbreviation: mTpPPhen). Structure Formula (201) represents 2-phenyl-9-(2-triphenylenyl)-1,10-phenanthroline (abbreviation: Ph-TpPhen). Structure Formula (202) represents 2-[4-(9-phenanthrenyl)-1-naphthalenyl]-1,10-phenanthroline (abbreviation: PnNPhen). Structure Formula (203) represents 2-[4-(2-triphenylenyl)phenyl]-1,10-phenanthroline (abbreviation: pTpPPhen). Structure Formula (300) represents N-[4-(9-phenyl-9H-carbazol-3-yl)phenyl]-N-[1,1':4',1"-terphenyl-2-yl]-9,9-dimethyl-9H-fluoren-2-amine (abbreviation: PCBFpTP-02). Structure Formula (400) represents 2-{4-[3-(N-phenyl-9H-carbazol-3-yl)-9H-carbazol-9-yl]phenyl}-4,6-diphenyl-1,3,5-triazine (abbreviation: PCCzPTzn). Structure Formula (401) represents 4-[4-(9'-phenyl-3,3'-bi-9H-carbazol-9-yl)phenyl]benzofuro[3,2-d]pyrimidine (abbreviation: 4PCCzPBfpm).

[Chemical Formula 11]

(200)

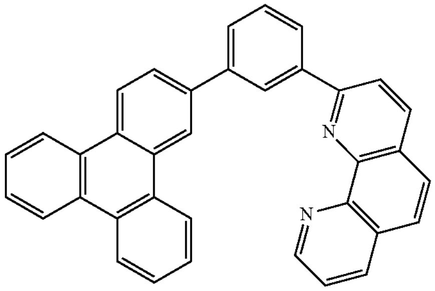

mTpPPhen (201)

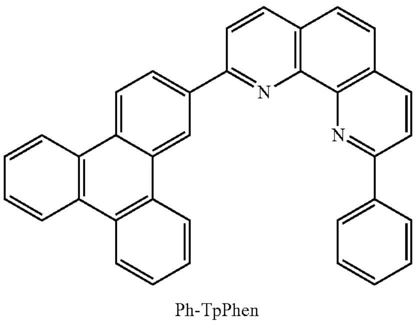

Ph-TpPhen (202)

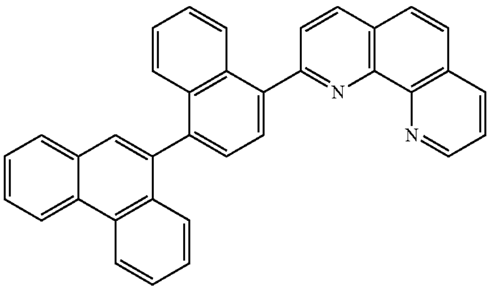

PnNPhen

-continued (203)

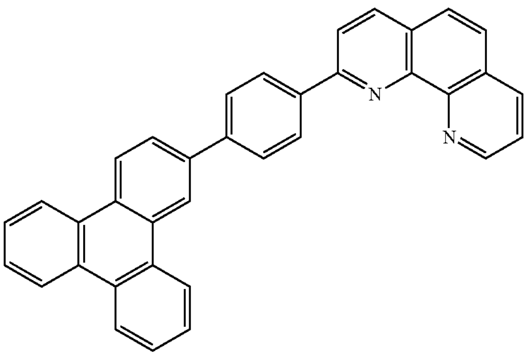

pTpPPhen (300)

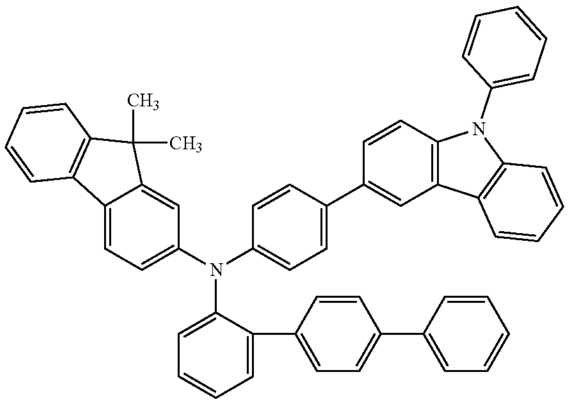

PCBFpTP-02

(400)

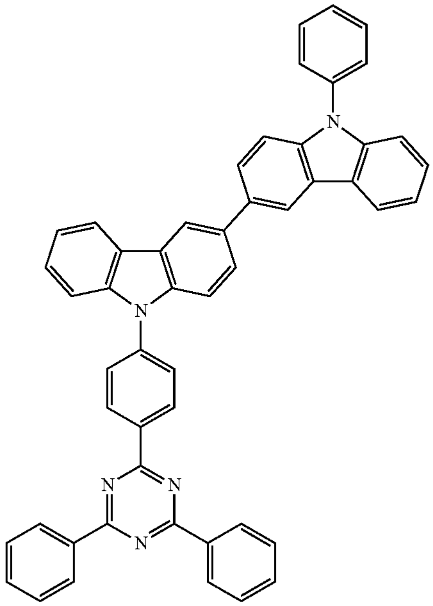

PCCzPTzn

-continued (401)

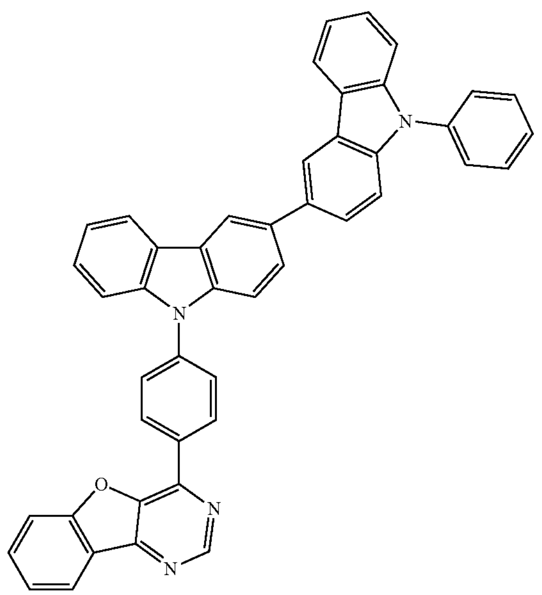

4PCCzPBfpm

Figure 26A:
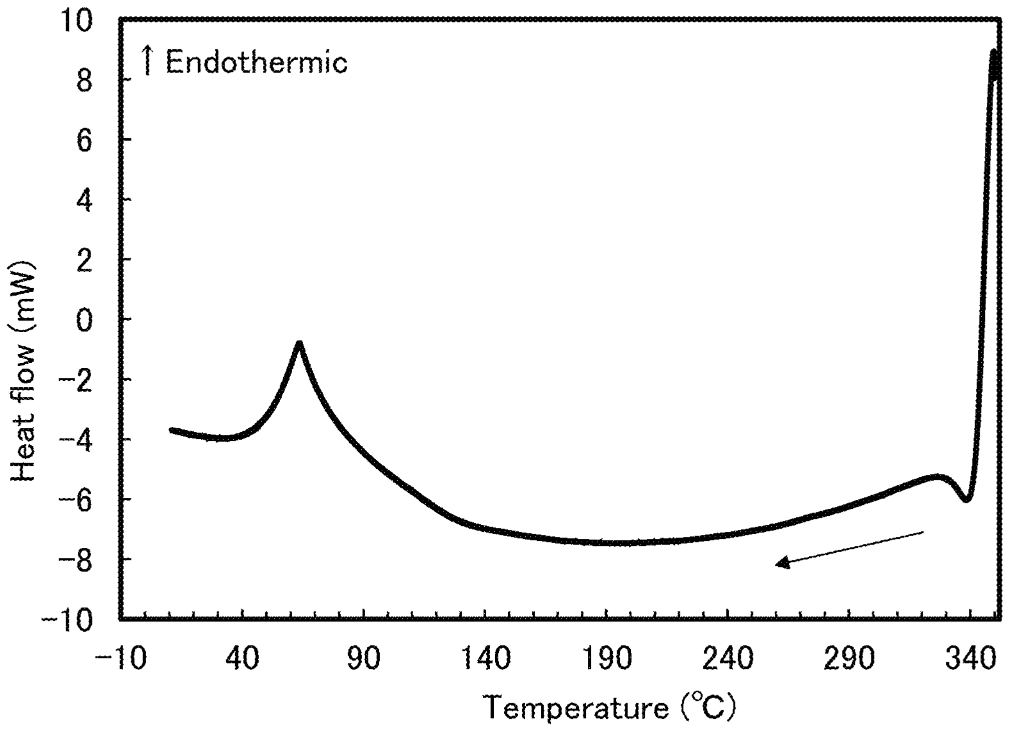
FIG. 26A shows a measurement result of mTpPPhen in a temperature falling step in DSC.
Figure 26B:
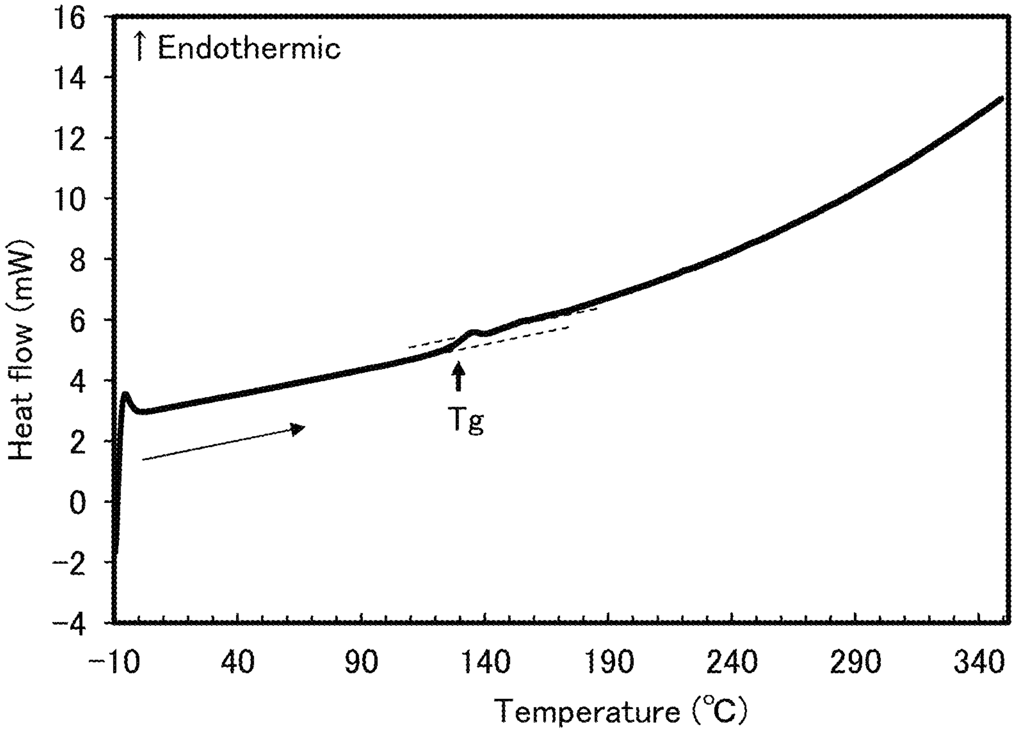
FIG. 26B shows a measurement result of mTpPPhen in a second heating step in the DSC.
Figure 27A:
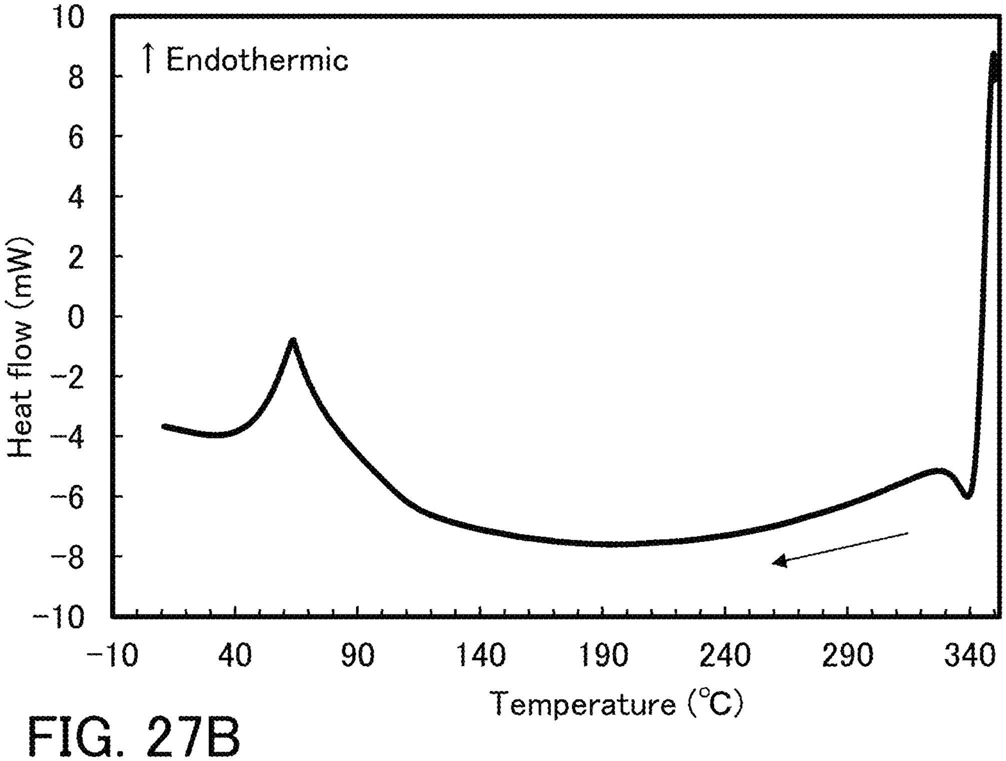
FIG. 27A shows a measurement result of Ph-TpPhen in a temperature falling step in DSC.
Figure 27B:
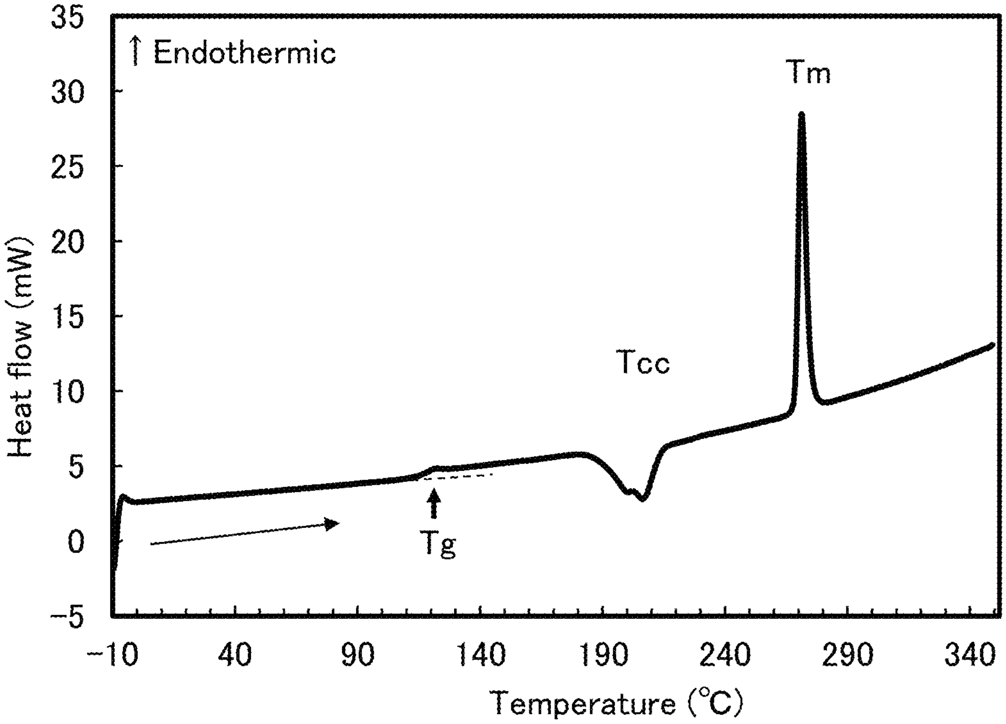
FIG. 27B shows a measurement result of Ph-TpPhen in a second heating step in the DSC.
Figure 28A:
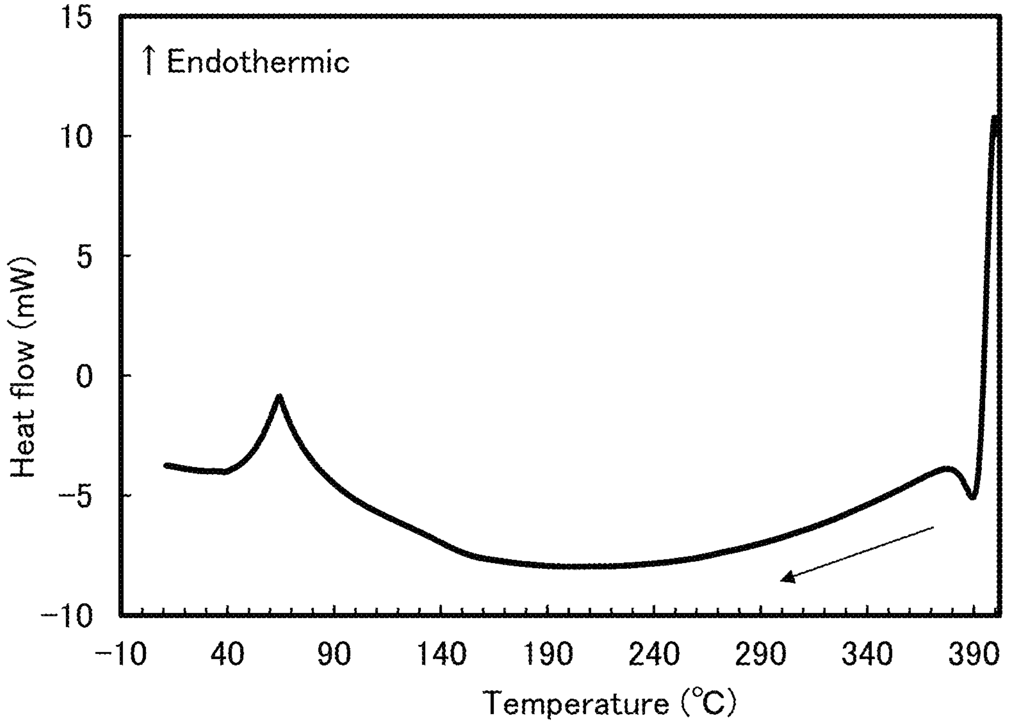
FIG. 28A shows a measurement result of PnNPhen in a temperature falling step in DSC.
Figure 28B:
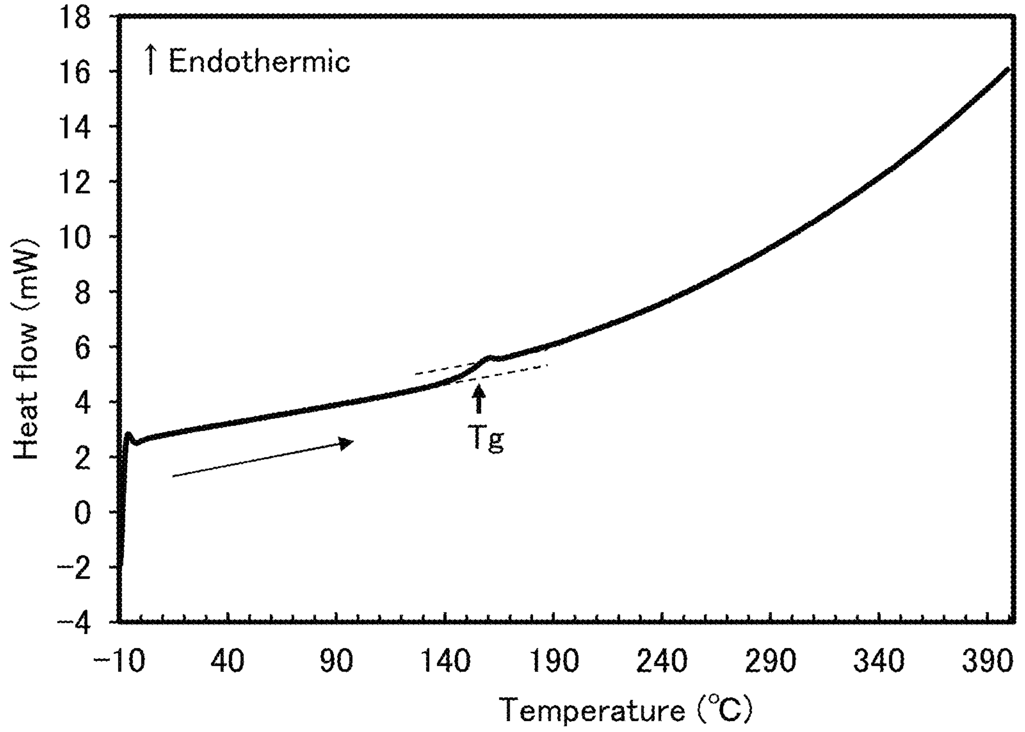
FIG. 28B shows a measurement result of PnNPhen in a second heating step in the DSC.
Figure 29A:
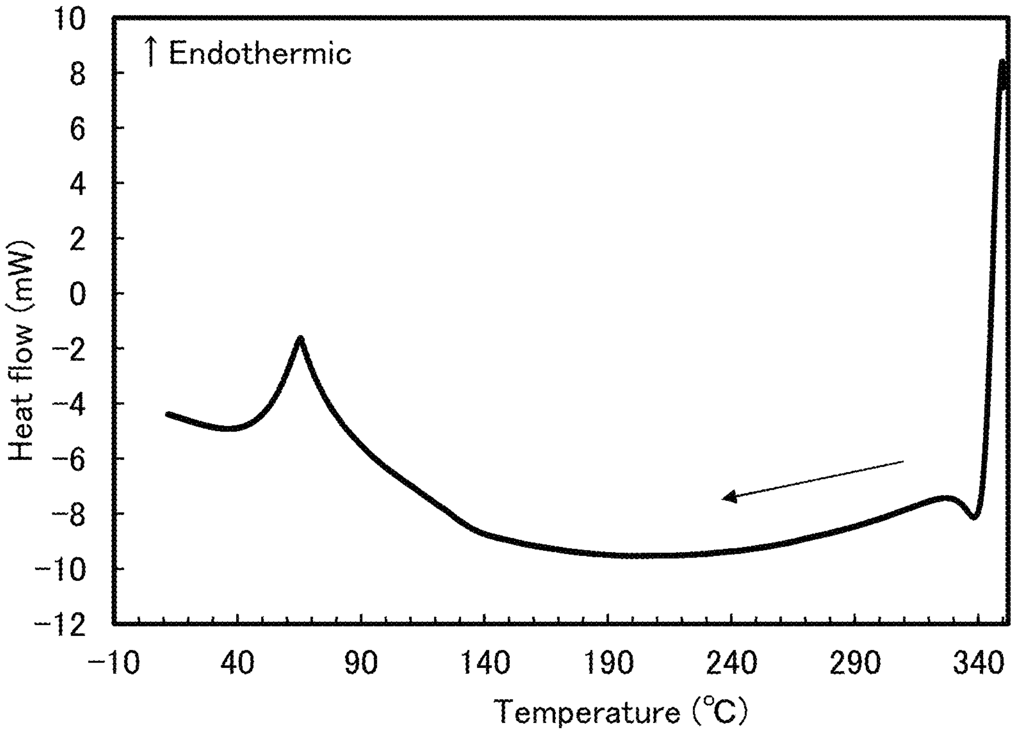
FIG. 29A shows a measurement result of pTpPPhen in a temperature falling step in DSC.
Figure 29B:
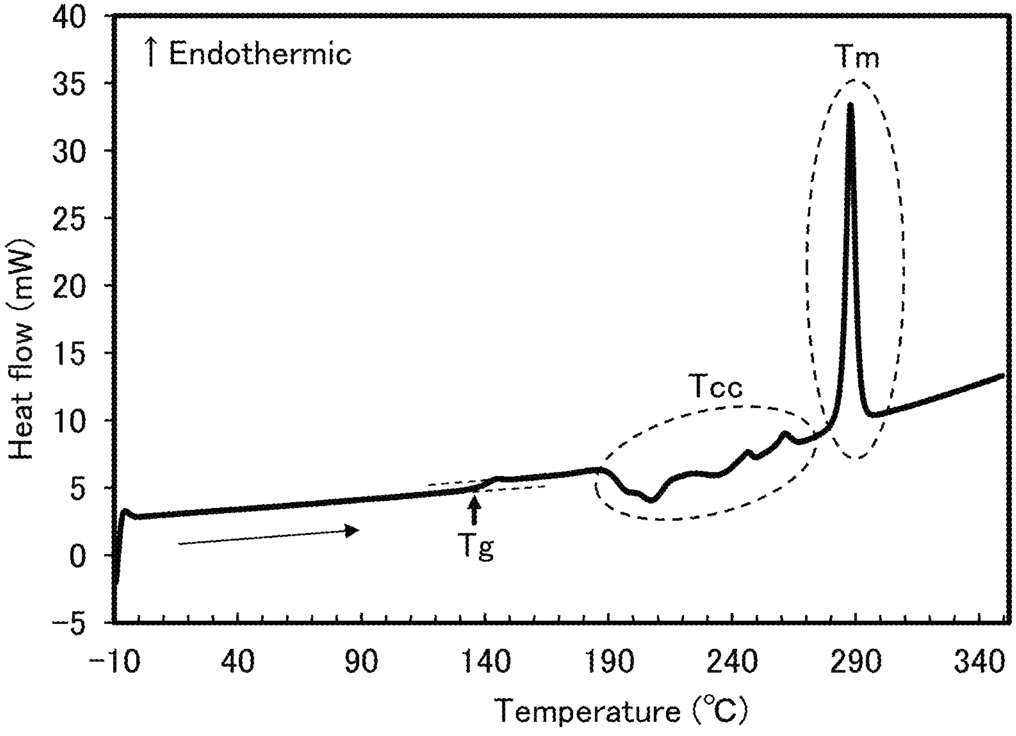
FIG. 29B shows a measurement result of pTpPPhen in a second heating step in the DSC.
Figure 30A:
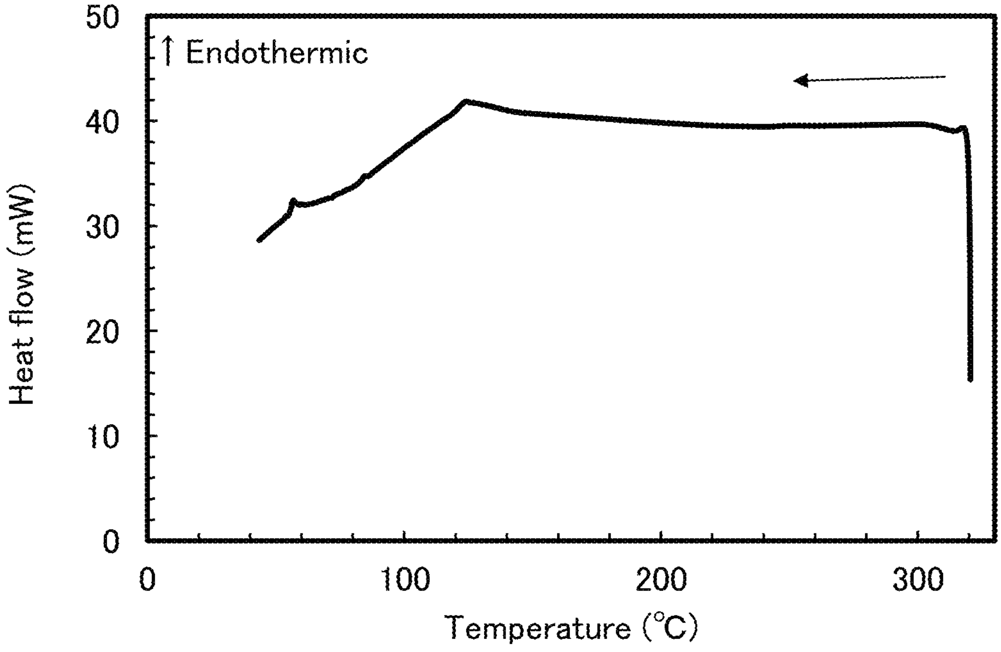
FIG. 30A shows a measurement result of PCBFpTP-02 in a temperature falling step in DSC.
Figure 30B:
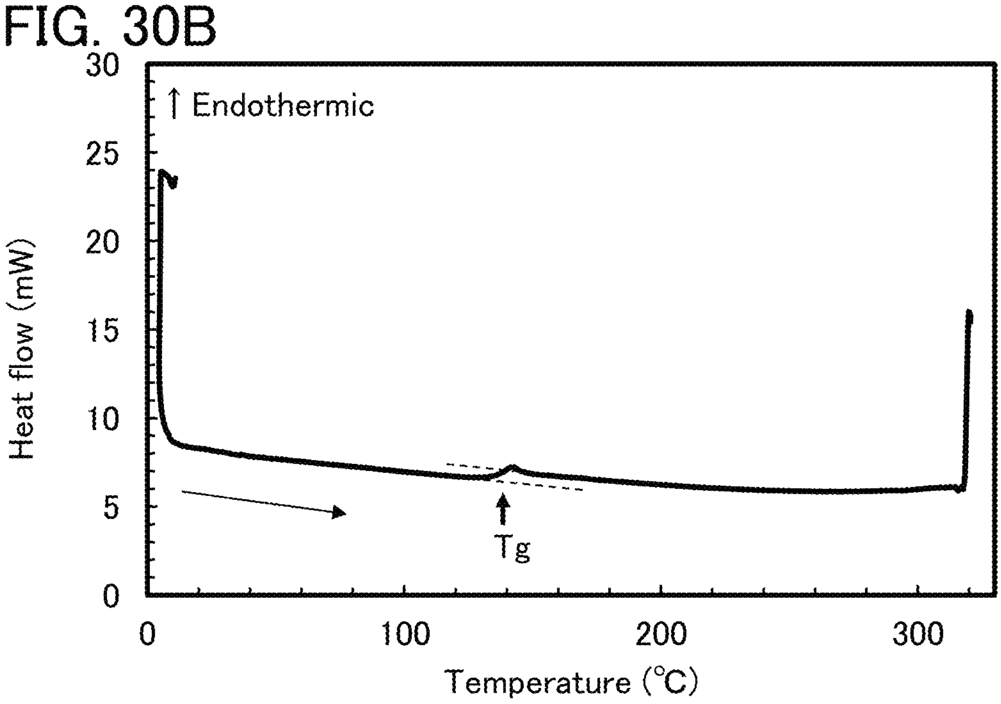
FIG. 30B shows a measurement result of PCBFpTP-02 in a second heating step in the DSC.
Figure 31A:
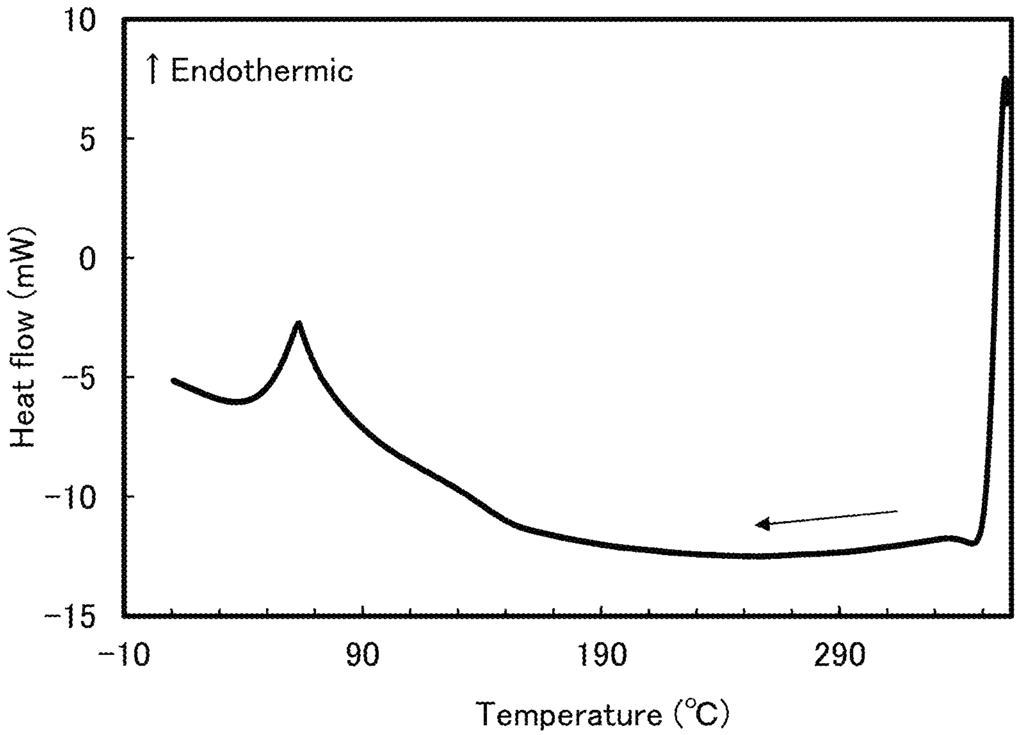
FIG. 31A shows a measurement result of PCCzPTzn in a temperature falling step in DSC.
Figure 31B:
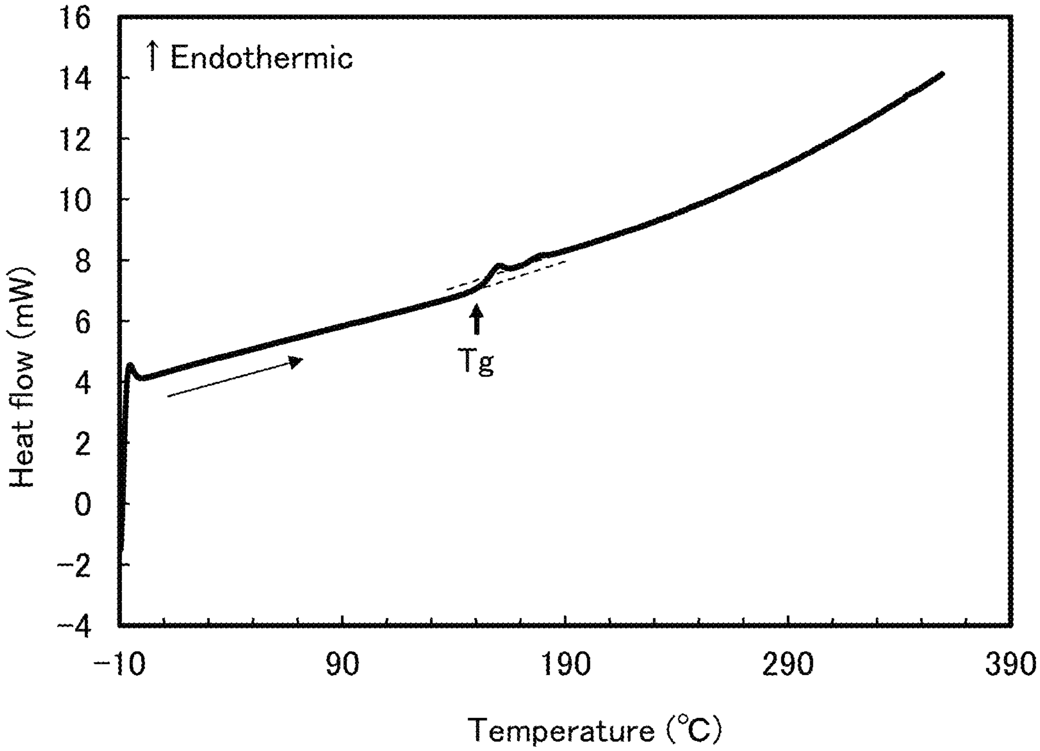
FIG. 31B shows a measurement result of PCCzPTzn in a second heating step in the DSC.
Figure 32A:
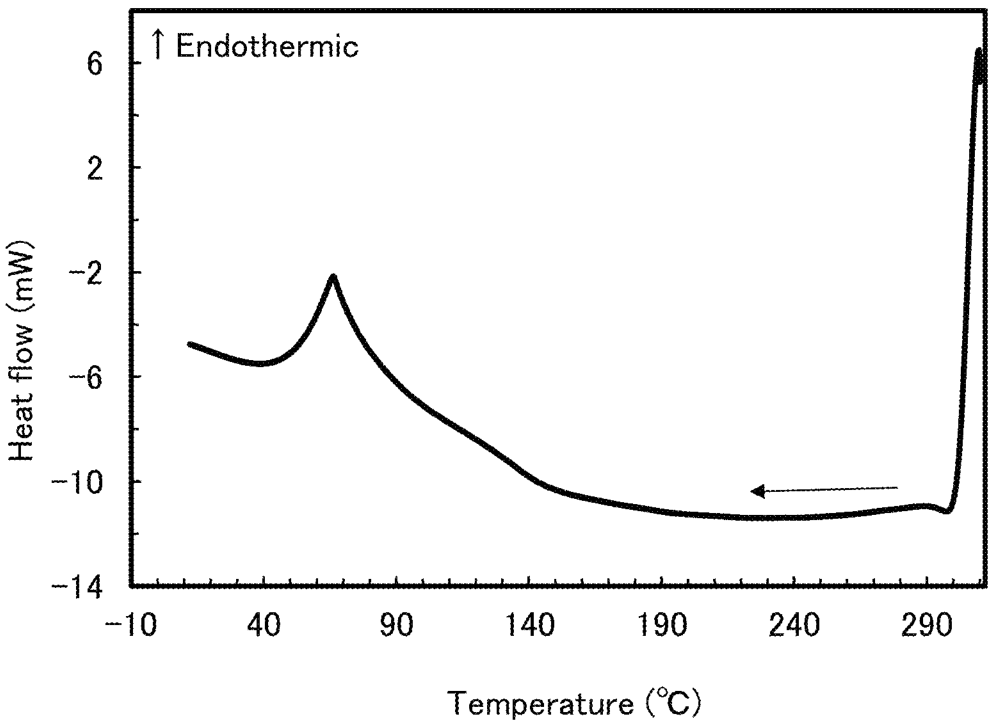
FIG. 32A shows a measurement result of 4PCCzPBfpm in a temperature falling step in DSC.
Figure 32B:
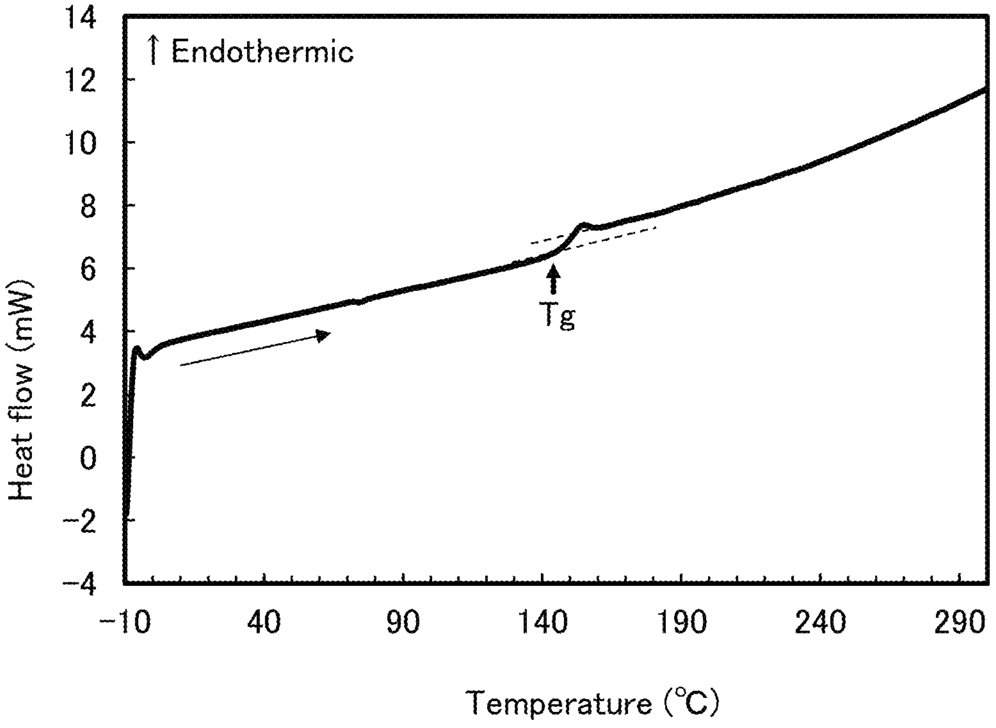
FIG. 32B shows a measurement result of 4PCCzPBfpm in a second heating step in the DSC.

FIGS. 26A and 26B show measurement results of mTpPPhen, FIGS. 27A and 27B show those of Ph-TpPhen, FIGS. 28A and 28B show those of PnNPhen, FIGS. 29A and 29B show those of pTpPPhen, FIGS. 30A and 30B show those of PCBFpTP-02, FIGS. 31A and 31B show those of PCCzPTzn, and FIGS. 32A and 32B show those of 4PCCzPBfpm. Note that the figure A of each of the above figures shows a chart in the cooling step, and the figure B thereof shows a chart in the second heating step. Since each figure A shows the cooling step, heat flow was measured at a temperature falling rate of 100° C./min from the right side to the left side in the chart. Since each figure B shows the heating step, heat flow was measured at a temperature rising rate of 40° C./min from the left side to the right side in the chart.

FIGS. 26A and 26B, FIGS. 28A and 28B, and FIGS. 30A to 32B show that mTpPPhen, PnNPhen, PCBFpTP-02, 4PCCzPBfpm, and PCCzPTzn are compounds each having no exothermic peak in a cooling step and neither an exothermic peak nor a melting point peak in a second heating step when DSC is performed in such a manner that a first heating step is performed from 25° C. or lower, the maximum temperature is kept for one minute to ten minutes (three minutes in general), the cooling step is performed to 25° C. or lower at a cooling rate of 40° C./min or higher, the temperature is kept at 25° C. or lower for one minute to ten minutes (three minutes in general), and the second heating step is performed at a temperature rising rate of 40° C./min or higher until the temperature reaches the keeping temperature after the first heating step. Meanwhile, FIGS. 27A and 27B and FIGS. 29A and 29B show that Ph-TpPhen and pTpPPhen are compounds each having an exothermic peak (Tcc) and a melting point peak (Tm) in the second heating step.

That is, with any of mTpPPhen, PnNPhen, PCBFpTP-02, 4PCCzPBfpm, and PCCzPTzn, an organic semiconductor device that has tolerance for heat in a processing step and favorable display performance can be manufactured.

Note that mTpPPhen, Ph-TpPhen, PnNPhen, and pTpPPhen are electron-transport materials having similar structures, and thus it is difficult to find a compound from the structure formula with which an organic semiconductor device with favorable heat resistance can be manufactured. However, an organic semiconductor device which has tolerance for heat in a processing step and favorable display performance can be manufactured with a compound which does not have an exothermic peak in a cooling step or an exothermic peak and a melting point peak in a second heating step when the cooling step is performed from the state where a compound is melted in a first heating step and the second heating step is subsequently performed.

Similar measurement was performed on the following compounds: 5,5',5''-(benzene-1,3,5-triyl)tri-1,10-phenanthroline (abbreviation: Phen3P), tris(8-quinolinolato) aluminum (abbreviation: $Alq_3$), 2-{3-[3-(N-phenyl-9H-carbazol-3-yl)-9H-carbazol-9-yl]phenyl}dibenzo[f,h]quinoxaline (abbreviation: 2mPCCzPDBq), 3,6-bis(9-phenyl-9H-carbazol-3-yl)-9-phenyl-9H-carbazole (abbreviation: PC2PC), 3,9-bis(9-phenyl-9H-carbazol-3-yl)-9H-carbazole (abbreviation: PCCzPC), 2,4,6-tris[3'-(pyridin-3-yl)-5'-tert-butyl-biphenyl-3-yl]-1,3,5-triazine (abbreviation: tBu-TmPPPyTz), 2,2'-(2,7-naphthalenediyldi-3,1-phenylene)bis[4,6-diphenyl-1,3,5-triazine] (abbreviation: mTznP2N), 9-(1-naphthyl)-10-[4-(2-naphthyl)phenyl]anthracene (abbreviation: αN-βNPAnth), and 2,2'-biphenyl-4,4'-diylbis(9-phenyl-1,10-phenanthroline) (abbreviation: PPhen2BP). Table 3 shows the measurement results. Structure formulae of these compounds are shown below.

[Chemical Formula 12]
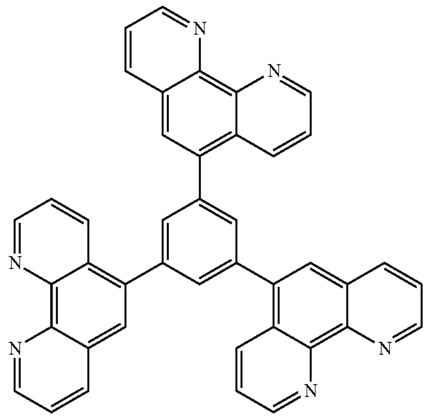
Phen3P
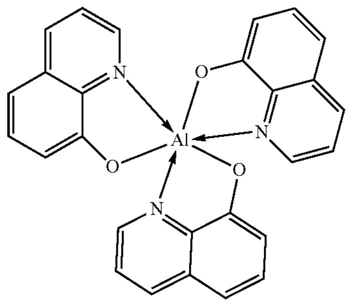
$Alq_3$
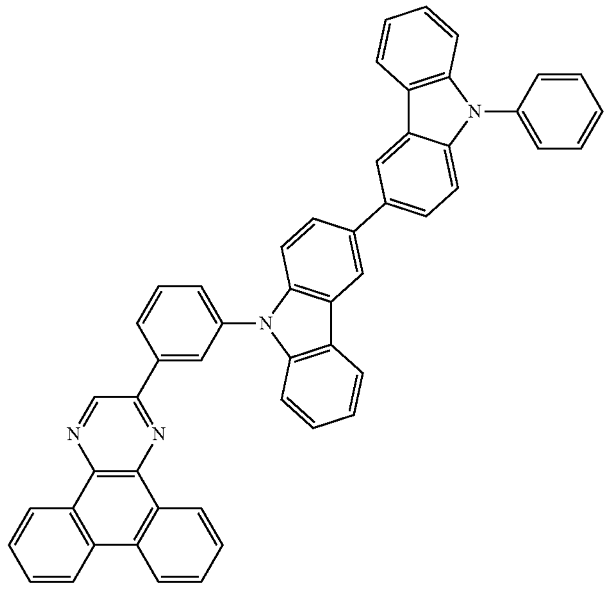
2mPCCzPDBq
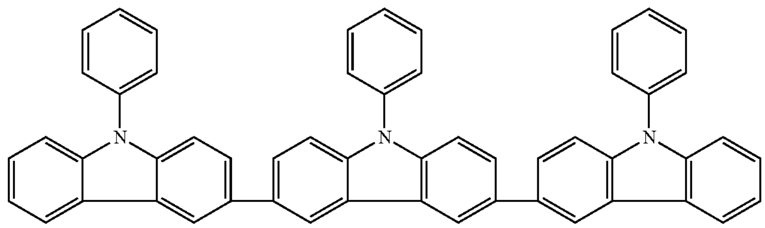
PC2PC -continued
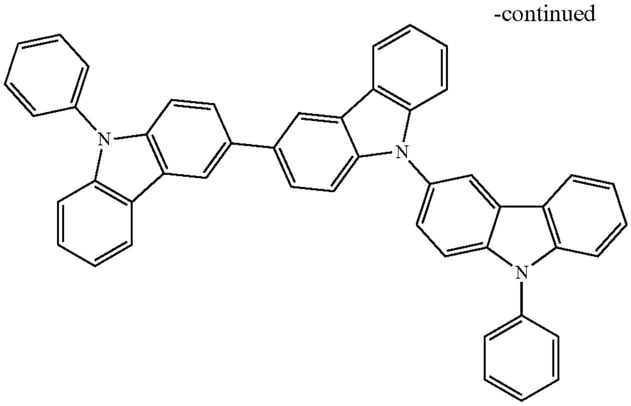
PCCzPC
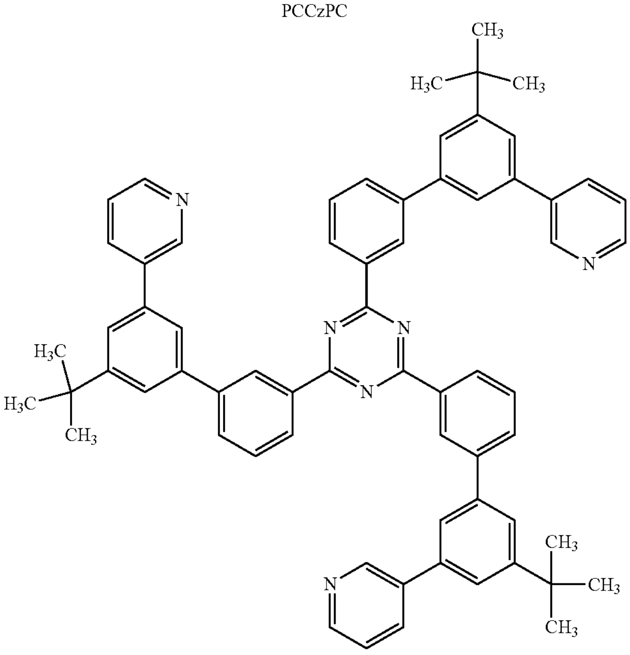
tBu-TmPPPyTz
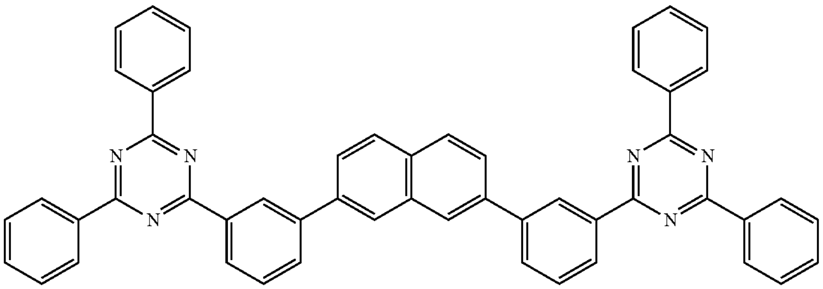
mTznP2N
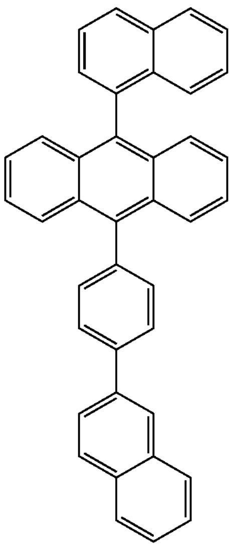
αN-βNPAnth -continued

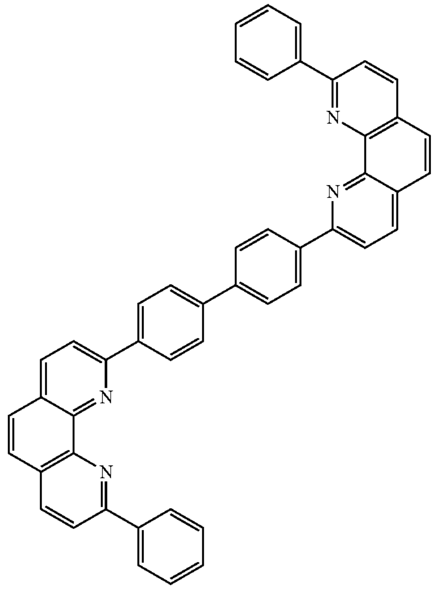

PPhen2BP

TABLE 3

| | Tg (° C.) | Tc | Tm | Maximum temperature (° C.) in temperature rising |
|---|---|---|---|---|
| Phen3P | 257 | N.D. | N.D. | 440 |
| $Alq_3$ | N.D. | N.D. | N.D. | 330 |
| 2mPCCzPDBq | 159 | N.D. | N.D. | 380 |
| PC2PC | 161 | N.D. | N.D. | 350 |
| PCCzPC | 149 | N.D. | N.D. | 350 |
| tBu-TmPPPyTz | 123 | N.D. | N.D. | 320 |
| mTznP2N | 132 | N.D. | N.D. | 400 |
| αN-βNPAnth | 131 | −13 J/g | 31 J/g | 300 |
| PPhen2BP | 166 | −61 J/g | 78 J/g | 400 |

Table 3 shows that Phen3P, $Alq_3$, 2mPCCzPDBq, PC2PC, PCCzPC, tBu-TmPPPyTz, and mTznP2N are compounds each having no exothermic peak in a cooling step and neither an exothermic peak nor a melting point peak in a second heating step when DSC is performed in such a manner that a first heating step is performed from 25° C. or lower, the maximum temperature in temperature rising is kept for one minute to ten minutes (three minutes in general), the cooling step is performed to 25° C. or lower at a cooling rate of 40° C./min or higher, the temperature is kept at 25° C. or lower for one minute to ten minutes (three minutes in general), and the second heating step is performed at a temperature rising rate of 40° C./min or higher until the temperature reaches the keeping temperature after the first heating step. Meanwhile, αN-βNPAnth and PPhen2BP are compounds each having an exothermic peak (Tcc) and a melting point peak (Tm) in the second heating step.

That is, Phen3P to mTznP2N listed in Table 3 are each the first compound of one embodiment of the present invention, with which an organic semiconductor device which has tolerance for heat in a processing step and favorable display performance can be manufactured.

From the structure formula, it is difficult to find, among these compounds, a compound with which an organic semiconductor device with favorable heat resistance can be manufactured. However, an organic semiconductor device which has tolerance for heat in a processing step and favorable display performance can be manufactured with a compound which does not have an exothermic peak in a cooling step or an exothermic peak and a melting point peak in a second heating step when the cooling step is performed from the state where a compound is melted in a first heating step and the second heating step is subsequently performed.

Note that Tg in Table 3 means the glass transition temperature. In addition, Tc (crystallization or cold crystallization) and Tm (melting point) each mean a specific heat capacity of an observed endothermic or exothermic peak, and N.D. means that no peak was observed.

Next, Phen3P and PPhen2BP were deposited over silicon substrates to form single-layer film samples, which were then subjected to a heat resistance test.

A method for fabricating Sample 20 (Phen3P) and Sample 21 (PPhen2BP) is described below.

First, a sample layer was formed over a silicon substrate with a vacuum deposition apparatus, sealed with a glass substrate, and cut into square shapes of 2 cm×2 cm to form the samples. At this time, the sample layer was not completely sealed to be prevented from being tightly covered. Furthermore, sealing was performed with an adjusted gap between the silicon substrate and the glass substrate (several ten micrometers to several hundred micrometers) so that the sample layer and the glass substrate were not in contact with each other. Note that steps from the formation of the sample layer to sealing were performed in the environment of Class 100 or a higher cleanliness level so that a dust would not be attached to the sample layer. After sealing, the samples were stored at room temperature (around 25° C.) under a nitrogen stream (in a desiccator).

For the sample layer of Sample 20, Phen3P was deposited by evaporation over the silicon substrate to a thickness of 15 nm.

For the sample layer of Sample 21, PPhen2BP was deposited by evaporation over the silicon substrate to a thickness of 15 nm.

Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 120° C. After one hour passed, the substrates were cooled down to 40° C. and placed in the air, and then the samples were taken out with tweezers. Note that this baking step was performed within 72 hours from the formation of the sample layers.

The samples formed by such a method were observed visually and with an optical microscope (large-size measuring microscope STM6-LM, Olympus Corporation). Note that this observation was performed within 72 hours from the baking step.

Table 4 shows the results. Note that in Table 4, a circle indicates absence of abnormality in film quality and a triangle indicates presence of abnormality in film quality in part.

TABLE 4

| | Heating temperature (° C.) | | | |
|---|---|---|---|---|
| | Ref | 80 | 100 | 120 |
| Sample 20 | ○ | ○ | ○ | ○ |
| Sample 21 | ○ | ○ | ○ | Δ |

The above results show that no abnormality in film quality occurred in Sample 20 of Phen3P in the heat resistance test at 120° C. In Sample 21 of PPhen2BP, on the other hand, abnormality in film quality did not occur at 80° C. and 100° C. but abnormality in film quality was found in an edge portion (an end portion of an area deposited by evaporation by a shadow mask method) of the deposited film at 120° C.

That is, abnormality in film quality occurred in Sample 21 using PPhen2BP having an exothermic peak and a melting point peak at a heating temperature lower than or equal to Tg (166° C.), i.e., 120° C., while abnormality in film quality did not occur in Sample 20 using Phen3P having neither an exothermic peak nor a melting point peak even when heat at 120° C. was applied. It is found that abnormality in film quality is likely to occur particularly in an edge portion of a deposited film when a material having an exothermic peak and a melting point peak exists in a free interface. Accordingly, it is found that heat treatment performed with a free interface including the first compound (a compound having neither an exothermic peak nor a melting point peak) is effective in the case of a high-resolution side-by-side organic electroluminescent device including many edge portions.

As described above, a film formed of a compound which does not have an exothermic peak in a cooling step or an exothermic peak and a melting point peak in a second heating step in differential scanning calorimetry performed in a specific measurement method is found to have high heat resistance. As a result, a light-emitting device using the compound can have tolerance for heat in a manufacturing process and favorable display quality.

Example 3

Synthesis Example 1

In this example, a method for synthesizing a hole-transport organic compound N-[4-(9-phenyl-9H-carbazol-3-yl)phenyl]-N-[1,1':4',1"-terphenyl-2-yl]-9,9-dimethyl-9H-fluoren-2-amine (PCBFpTP-02) which can be used for an organic semiconductor device of one embodiment of the present invention is described.

In a 200 mL three-neck flask equipped with a reflux pipe, 2.5 g (4.7 mmol) of N-[4-(9-phenyl-9H-carbazol-3-yl)phenyl]-9,9-dimethyl-9H-fluoren-2-amine, 1.5 g (4.7 mmol) of 2-bromo-1,1':4',1"-terphenyl, 0.91 g (9.5 mmol) of sodium t-butoxide, 0.30 mL of tri(t-butyl)phosphine, 35 mL of xylene, and 27 mg (46 μmol) of bis(dibenzylideneacetone) palladium(0) were put and the air in the system was replaced with nitrogen. The obtained mixture was heated at 85° C. for seven hours.

After stirring, water was added to the mixture in the three-neck flask, and an aqueous layer was subjected to extraction with toluene so that the aqueous layer and an organic layer (toluene layer) were separated from each other. The obtained organic layer was washed twice with water and then washed with saturated saline. The organic layer was dried with magnesium sulfate. Magnesium sulfate was removed by gravity filtration, and the obtained filtrate was purified by filtration using Celite and alumina. The obtained filtrate was concentrated and dried, whereby 3.9 g of a pale brown solid was obtained. The obtained solid was purified by high performance liquid chromatography (solvent: chloroform). The obtained fraction solution was concentrated, and the obtained solid was washed with hexane. The obtained solid was dried to give 2.6 g of an objective pale brown solid in a yield of 38%.

Then, 2.6 g of the pale brown solid was purified by a train sublimation method. In the purification by sublimation, the solid was heated for 40 hours under a pressure of 2.5 Pa with an argon flow rate of 15 mL/min. The heating temperature at this time was set to 305° C., 295° C., and 220° C. so as to have a temperature gradient. After the purification by sublimation, 1.8 g of an objective yellow solid was obtained at a collection rate of 69%. The synthesis scheme of this synthesis example is shown below.

[Chemical Formula 13]

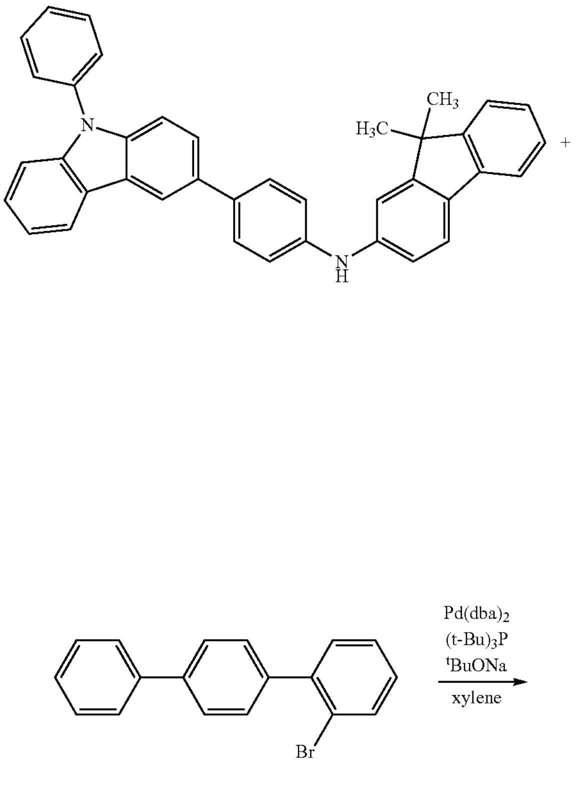

-continued

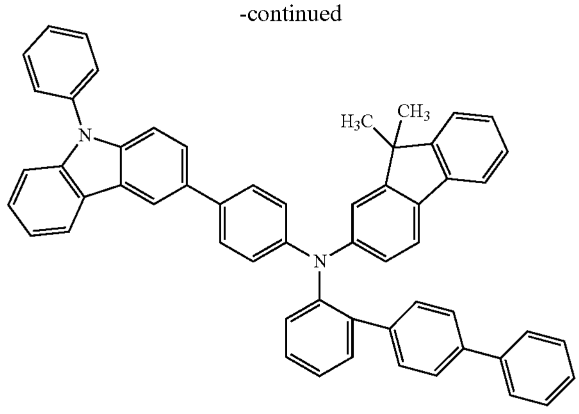

Figure 33A:
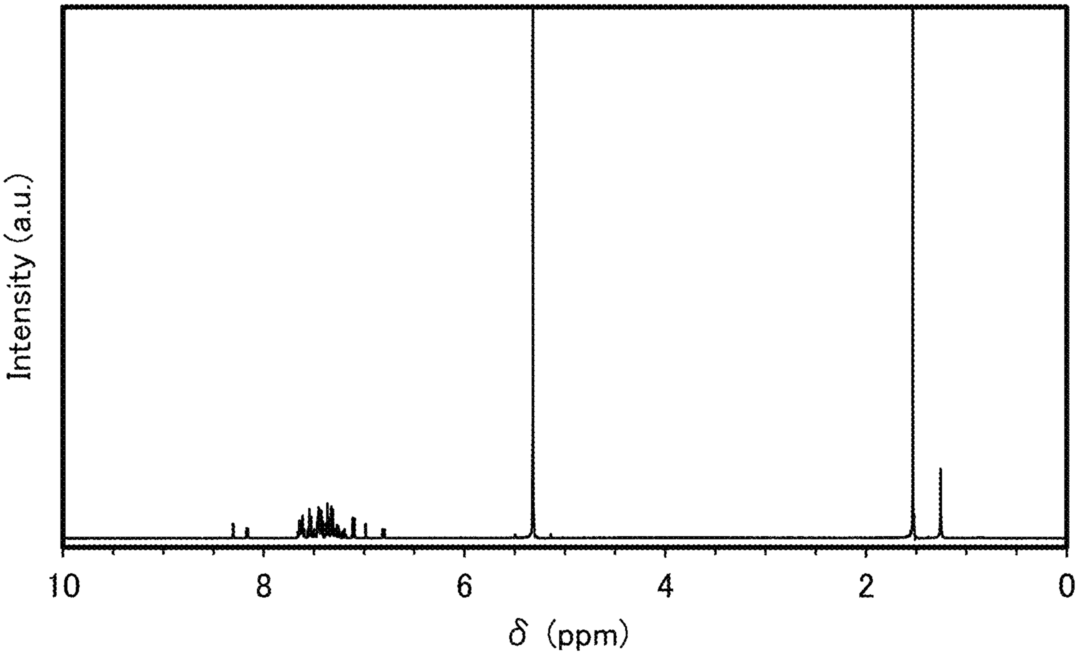
FIGS. 33A and 33B show a 1H-NMR measurement result of PCBFpTP-02.
Figure 33B:
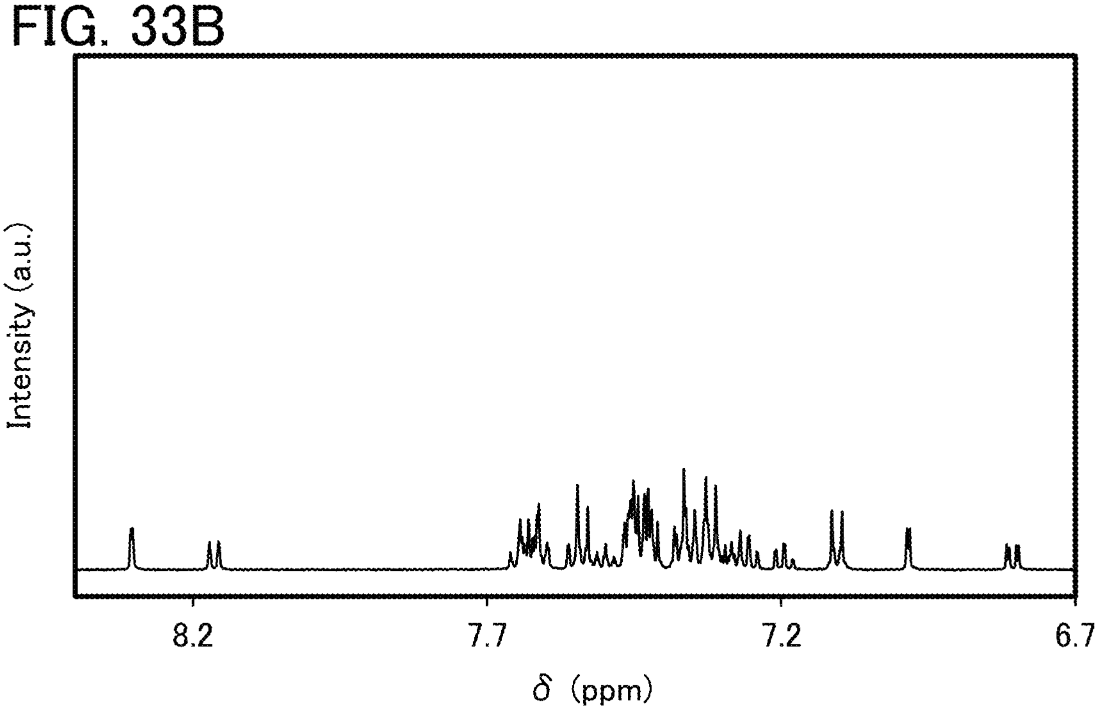

FIGS. 33A and 33B show the $^{1}H$ NMR spectrum of the obtained yellow solid. Note that FIG. 33B is a chart where the range of 6.7 ppm to 8.3 ppm in FIG. 33A is enlarged. Results of $^{1}H$ NMR measurement are shown below. The results show that PCBFpTP-02 was obtained in this synthesis example.

$^{1}H$ NMR (dichloromethane-$d_2$, 500 MHz): δ=8.30 (d, J=1.7 Hz, 1H), 8.16 (d, J=7.4 Hz, 1H), 7.66-7.60 (m, 5H), 7.56-7.41 (m, 13H), 7.38-7.24 (m, 11H), 7.20 (t, J=7.4 Hz, 1H), 7.10 (d, J=8.6 Hz, 2H), 6.98 (d, J=2.3 Hz, 1H), 6.81 (dd, J=8.0, 2.3 Hz, 1H), 1.26 (s, 6H).

The thermogravimetry-differential thermal analysis (TG-DTA) of PCBFpTP-02 was performed. The measurement was conducted using a high vacuum differential type differential thermogravimeter (TG-DTA 2410SA, manufactured by Bruker AXS K.K.). The measurement was performed under an atmospheric pressure at a temperature rising rate of 10° C./min under a nitrogen stream (flow rate: 200 mL/min).

In TG-DTA, the decomposition temperature, i.e., the temperature at which the weight obtained by thermogravimetry reduced by 5% of the initial weight, was found to be 470° C., which shows that PCBFpTP-02 is a substance with high heat resistance.

DSC was performed on PCBFpTP-02 with DSC8500 manufactured by PerkinElmer, Inc. In DSC, after the temperature was raised from −10° C. to 320° C. at a temperature rising rate of 40° C./min, the temperature was kept for one minute and then lowered to −10° C. at a temperature falling rate of 100° C./min. This operation was repeated twice successively.

From the DSC measurement result of the second cycle, the glass transition temperature of PCBFpTP-02 was found to be 133° C., which shows that PCBFpTP-02 is a substance with extremely high heat resistance.

Example 4

In this example, characteristics of a light-emitting device of one embodiment of the present invention are described. Structure formulae of main compounds used in this example are shown below.

[Chemical Formula 14]

(i)

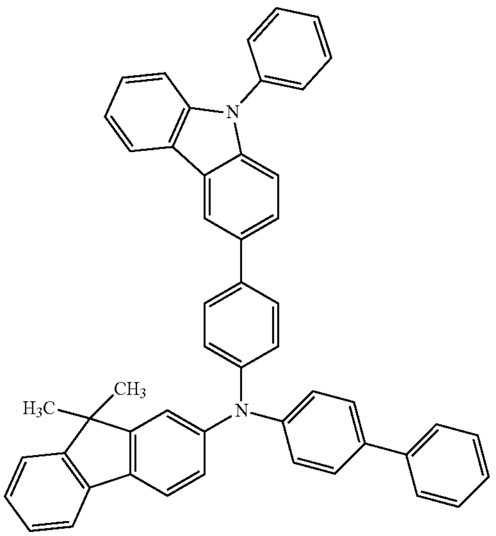

PCBBiF (vi)

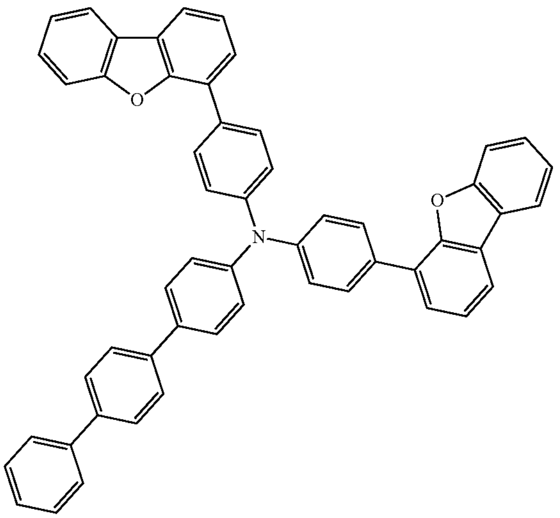

DBfBB1TP

-continued
(vii)
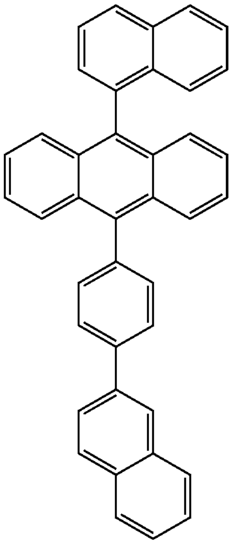
αN-βNPAnth
(viii)
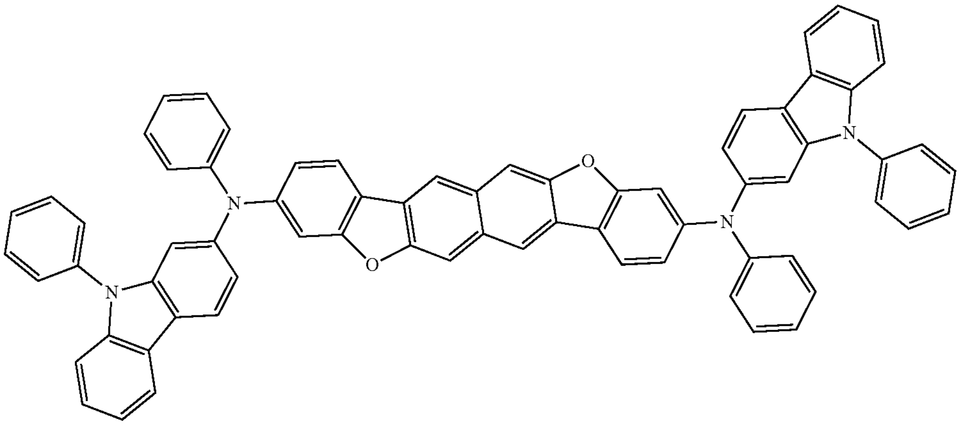
3,10PCA2Nbf(IV)-02
(v)
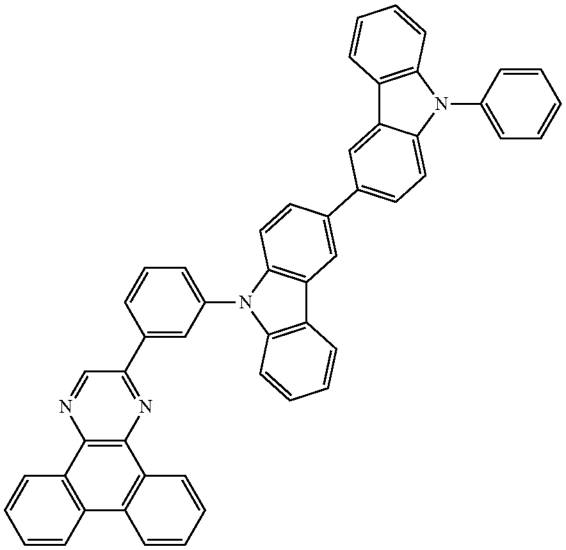
2mPCCzPDBq
(100)
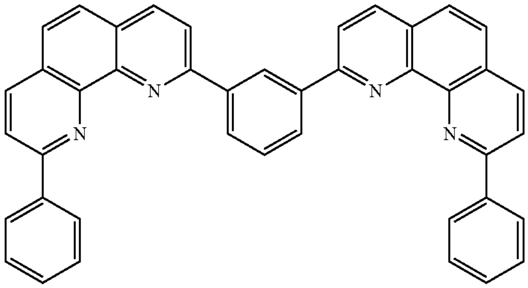
mPPhen2P (Method for Fabricating Light-Emitting Device 1)

First, over a silicon substrate, a 100-nm-thick alloy of silver, palladium, and copper (APC: Ag—Pd—Cu) as a reflective electrode and 50-nm-thick indium tin oxide containing silicon oxide (ITSO) as a transparent electrode were sequentially stacked from the substrate side by a sputtering method. This stacked-layer film was patterned by a photolithography method to form a first electrode. Note that the transparent electrode functions as an anode, and the transparent electrode and the reflective electrode are collectively regarded as the first electrode.

Next, in pretreatment for forming the light-emitting device over the substrate, the surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $1\times10^{-4}$ Pa, and was subjected to vacuum baking at 170° C. for 60 minutes in a heating chamber of the vacuum evaporation apparatus and then, the substrate was cooled down for approximately 30 minutes.

Then, the substrate provided with the first electrode was fixed to a substrate holder provided in the vacuum evaporation apparatus such that the surface on which the first electrode was formed faced downward. Over the first electrode, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structure Formula (i) and a fluorine-containing electron acceptor material with a molecular weight of 672 (OCHD-003) were deposited by co-evaporation to a thickness of 10 nm such that the weight ratio of PCBBiF to OCHD-003 was 1:0.03, whereby a hole-injection layer was formed.

Over the hole-injection layer, PCBBiF was deposited by evaporation to a thickness of 96 nm to form a first hole-transport layer, and then N,N'-bis[4-(dibenzofuran-4-yl)phenyl]-4-amino-p-terphenyl (abbreviation: DBfBB1TP) represented by Structure Formula (vi) was deposited by evaporation to a thickness of 10 nm to form a second hole-transport layer, whereby a hole-transport layer was formed. Note that the second hole-transport layer also functions as an electron-blocking layer.

Then, over the hole-transport layer, 9-(1-naphthyl)-10-[4-(2-naphthyl)phenyl]anthracene (abbreviation: αN-βNPAnth) represented by Structure Formula (vii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structure Formula (viii) were deposited by co-evaporation to a thickness of 25 nm such that the weight ratio of αN-βNPAnth to 3,10PCA2Nbf(IV)-02 was 1:0.015, whereby a light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structure Formula (v) was deposited by evaporation to a thickness of 20 nm to form a first electron-transport layer, and then 2,2'-(1,3-phenylene)bis(9-phenyl-1,10-phenanthroline) (abbreviation: mPPhen2P) represented by Structure Formula (100) was deposited by evaporation to a thickness of 15 nm to form a second electron-transport layer, whereby an electron-transport layer was formed. Note that the first electron-transport layer also functions as an hole-blocking layer.

Then, processing by a photolithography method was performed. The sample was taken out from the vacuum evaporation apparatus and exposed to the air, and then aluminum oxide was deposited to a thickness of 30 nm by an ALD method using trimethylaluminum (abbreviation: TMA) as a precursor and water vapor as an oxidizer, whereby a first sacrificial layer was formed.

Over the first sacrificial layer, indium, gallium, and molybdenum were deposited to a thickness of 50 nm by a sputtering method, whereby a second sacrificial layer was formed.

A photoresist over the second sacrificial layer was processed by a lithography method to surround the first electrode at a distance of 0.5 μm or 1.25 μm from the first electrode.

The second sacrificial layer was processed using the resist as a mask and an etching gas including $CF_4$, $O_2$, and He, and then the resist was removed using a solution including tetramethylammonium hydroxide (abbreviation: TMAH). Next, the first sacrificial layer was processed using the second sacrificial layer as a hard mask and an etching gas including fluoroform ($CHF_3$) and helium (He) at a flow rate ratio of $CHF_3$:He=1:49. After that, the electron-transport layer, the light-emitting layer, the hole-transport layer, and the hole-injection layer were processed using an etching gas including oxygen (02).

After processing, the second sacrificial layer was removed using an etching gas including $CF_4$, $O_2$, and He, while the first sacrificial layer remained. Then, aluminum oxide was deposited to a thickness of 15 nm by an ALD method, whereby a protective film was formed.

Next, a layer of a photosensitive high molecular material was formed over protective film over the first electrode by a photolithography method. After heating was performed at 100° C. for one hour under the air atmosphere, unnecessary portions of the first sacrificial layer and the protective film were removed by an etching method using an aqueous solution including hydrofluoric acid (HF), whereby the second electron-transport layer was exposed. At this time, the layer of the photosensitive high molecular material functions as a resist.

The substrate with the exposed second electron-transport layer was transferred into a vacuum evaporation apparatus where the pressure was reduced to approximately $1\times10^{-4}$ Pa, and vacuum baking was performed at 80° C. for 1.5 hours in a heating chamber of the vacuum evaporation apparatus. Then, the base was cooled down for approximately 30 minutes.

Next, lithium fluoride and ytterbium were deposited by evaporation to a thickness of 1.5 nm at a weight ratio of LiF:Yb=1:0.5, whereby an electron-injection layer was formed. Then, silver (Ag) and magnesium (Mg) were deposited by co-evaporation to a thickness of 25 nm at a volume ratio of Ag:Mg=1:0.1, whereby a second electrode was formed. In this manner, the light-emitting device of one embodiment of the present invention was fabricated.

Then, the light-emitting device was sealed using a glass substrate in a glove box containing a nitrogen atmosphere so as not to be exposed to the air. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, Light-emitting device 1 was fabricated.

Table 5 shows the device structure of Light-emitting device 1. Note that an MML process in Table 5 includes the above ALD deposition step to the removal step of the first and second sacrificial layers.

TABLE 5

| | | Film thick-ness (nm) | Light-emitting device1 |
|---|---|---|---|
| Second electrode | | 25 | Ag:Mg (1:0.1) |
| Electron-injection layer | | 1 | LiF:Yb (1:0.5) |
| | | MML process | |
| Electron-transport layer 2 | | 15 | mPPhen2P |
| Electron-transport layer 1 (Hole-blocking layer) | | 20 | 2mPCCzPDBq |
| Light-emitting layer | | 25 | αN-βNPAnth:3,10PCA2Nbf(IV)-02 (1:0.015) |
| Hole-transport layer | 2 | 10 | DBfBB1TP |
| | 1 | 96 | PCBBiF |
| Hole-injection layer | | 10 | PCBBiF:OCHD-003 (1:0.03) |
| First electrode | Transparent electrode | 50 | ITSO |
| | Reflective electrode | 100 | APC |

(Method for Fabricating Comparative Light-Emitting Device 1)

Comparative light-emitting device 1 is a light-emitting device fabricated in a continuous vacuum process without the MML process used for Light-emitting device 1. That is, in Comparative light-emitting device 1, the electron-injection layer was successively formed after the formation of the electron-transport layer.

Figure 34:
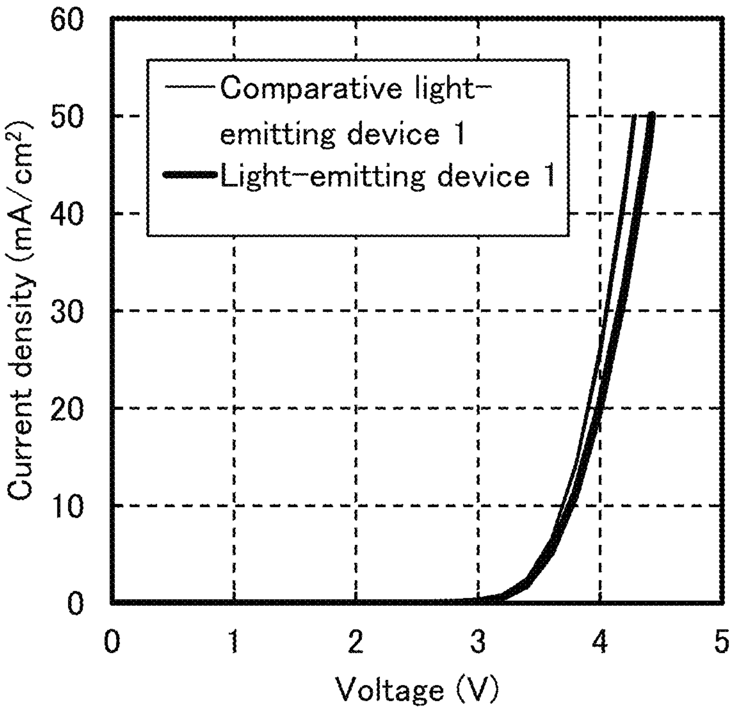
FIG. 34 shows the current density-voltage characteristics of Light-emitting device 1 and Comparative light-emitting device 1.
Figure 35:
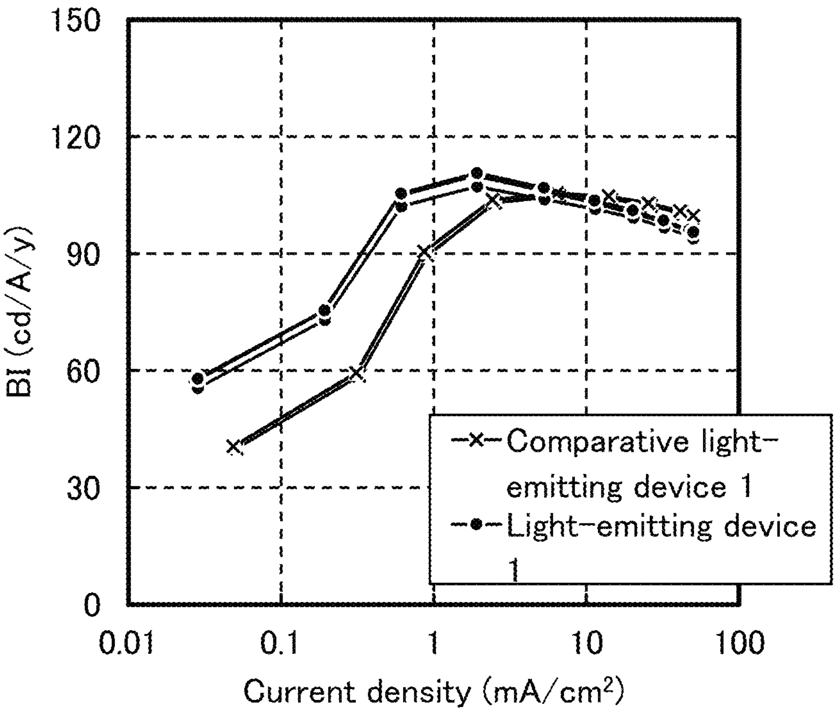
FIG. 35 shows blue index (BI)-current density characteristics of Light-emitting device 1 and Comparative light-emitting device 1.
Figure 36:
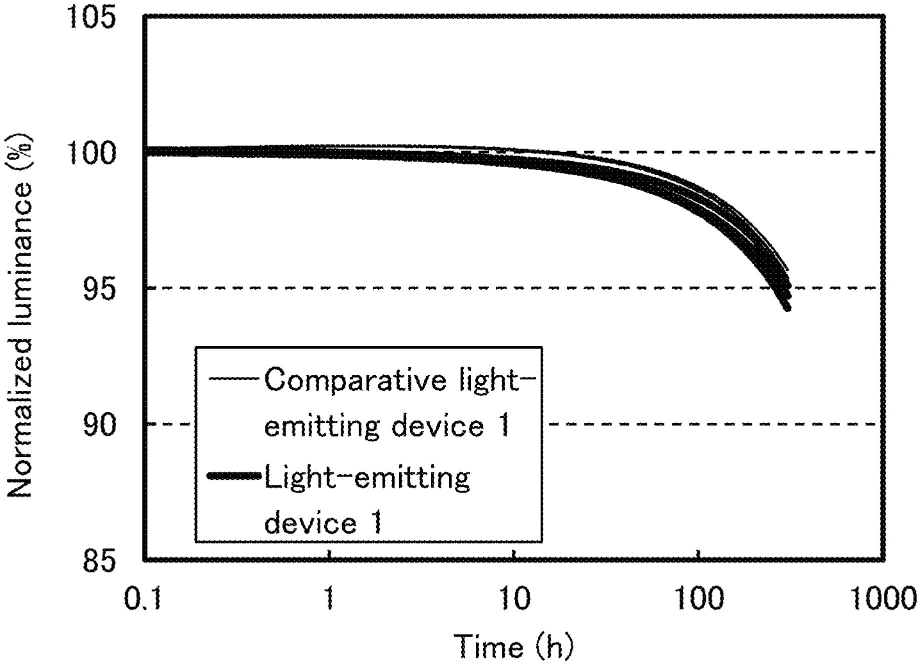
FIG. 36 shows changes in luminance of Light-emitting device 1 and Comparative light-emitting device 1 over driving time in constant current driving at a current density of 50 $mA/cm^2$.

FIG. 34 shows the current density-voltage characteristics of Light-emitting device 1 and Comparative light-emitting device 1; FIG. 35 shows blue index (BI)-current density characteristics thereof; and FIG. 36 shows changes in luminance thereof over driving time in constant current driving at a current density of 50 mA/cm$^2$. As in the graphs, both Light-emitting device 1 and Comparative light-emitting device 1 show favorable results.

Except for αN-βNPAnth, the materials included in the organic compound layer (from the hole-injection layer to the second electron-transport layer) of Light-emitting device 1 are each the above first compound (a compound having neither a melting point peak, nor a crystallization peak, nor a cold crystallization peak in DSC). In particular, the free interface of the organic compound layer subjected to the MML process includes the first compound. In addition, 88% of the organic compound layer subjected to the MML process is the first compounds.

Figure 37:
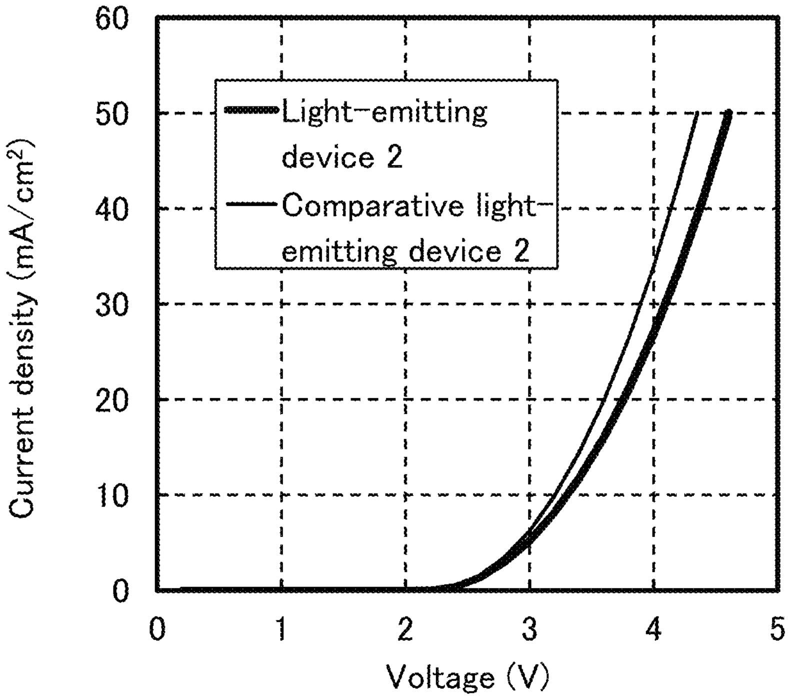
FIG. 37 shows the current density-voltage characteristics of Light-emitting device 2 and Comparative light-emitting device 2.
Figure 38:
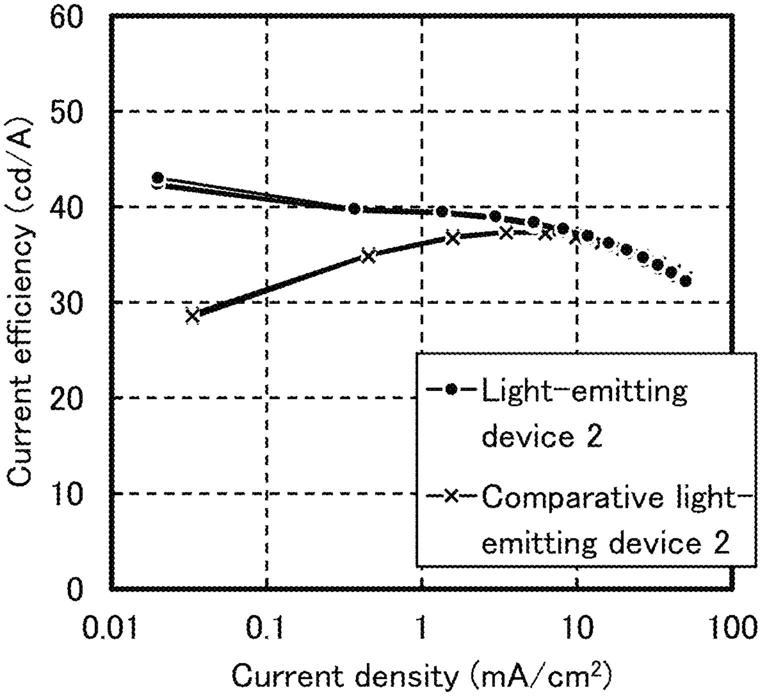
FIG. 38 shows blue index (BI)-current density characteristics of Light-emitting device 2 and Comparative light-emitting device 2.
Figure 39:
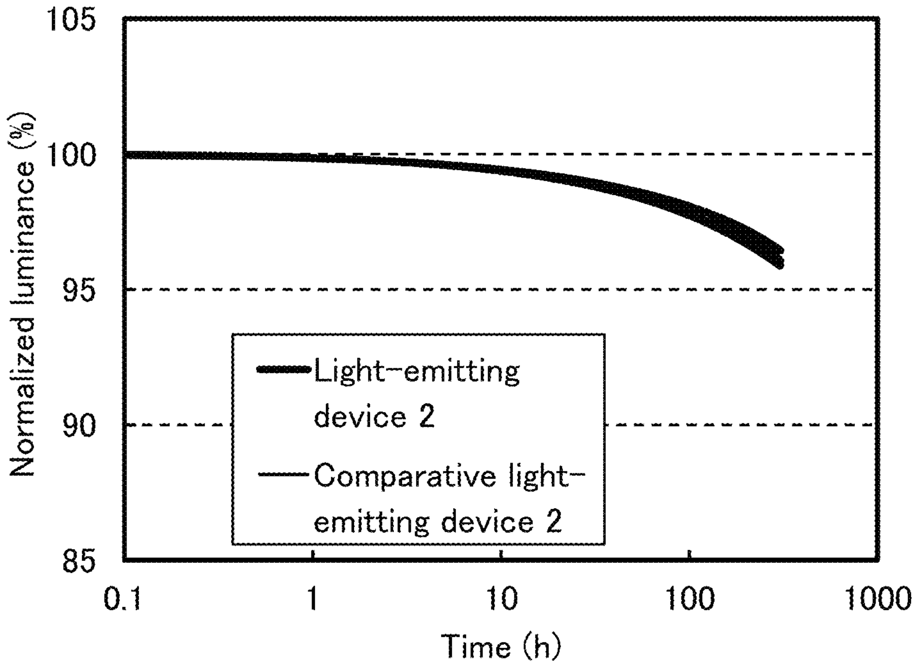
FIG. 39 shows changes in luminance of Light-emitting device 2 and Comparative light-emitting device 2 over driving time in constant current driving at a current density of 50 $mA/cm^2$.
Figure 40:
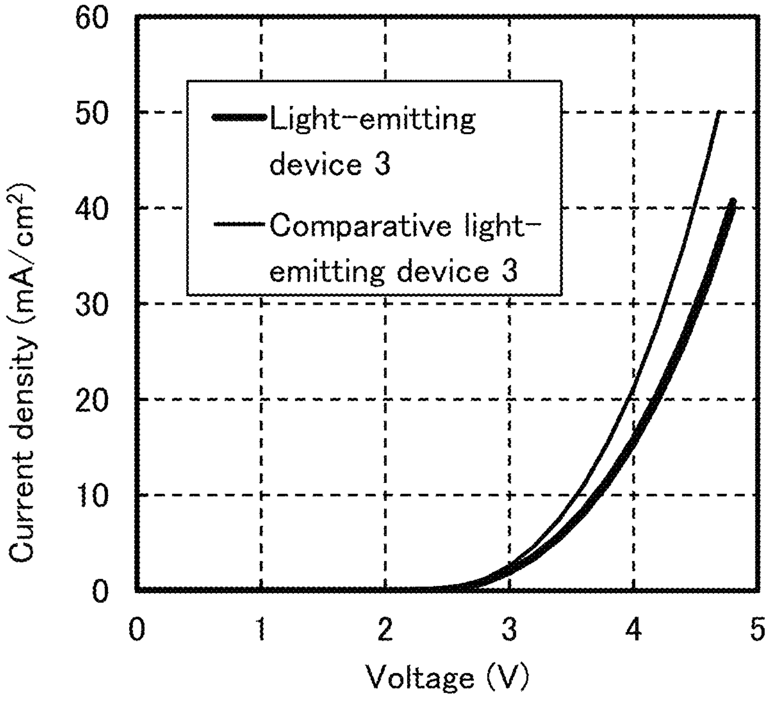
FIG. 40 shows the current density-voltage characteristics of Light-emitting device 3 and Comparative light-emitting device 3.
Figure 41:
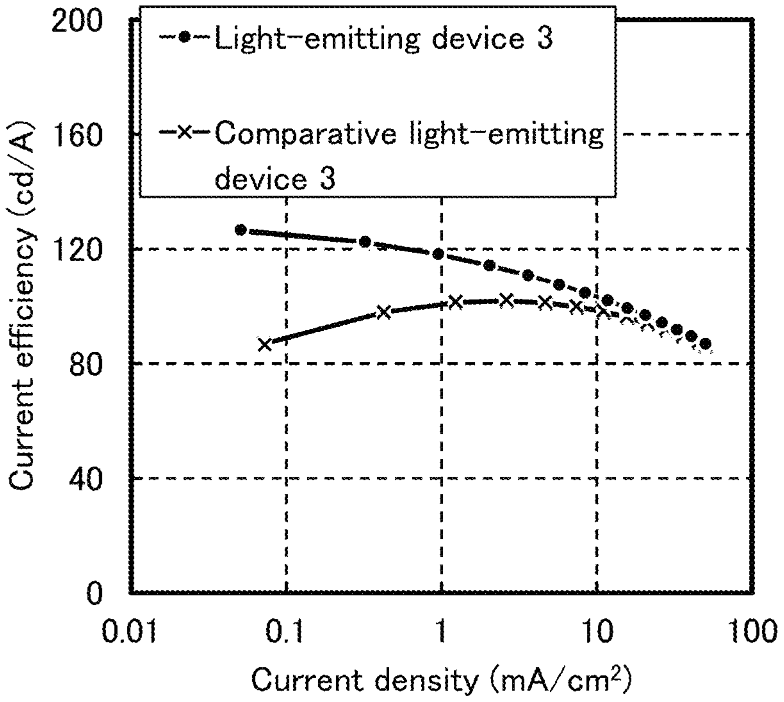
FIG. 41 shows blue index (BI)-current density characteristics of Light-emitting device 3 and Comparative light-emitting device 3.
Figure 42:
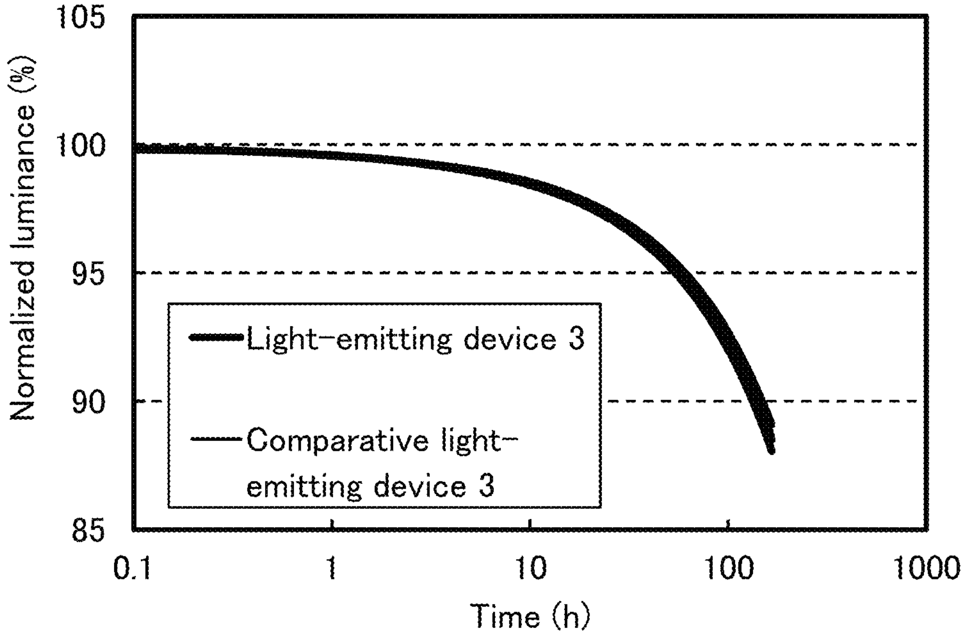
FIG. 42 shows changes in luminance of Light-emitting device 3 and Comparative light-emitting device 3 over driving time in constant current driving at a current density of 50 $mA/cm^2$.

Light-emitting device 1 is a light-emitting device emitting blue light. Light-emitting device 2 and Comparative light-emitting device 2 emitting red light and Light-emitting device 3 and Comparative light-emitting device 3 emitting green light were fabricated and evaluated in a similar manner. FIG. 37, FIG. 38, and FIG. 39 show the evaluation results of Light-emitting device 2 and Comparative light-emitting device 2 emitting red light. FIG. 40, FIG. 41, and FIG. 42 show the evaluation results of Light-emitting device 3 and Comparative light-emitting device 3 emitting green light. Note that in Light-emitting device 2 and Comparative light-emitting device 2, mPPhen2P corresponding to the first compound of one embodiment of the present invention was used for the free surface in heat treatment in the MML process, that is, the second electron-transport layer. Note that Comparative light-emitting device 2 and Comparative light-emitting device 3 have stacked-layer structures similar to those of Light-emitting device 2 and Light-emitting device 3, respectively, and were fabricated in a continuous vacuum process.

As described above, the organic semiconductor devices can have favorable characteristics by using many first compounds (compounds each having neither a melting point peak, nor a crystallization peak, nor a cold crystallization peak in DSC) in the organic compound layers. It is found that poor film quality due to the heating step is greatly inhibited in the organic semiconductor device including mPPhen2P corresponding to the first compound of one embodiment of the present invention particularly in the free interface of the organic compound layer and the organic semiconductor device has favorable characteristics. It is also found that the light-emitting device has favorable characteristics even when a compound which is not the first compound is additionally included in the organic compound layer.

Next, Light-emitting device 1-1, Light-emitting device 1-2, and Comparative light-emitting device 1-1 each having structures similar to that of Light-emitting device 1 were fabricated and used for examination of influence of heat treatment. The examination results are shown below (Method for Fabricating Light-Emitting Device 1-1)

In Light-emitting device 1-1, ITSO was deposited to a thickness of 10 nm and then 6-nm-thick titanium (Ti), 70-nm-thick aluminum (Al), and 6-nm-thick titanium (Ti) were stacked, whereby the first electrode was formed; the second electron-transport layer was formed to a thickness of 20 nm; and the electron-injection layer was formed to a thickness of 1.5 nm. Other than the above, Light-emitting device 1-1 has a stacked-layer structure similar to that of Light-emitting device 1. Furthermore, instead of performing the MML process conducted in Light-emitting device 1, heating was performed at 120° C. for 180 minutes under a reduced pressure (approximately 60 Pa) after the formation of the first electron-transport layer. That is, a layer to be the free surface in Light-emitting device 1-1 is a layer formed of 2mPCCzPDBq.

(Method for Fabricating Light-Emitting Device 1-2)

In Light-emitting device 1-2, the heat treatment at 120° C. for 180 minutes, which was performed on Light-emitting device 1-1, was performed after the formation of the second electron-transport layer. Other than the above, Light-emitting device 1-2 was fabricated in a manner similar to that of Light-emitting device 1-1. That is, a layer to be the free surface in Light-emitting device 1-2 is a layer formed of mPPhen2P.

(Method for Fabricating Comparative Light-Emitting Device 1-1)

In Comparative light-emitting device 1-1, the heat treatment at 120° C. for 180 minutes, which was performed on Light-emitting device 1-1 and Light-emitting device 1-2, was not performed. Other than the above, Comparative light-emitting device 1-1 was fabricated in a manner similar to those of Light-emitting device 1-1 and Light-emitting device 1-2.

The device structures of Light-emitting device 1-1, Light-emitting device 1-2, and Comparative light-emitting device 1-1 are shown in Table 6.

TABLE 6

| Device structure | | Film thickness (nm) | Light-emitting device 1-1 | Light-emitting device 1-2 | Comparative light-emitting device 1-1 |
|---|---|---|---|---|---|
| Second electrode | | 25 | Ag:Mg (1:0.1) | | |
| Electron-injection layer | | 1.5 | LiF:Yb (1:0.5) | | |
| Heat treatment (120° C., 180 minutes) | | | — | ○ | — |
| Electron-transport layer 2 | | 20 | mPPhen2P | | |
| Heat treatment (120° C., 180 minutes) | | | ○ | — | — |
| Electron-transport layer 1 (Hole-blocking layer) | | 20 | 2mPCCzPDBq | | |
| Light-emitting layer | | 25 | αN-βNPAnth:3,10PCA2Nbf(IV)-02 (1:0.015) | | |
| Hole-transport layer | 2 | 10 | DBfBB1TP | | |
| | 1 | 96 | PCBBiF | | |
| Hole-injection layer | | 10 | PCBBiF:OCHD-003 (1:0.03) | | |
| First electrode | Transparent electrode | 10 | ITSO | | |
| | Reflective electrode | 6 | Ti | | |
| | | 70 | Al | | |
| | | 6 | Ti | | |

Table 7 shows the main characteristics at about 1000 $cd/cm^2$ and normalized luminance (%) after 260 hours of constant current drive at a current density of 50 $mA/cm^2$ of Light-emitting device 1-1, Light-emitting device 1-2, and Comparative light-emitting device 1-1.

TABLE 7

| | Voltage (V) | Current density ($mA/cm^2$) | Chromaticity x | Chromaticity y | Current efficiency (cd/A) | Lifetime (%) 260 h |
|---|---|---|---|---|---|---|
| Light-emitting device 1-1 | 5.0 | 44 | 0.14 | 0.04 | 2.1 | 94 |
| Light-emitting device 1-2 | 5.0 | 48 | 0.14 | 0.04 | 2.1 | 97 |
| Comparative light-emitting device 1-1 | 5.0 | 45 | 0.14 | 0.04 | 2.1 | 93 |

As shown in Table 7, with the use of the first compound (a compound having neither a melting point peak, nor a crystallization peak, nor a cold crystallization peak in DSC) for the organic compound layer, the organic semiconductor device which is subjected to heat treatment at a high temperature of 120° C. can have favorable characteristics equivalent to those of the light-emitting device not subjected to heat treatment. Furthermore, it is found that poor film quality due to the heating step is inhibited in the organic semiconductor device including 2mPCCzPDBq or mPPhen2P corresponding to the first compound of one embodiment of the present invention particularly in the free interface of the organic compound layer and the organic semiconductor device has favorable characteristics.

Poor film quality, such as aggregation of an organic layer, was not found in cross sections of light-emitting regions of Light-emitting device 1-1 and Light-emitting device 1-2 with a scanning transmission electron microscope (STEM).

Example 5

In this example, samples (Samples 14-1 to 14-3) each having a stacked-layer structure were fabricated and subjected to examination of heat resistance of stacked-layer films. The examination results and structure formulae of compounds used in this example are shown below.

[Chemical Formula 15]

(i)

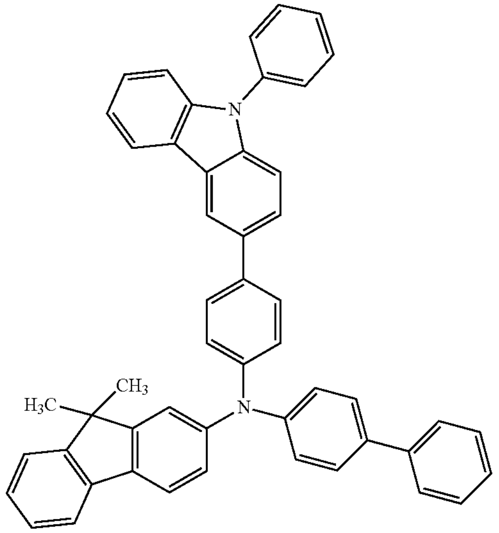

PCBBiF (v)

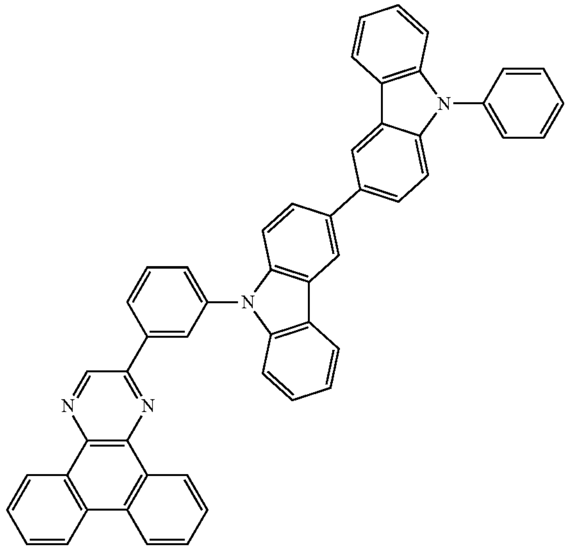

2mPCCzPDBq

-continued (100)

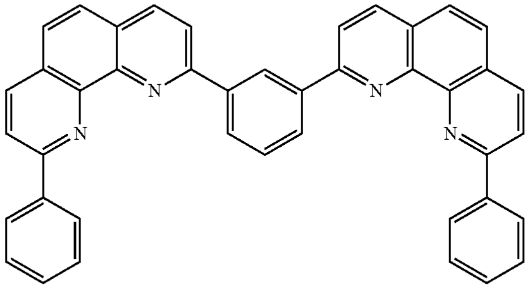

mPPhen2P (101)

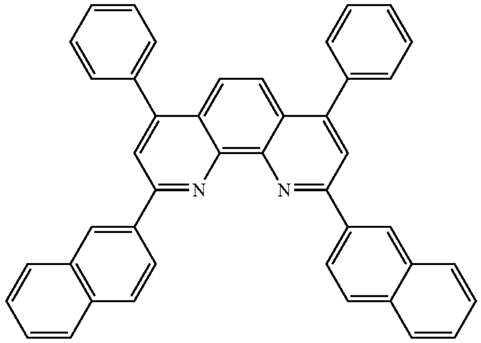

NBPhen (ix)

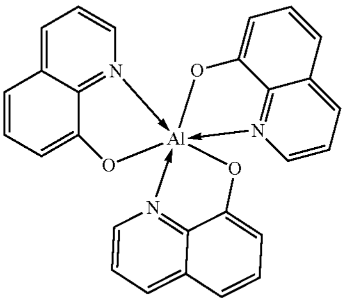

$Alq_3$

A method for fabricating Samples 14-1 to 14-3 is described.

First, a sample layer was formed over a silicon substrate with a vacuum deposition apparatus, sealed with a glass substrate, and cut into square shapes of 2 cm×2 cm to form the samples. At this time, the sample layer was not completely sealed to be prevented from being tightly covered. Furthermore, sealing was performed with an adjusted gap between the silicon substrate and the glass substrate (several ten micrometers to several hundred micrometers) so that the sample layer and the glass substrate were not in contact with each other. Note that steps from the formation of the sample layer to sealing were performed in the environment of Class 100 or a higher cleanliness level so that a dust would not be attached to the sample layer. After sealing, the samples were stored at room temperature (around 25° C.) under a nitrogen stream (in a desiccator).

The sample layer of Sample 14-1 was formed in such a manner that PCBBiF was deposited by evaporation to a thickness of 60 nm, 2mPCCzPDBq was deposited by evaporation to a thickness of 10 nm, and mPPhen2P was deposited by evaporation to a thickness of 15 nm.

The sample layer of Sample 14-2 was formed in such a manner that PCBBiF was deposited by evaporation to a thickness of 60 nm, 2mPCCzPDBq was deposited by evaporation to a thickness of 10 nm, and NBPhen was deposited by evaporation to a thickness of 15 nm.

The sample layer of Sample 14-3 was formed in such a manner that PCBBiF was deposited by evaporation to a thickness of 60 nm, 2mPCCzPDBq was deposited by evaporation to a thickness of 10 nm, NBPhen was deposited by evaporation to a thickness of 15 nm, and tris(8-quinolinolato)aluminum (abbreviation: $Alq_3$) was deposited by evaporation to a thickness of 10 nm.

Next, the samples were introduced into a bell jar type vacuum oven (BV-001, SHIBATA SCIENTIFIC TECHNOLOGY LTD.), and the pressure was reduced to approximately 10 hPa, followed by one-hour baking at temperatures in the range of 80° C. to 120° C. After one hour passed, the substrates were cooled down to 40° C. and placed in the air, and then the samples were taken out with tweezers. Note that this baking step was performed within 72 hours from the formation of the sample layers.

The samples formed by such a method were observed visually and with an optical microscope (large-size measuring microscope STM6-LM, Olympus Corporation). Note that this observation was performed within 72 hours from the baking step.

Table 8 and Table 9 below show the sample structures and the results, respectively. Note that in Table 9, a circle indicates absence of abnormality in film quality and a cross indicates presence of abnormality in film quality.

TABLE 8

| | Sample structure |
|---|---|
| 14-1 | PCBBiF (60 nm)\2mPCCzPDBq (10 nm)\mPPhen2P (15 nm) |
| 14-2 | PCBBiF (60 nm)\2mPCCzPDBq (10 nm)\NBPhen (15 nm) |
| 14-3 | PCBBiF (60 nm)\2mPCCzPDBq (10 nm)\NBPhen (15 nm)\$Alq_3$ (10 nm) |

TABLE 9

| | Heating temperature (° C.) | | | |
|---|---|---|---|---|
| | Ref | 80 | 100 | 120 |
| 14-1 | ○ | ○ | ○ | ○ |
| 14-2 | ○ | x | x | x |
| 14-3 | ○ | ○ | ○ | ○ |

The above results show that abnormality in film quality was caused at a low temperature of 80° C. in Sample 14-2 using, for the free surface, NBPhen having an exothermic peak and a melting point peak while abnormality in film quality was not caused even at a high temperature of 120° C. in Sample 14-1 and Sample 14-3 using, for the free surface, mPPhen2P and $Alq_3$, respectively, which are the first compounds (compounds each having neither a melting point peak, nor a crystallization peak, nor a cold crystallization peak in DSC).

Note that Sample 14-3 has a structure in which $Alq_3$ is stacked over NBPhen of Sample 14-2. Thus, it is found that heat resistance can be increased by including the first compound (a compound having neither a melting point peak, nor a crystallization peak, nor a cold crystallization peak in DSC) in the free surface even when a material having an exothermic peak and a melting point peak is also included.

This application is based on Japanese Patent Application Serial No. 2022-064756 filed with Japan Patent Office on Apr. 8, 2022, Japanese Patent Application Serial No. 2022-191594 filed with Japan Patent Office on Nov. 30, 2022, and Japanese Patent Application Serial No. 2023-026380 filed with Japan Patent Office on Feb. 22, 2023, the entire contents of which are hereby incorporated by reference.

What is claimed is:

1. A display apparatus comprising a plurality of light-emitting devices formed over an insulating layer, wherein each of the plurality of light-emitting devices comprises:

a first electrode;

a second electrode; and an organic compound layer, wherein the organic compound layer is positioned between the first electrode and the second electrode, wherein the organic compound layer comprises a first layer independently included in each of the plurality of light-emitting devices, wherein the first layer comprises a first compound, wherein the first compound has an electron-transport property and comprises at least one of a triazine skeleton, a benzofuropyrimidine skeleton, a dibenzoquinoxaline skeleton, a carbazole skeleton, a dibenzothiophene skeleton, and a phenanthroline skeleton, wherein the second electrode is shared by the plurality of light-emitting devices, wherein the first electrode is independently included in each of the plurality of light-emitting devices, and wherein, when thermophysical property of the first compound in powder state is measured by a differential scanning calorimetry in such a manner that a first heating step is performed from 25° C. or lower, a temperature is kept for three minutes at a lower one of 450° C. and a temperature lower than a 3% weight loss temperature (° C.) measured with a thermogravimeter by 50° C., a cooling step is performed at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, an energy of an exothermic peak of the first compound observed in the cooling step is higher than or equal to 0 J/g and lower than or equal to 20 J/g, and an energy of an endothermic peak of the first compound without a baseline shift observed in the second heating step is lower than or equal to 0 J/g and higher than or equal to −20 J/g.

2. The display apparatus according to claim 1, wherein in the second heating step in the differential scanning calorimetry, a baseline shift of the first compound to an endothermic side is observed and an endothermic peak due to the baselines shift is detected.

3. The display apparatus according to claim 1, wherein the organic compound layer further comprise a second layer over the first layer, and wherein the second layer is shared by the plurality of light-emitting devices.

4. The display apparatus according to claim 1, wherein the first layer is configured to be one of an electron-transport layer and a hole-blocking layer.

5. A display apparatus comprising a plurality of light-emitting devices formed over an insulating layer, wherein each of the plurality of light-emitting devices comprises:

a first electrode;

a second electrode; and an organic compound layer, wherein the organic compound layer is positioned between the first electrode and the second electrode, wherein the organic compound layer comprises a first layer independently included in each of the plurality of light-emitting devices, wherein the first layer comprises a first compound, wherein the first compound has an electron-transport property and comprises at least one of a triazine skeleton, a benzofuropyrimidine skeleton, a dibenzoquinoxaline skeleton, a carbazole skeleton, a dibenzothiophene skeleton, and a phenanthroline skeleton, wherein the second electrode is shared by the plurality of light-emitting devices, wherein the first electrode is independently included in each of the plurality of light-emitting devices, wherein a distance between the first electrodes of adjacent light-emitting devices of the plurality of light-emitting devices is larger than or equal to 2 μm and smaller than or equal to 5 μm, and wherein, when thermophysical property of the first compound in powder state is measured by a differential scanning calorimetry in such a manner that a first heating step is performed from 25° C. or lower, a temperature is kept for three minutes at a lower one of 450° C. and a temperature lower than a 3% weight loss temperature (° C.) measured with a thermogravimeter by 50° C., a cooling step is performed at a cooling rate of 40° C./min or higher, the temperature is kept at 25° C. or lower for three minutes, and a second heating step is performed at a temperature rising rate of 40° C./min or higher until the temperature reaches the keeping temperature after the first heating step, an exothermic peak of the first compound is not observed in the cooling step and an exothermic peak of the first compound and a melting point peak of the first compound are not observed in the second heating step.

6. The display apparatus according to claim 5, wherein in the second heating step in the differential scanning calorimetry, an exothermic peak of the first compound with an energy higher than or equal to 0 J/g and lower than or equal to 20 J/g is observed.

7. The display apparatus according to claim 5, wherein in the second heating step in the differential scanning calorimetry, a baseline shift of the first compound to an endothermic side is observed and an endothermic peak due to the baselines shift is detected.

8. The display apparatus according to claim 5, wherein the organic compound layer further comprise a second layer over the first layer, and wherein the second layer is shared by the plurality of light-emitting devices.

9. The display apparatus according to claim 5, wherein the first layer is configured to be one of an electron-transport layer and a hole-blocking layer.

* * * * *